(12) United States Patent
Eliason

(10) Patent No.: US 6,650,158 B2
(45) Date of Patent: Nov. 18, 2003

(54) FERROELECTRIC NON-VOLATILE LOGIC ELEMENTS

(75) Inventor: Jarrod Eliason, Colorado Springs, CO (US)

(73) Assignee: Ramtron International Corporation, Colorado Springs, CO (US)

(*) Notice: Subject to any disclaimer, the term of this patent is extended or adjusted under 35 U.S.C. 154(b) by 0 days.

(21) Appl. No.: 10/076,058

(22) Filed: Feb. 12, 2002

(65) Prior Publication Data

US 2002/0113636 A1 Aug. 22, 2002

Related U.S. Application Data

(60) Provisional application No. 60/273,870, filed on Mar. 7, 2001, and provisional application No. 60/270,500, filed on Feb. 21, 2001.

(51) Int. Cl.[7] .................... H03K 3/289; H03K 3/037
(52) U.S. Cl. ....................... 327/203; 327/218
(58) Field of Search ................ 327/202, 203, 327/210–212, 215–218

(56) References Cited

U.S. PATENT DOCUMENTS

| | | | |
|---|---|---|---|
| 4,809,225 A | 2/1989 | Dimmler et al. | |
| 4,918,654 A | 4/1990 | Eaton, Jr. et al. | |
| 5,237,533 A | 8/1993 | Papaliolios | |
| 5,361,224 A | 11/1994 | Takasu | |
| 5,390,143 A | 2/1995 | Manning | |
| 5,406,510 A | 4/1995 | Mihara et al. | |
| 5,487,029 A | 1/1996 | Kuroda | |
| 5,550,770 A | 8/1996 | Kuroda | |
| 5,751,627 A | 5/1998 | Ooishi | |
| 5,815,431 A | 9/1998 | Chen | |
| 5,892,712 A | 4/1999 | Hirose et al. | |
| 5,896,042 A | 4/1999 | Nishimura et al. | |
| 5,901,088 A | 5/1999 | Kraus | |
| 5,923,184 A | 7/1999 | Ooms et al. | |
| 5,926,412 A | 7/1999 | Evans et al. | |
| 5,939,903 A | 8/1999 | Lin | |
| 5,943,268 A | 8/1999 | Nguyen | |
| 6,002,634 A | 12/1999 | Wilson | |
| 6,008,659 A | 12/1999 | Traynor | |
| 6,141,237 A | 10/2000 | Eliason et al. | |
| 6,233,169 B1 | * 5/2001 | Nishimura | 365/145 |
| 6,314,016 B1 | * 11/2001 | Takasu | 365/145 |

FOREIGN PATENT DOCUMENTS

| | | |
|---|---|---|
| DE | 197 08 963 C2 | 9/1998 |
| JP | 2000-77982 A | 3/2000 |
| WO | WO 01/15323 A1 | 8/1999 |

OTHER PUBLICATIONS

German Patent Office Action Dated Mar. 6, 2003 (English translation) of German Patent Application No. 102 07 312.0–42 to Ramtron International Corporation (which claims priority of the present application).

* cited by examiner

*Primary Examiner*—Toan Tran
(74) *Attorney, Agent, or Firm*—Hogan & Hartson L.L.P.

(57) ABSTRACT

Various logic elements such as SR flip-flops, JK flip-flops, D-type flip-flops, master-slave flip-flops, parallel and serial shift registers, and the like are converted into non-volatile logic elements capable of retaining a current output logic state even though external power is removed or interrupted through the strategic addition of ferroelectric capacitors and supporting circuitry. In each case, the building blocks of a cross-coupled sense amplifier are identified within the logic element and the basic cell is modified and/or optimized for sensing performance.

16 Claims, 43 Drawing Sheets

| CLK | SETB | CLRB | Q |
|---|---|---|---|
| X | 0 | 0 | 1 |
| X | 0 | 1 | 1 |
| X | 1 | 0 | 0 |
| X | 1 | 1 | QLAST |
| ↑ | 1 | 1 | D |

FERROELECTRIC NON-VOLATILE LOGIC ELEMENTS

CROSS-REFERENCE TO RELATED APPLICATIONS

The present application claims priority to U.S. Provisional Application No. 60/273,870, filed Mar. 7, 2001 and U.S. Provisional Application No. 60/270,500, filed Feb. 21, 2001, the disclosures of which are hereby incorporated by reference in their entirety.

BACKGROUND OF THE INVENTION

This invention relates generally to logic elements such as SR flip-flops, JK flip-flops, D-type flip-flops, master-slave flip-flops, parallel and serial shift registers, and the like and, more particularly, to logic elements that are rendered non-volatile by the addition of ferroelectric capacitors and supporting circuitry.

Integrated circuits can be divided into analog functions and digital functions. Most digital functions can be implemented using the following elements: combinatorial logic, clocked registers and memory. Until recently, a clear distinction was made between volatile memories such as SRAM and DRAM and non-volatile memories such as ROM, EPROM, EEPROM and Flash EEPROM. Volatile memories offer high speed and high density, but they lose data when the power supply is removed. Non-volatile memories, on the other hand, keep their data when the power supply is removed and offer relatively high density, but write times and write endurance are limited.

Today, ferroelectric memories are commercially available that provide non-volatility while retaining write performance similar to that of volatile memories. So, as ferroelectric memory technology continues to advance, the gap between volatile and non-volatile memory will continue to shrink.

Another gap exists between clocked registers and memory. Fundamentally, clocked registers, such as the multiple-purpose registers used in microcontrollers and microprocessors, are low-density memories combined with combinatorial logic in such a way as to create the desired register function. Because of the relatively late development of non-volatile memory and its poor write speed performance relative to volatile memories, clocked registers have always been volatile and most often based on cross-coupled devices similar to an SRAM cell.

Conversely, floating-gate memories require high currents to program each bit, each bit takes a long time to program, and current sensing is used to determine the state of the cell. In the current logic system design paradigm, data requiring non-volatility must either be backed up by a battery or stored in a low-write-speed non-volatile memory and restored byte-by-byte on power-up.

What is desired, therefore, is a class of logic circuits that retain the functionality and operating characteristics found in present-day integrated circuit versions of these logic circuits, while introducing the further benefit of non-volatility.

SUMMARY OF THE INVENTION

According to the present invention, the following description details the methodology used to render logic elements non-volatile through the strategic addition of ferroelectric capacitors and supporting devices. In each case, the building blocks of a cross-coupled sense amplifier are identified within the logic element and the basic cell is modified and/or optimized for sensing performance. More so than the fundamental logic elements involved, memory sense amplifiers require carefully balanced layout to properly detect the memory state over the lifetime of the part. Because of this, care is taken to create symmetry within the design that is easily translated into device layout.

The recent availability of high performance ferroelectric non-volatile memory opens up the possibility of a new type of system design wherein registers are made non-volatile. The new paradigm involves making the register itself non-volatile through the use of ferroelectric memory technology. In this way, the status of some or all registers can be restored simultaneously on power-up.

Ferroelectric memory technology allows the reading or writing of thousands of bits or more simultaneously due to the polarization-based storage mechanism, fast write times and voltage sensing.

At the present time, reliable ferroelectric memories employ controlled timing sequences during read and write operations. While all the circuits presented below theoretically function for any sensing speed and any non-zero ferroelectric capacitor interrogation time, the examples presented use currently standard interrogation and sensing approaches. Where timing diagrams are shown, they may not represent the only useful means of interrogation and sensing.

Finally, ferroelectric memories have shown sensitivity to the ratio of the load capacitance to the effective capacitance of the switching capacitor. This ratio is commonly called the bit/cell ratio. In arrayed ferroelectric memories, the load capacitance due to parasitic terms such as source/drain diffusions and metal-substrate capacitance is often sufficient to meet the desired performance parameters. In some low-density memories, the parasitic load capacitance is not sufficient to create the desired bit/cell ratio. In this case, extra discrete load capacitors can be added. Because ferroelectric memories already have a high dielectric material available, the added load capacitance may be derived from ferroelectric load capacitors. In the case of non-volatile logic, the parasitic load capacitance is negligible when compared to the capacitance of the ferroelectric storage capacitor. As such, the incorporation of extra load capacitance is required. Previous non-volatile logic work makes no mention of this required load capacitance.

In a first embodiment of the invention, a ferroelectric, non-volatile, SR flip-flop includes a set input, a reset input, a Q output, a complementary Q output, a first NAND gate having an internal circuit node, a first input coupled to the set input, a second input coupled to the output, and an output coupled to the complementary Q output, a second NAND gate having an internal circuit node, a first input coupled to the reset input, a second input coupled to the complementary Q output, and an output coupled to the Q output, and a ferroelectric capacitor circuit coupled between the internal node of the first NAND gate and the internal node of the second NAND gate.

The first NAND gate includes a first P-channel transistor having a gate coupled to the first input, a source coupled to a voltage source, and a drain coupled to the output, a second P-channel transistor having a gate coupled to the second input, a source coupled to the voltage source, and a drain coupled to the output, a first N-channel transistor having a drain coupled to the output, a gate coupled to the second input, and a source coupled to the internal circuit node, and a second N-channel transistor having a drain coupled to the internal circuit node, a gate coupled to the first input, and a source coupled to ground.

Alternatively, the first NAND gate includes a first P-channel transistor having a gate coupled to the first input, a source coupled to a first controlled power supply, and a drain coupled to the output, a second P-channel transistor having a gate coupled to the second input, a source coupled to the first controlled power supply, and a drain coupled to the output, a first N-channel transistor having a drain coupled to the output, a gate coupled to the second input, and a source coupled to the internal circuit node, and a second N-channel transistor having a drain coupled to the internal circuit node, a gate coupled to the first input, and a source coupled to a second controlled power supply.

The second NAND gate includes a first P-channel transistor having a gate coupled to the first input, a source coupled to a voltage source, and a drain coupled to the output, a second P-channel transistor having a gate coupled to the second input, a source coupled to the voltage source, and a drain coupled to the output, a first N-channel transistor having a drain coupled to the output, a gate coupled to the second input, and a source coupled to the internal circuit node, and a second N-channel transistor having a drain coupled to the internal circuit node, a gate coupled to the first input, and a source coupled to ground.

Alternatively, the second NAND gate includes a first P-channel transistor having a gate coupled to the first input, a source coupled to a first controlled power supply, and a drain coupled to the output, a second P-channel transistor having a gate coupled to the second input, a source coupled to the first controlled power supply, and a drain coupled to the output, a first N-channel transistor having a drain coupled to the output, a gate coupled to the second input, and a source coupled to the internal circuit node, and a second N-channel transistor having a drain coupled to the internal circuit node, a gate coupled to the first input, and a source coupled to a second controlled power supply.

The ferroelectric capacitor circuit for the first and additional embodiments includes a first ferroelectric capacitor coupled between the internal circuit node of the first NAND gate and ground, a second ferroelectric capacitor coupled between the internal circuit node of the second NAND gate and ground, and a ferroelectric capacitor circuit coupled between the internal circuit nodes of the first and second NAND gates, which can be formed of serially-coupled matched ferroelectric capacitors coupled together at a common plate node. The ferroelectric capacitor circuit can be selectively coupled to the internal nodes of the first and second NAND gates.

The SR flip-flop of the first embodiment as well as additional embodiments optionally includes a precharge circuit, an equalization circuit, a gate control circuit and/or an internal drive isolation circuit.

In a second embodiment of the invention, a ferroelectric, non-volatile, SR flip-flop includes a set input, a reset input, a Q output, a complementary Q output, a first NOR gate having an internal circuit node, a first input coupled to the set input, a second input coupled to the output, and an output coupled to the complementary Q output, a second NOR gate having an internal circuit node, a first input coupled to the reset input, a second input coupled to the complementary Q output, and an output coupled to the Q output, and a ferroelectric capacitor circuit coupled between the internal node of the first NOR gate and the internal node of the second NOR gate.

The first NOR gate includes a first P-channel transistor having a gate coupled to the first input, a source coupled to a voltage source, and a drain coupled to the internal node, a second P-channel transistor having a gate coupled to the second input, a source coupled to the internal node, and a drain coupled to the output, a first N-channel transistor having a drain coupled to the output, a gate coupled to the first input, and a source coupled to ground, and a second N-channel transistor having a drain coupled to the output, a gate coupled to the second input, and a source coupled to ground.

The first NOR gate optionally includes a first P-channel transistor having a gate coupled to the first input, a source coupled to a first controlled power supply, and a drain coupled to the internal circuit node, a second P-channel transistor having a gate coupled to the second input, a source coupled to the internal circuit node, and a drain coupled to the output, a first N-channel transistor having a drain coupled to the output, a gate coupled to the first input, and a source coupled to a second controlled power supply, and a second N-channel transistor having a drain coupled to the output, a gate coupled to the second input, and a source coupled to the second controlled power supply.

The second NOR gate includes a first P-channel transistor having a gate coupled to the first input, a source coupled to a voltage source, and a drain coupled to the internal circuit node, a second P-channel transistor having a gate coupled to the second input, a source coupled to the internal circuit node, and a drain coupled to the output, a first N-channel transistor having a drain coupled to the output, a gate coupled to the first input, and a source coupled to ground, and a second N-channel transistor having a drain coupled to the output, a gate coupled to the second input, and a source coupled to ground.

The second NOR gate optionally includes a first P-channel transistor having a gate coupled to the first input, a source coupled to a first controlled power supply, and a drain coupled to the internal circuit node, a second P-channel transistor having a gate coupled to the second input, a source coupled to the internal circuit node, and a drain coupled to the output, a first N-channel transistor having a drain coupled to the output, a gate coupled to the first input, and a source coupled to a second controlled power supply, and a second N-channel transistor having a drain coupled to the output, a gate coupled to the second input, and a source coupled to the second controlled power supply.

In a third embodiment a ferroelectric, non-volatile, JK flip-flop includes a J input, a K input, a Q output, a complementary Q output, a ferroelectric, non-volatile SR flip-flop including a set input, a reset input, a Q output coupled to the Q output of the JK flip-flop, and a complementary Q output coupled to the complementary Q output of the JK flip-flop, a first NAND gate having a first input coupled to the Q output of the JK flip-flop, a second input coupled to the K input, a third input for receiving a clock signal and an output coupled to the set input, and a second NAND gate having a first input for receiving the clock signal, a second input coupled to the J input, a third input coupled to the complementary Q output of the JK flip-flop.

The SR flip-flop can include either a NAND-gate based flip-flop, or a NOR-gate based flip-flop, either of which can be powered by conventional or controlled power supplies.

In a fourth embodiment, a ferroelectric, non-volatile, master-slave JK flip-flop includes a J input, a K input, a Q output, a complementary Q output, a clock input, a complementary clock input, a ferroelectric, non-volatile master JK flip-flop for receiving the J, K, and clock inputs, and having a Q output and a complementary Q output, a slave JK flip-flop coupled to the complementary clock input, and the Q and complementary Q outputs of the master JK flip-flop, and having a Q output coupled to the Q output of the master-slave JK flip-flop and a complementary Q output coupled to the complementary Q output of the master-slave JK flip-flop.

The master and slave flip-flops can include either NAND-gate based flip-flops or NOR-gate based flip-flops, and can be powered either by conventional or controlled power supplies.

In a fifth embodiment, a ferroelectric, non-volatile, D-type flip-flop includes a D input, a Q output, a clocked transmission-gate based master stage having inputs coupled to the D input, and an output, and a ferroelectric, non-volatile, transmission-gate based slave stage having an input coupled to the output of the master stage, and an output coupled to the Q output. The slave stage includes a first clocked transmission gate having an input forming the input of the slave stage and an output, a first controlled inverter having an input coupled to the output of the first clocked transmission gate, and an output, a first non-clocked transmission gate having an input coupled to the output of the first controlled inverter and an output coupled to the output of the slave stage, a second clocked transmission gate having an input, and an output coupled to the output of the first clock transmission gate, a second controlled inverter having an input coupled to the output of the slave stage, and an output coupled to the input of the second clocked transmission gate, a second non-clocked transmission gate having an input coupled to the output of the slave stage and an output coupled to ground, and a ferroelectric capacitor circuit coupled between the output of the first clocked transmission gate and the output of the slave stage. The D-type flip-flop of the fifth embodiment can include optional asychronous set and clear inputs.

In a sixth embodiment, a ferroelectric, non-volatile, D-type flip-flop includes a D input, a Q output, a ferroelectric, non-volatile, transmission-gate based master stage having an input coupled to the D input, and an output, and a clocked transmission-gate based slave stage having an input coupled to the output of the master stage, and an output coupled to the Q output. The master stage includes a first clocked transmission gate having an input forming the input of the master stage and an output, a first controlled inverter having an input coupled to the output of the first clocked transmission gate, and an output, a first non-clocked transmission gate having an input coupled to the output of the first controlled inverter and an output coupled to the output of the master stage, a second clocked transmission gate having an input, and an output coupled to the output of the first clocked transmission gate, a second controlled inverter having an input coupled to the output of the master stage, and an output coupled to the input of the second clocked transmission gate, and a ferroelectric capacitor circuit coupled between the output of the first clocked transmission gate and the output of the master stage. The D-type flip-flop of the sixth embodiment further can include optional asychronous set and clear inputs.

In a seventh embodiment, an N-bit non-volatile serial-in, serial-out shift register includes N ferroelectric, non-volatile D-type flip-flops each having a D input, a Q output, a clock input, and a ferroelectric control input, wherein the D input of a first flip-flop forms the shift register input, the Q output of an Nth flip-flop forms the shift register output, the Q output of an (N−1)th flip-flop is coupled to the input of an Nth flip-flop such that all of the flip-flops are serially coupled together, the clock inputs of each of the flip-flops are coupled together and to a clock bus, and the ferroelectric control inputs of each of the flip-flops are coupled together and to a ferroelectric control bus. In a preferred embodiment N is equal to eight.

In an eighth embodiment, an N-bit non-volatile parallel-in, serial-out shift register includes N multiplexers each having a first input, a second input, a select input, and an output, and N ferroelectric, non-volatile D-type flip-flops each having a D input, a Q output, a clock input, and a ferroelectric control input, wherein the output of an Nth multiplexer being coupled to the D input of an Nth flip-flop, the Q output of an Nth flip-flop being coupled to the first input of an (N+1)th multiplexer, such that all of the multiplexers and flip-flops are coupled together, the clock inputs of each of the flip-flops are coupled together and to a clock bus, the ferroelectric control inputs of each of the flip-flops are coupled together and to a ferroelectric control bus, the second inputs of each of the multiplexers form a parallel input, the select inputs of each of the multiplexers are coupled together and to a select bus, and the Q output of a last flip-flop forms a serial output. In a preferred embodiment N is equal to four.

The foregoing and other objects, features, and advantages of the invention will become more readily apparent from the following detailed description of a preferred embodiment of the invention which proceeds with reference to the accompanying drawings.

DETAILED DESCRIPTION

Figure 1:
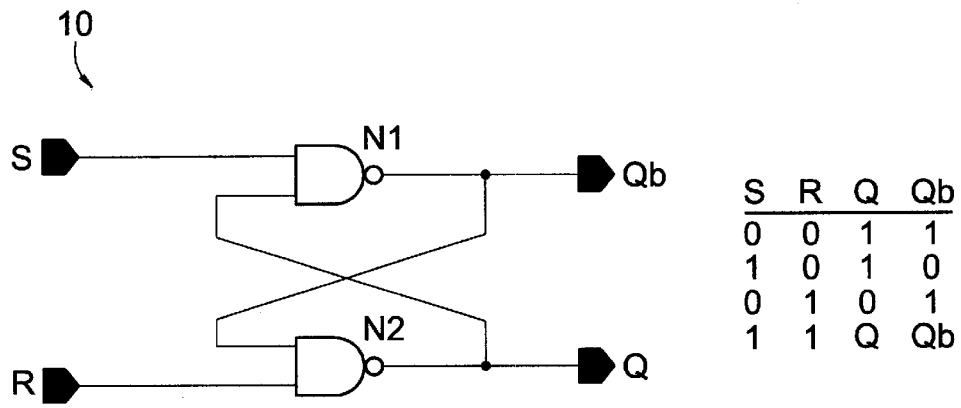
FIG. 1 shows the standard gate representation of a NAND based SR flip-flop and its truth table.

Referring now to FIG. 1, a volatile SR flip-flop 10 is shown that is converted into a non-volatile SR flip-flop with the addition of ferroelectric capacitors and supporting devices. The resulting device maintains the functionality of the SR flip-flop 10 and inherits the non-volatility of ferroelectric memories. FIG. 1 therefore shows the standard gate representation of a NAND-based SR flip-flop 10 including NAND gates N1 and N2 and the corresponding truth table.

Figure 2:
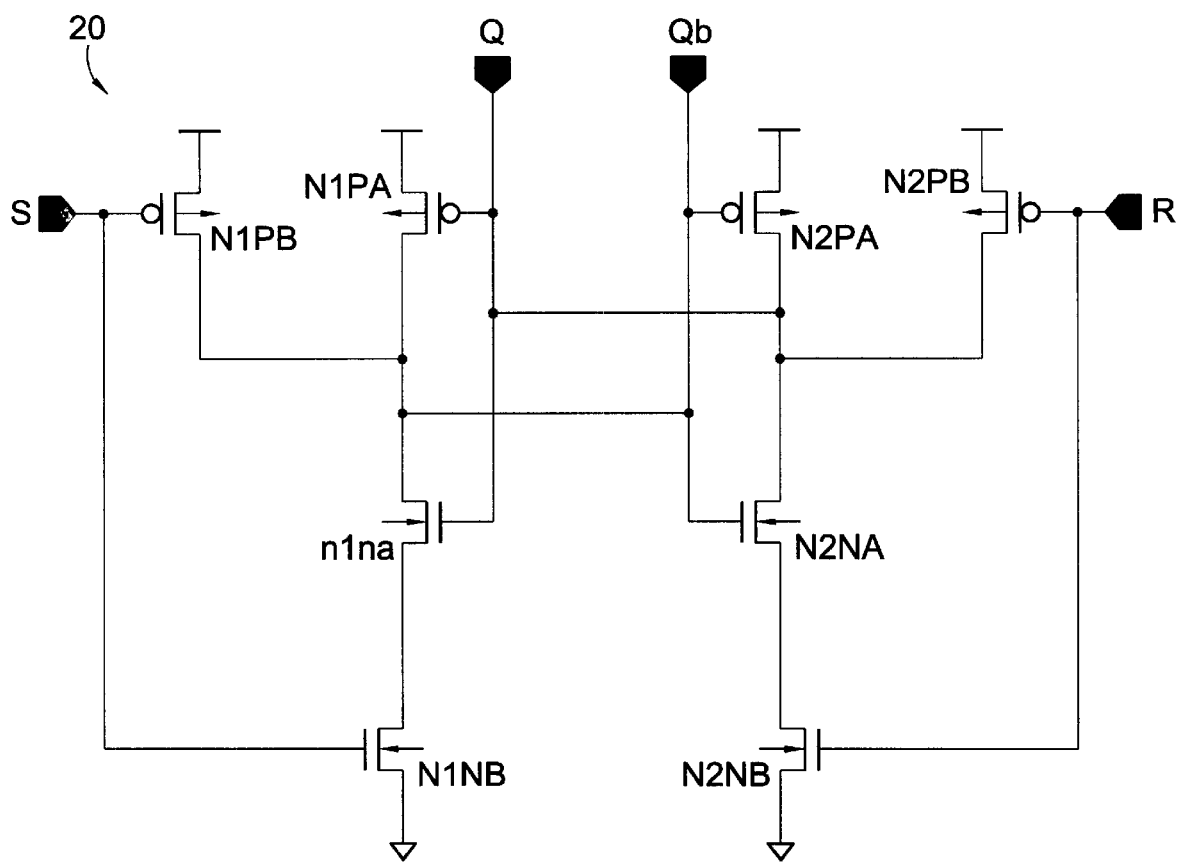
FIG. 2 shows one possible CMOS implementation of the flip-flop of FIG. 1.

Referring now to FIG. 2, one possible CMOS implementation 20 of flip-flop 10 is shown. NAND gate N1 from FIG. 1 is implemented by PMOS transistors N1PA and N1PB and series-connected NMOS transistors N1NA and N1NB. Similarly, NAND gate N2 from FIG. 1 is implemented by PMOS transistors N2PA and N2PB and series-connected NMOS transistors N2NA and N2NB.

FIG. 2 is drawn so that the cross-coupled sense amplifier devices required for the ferroelectric non-volatile memory become apparent according to the present invention. During sensing, transistors N1PA, N2PA, N1NA and N2NA become the sense amplifier shown in FIGS. 3–5, while transistors N1NB and N2NB create a virtual ground for each side of the sense amplifier. Transistors N1PB and N2PB are deactivated during sensing by one of two methods. Both possible methods are realized by a drive isolation circuit 33 and a gate control circuit 35, both of which are shown in FIG. 3, but only one is necessary for the given topology.

Figure 3:
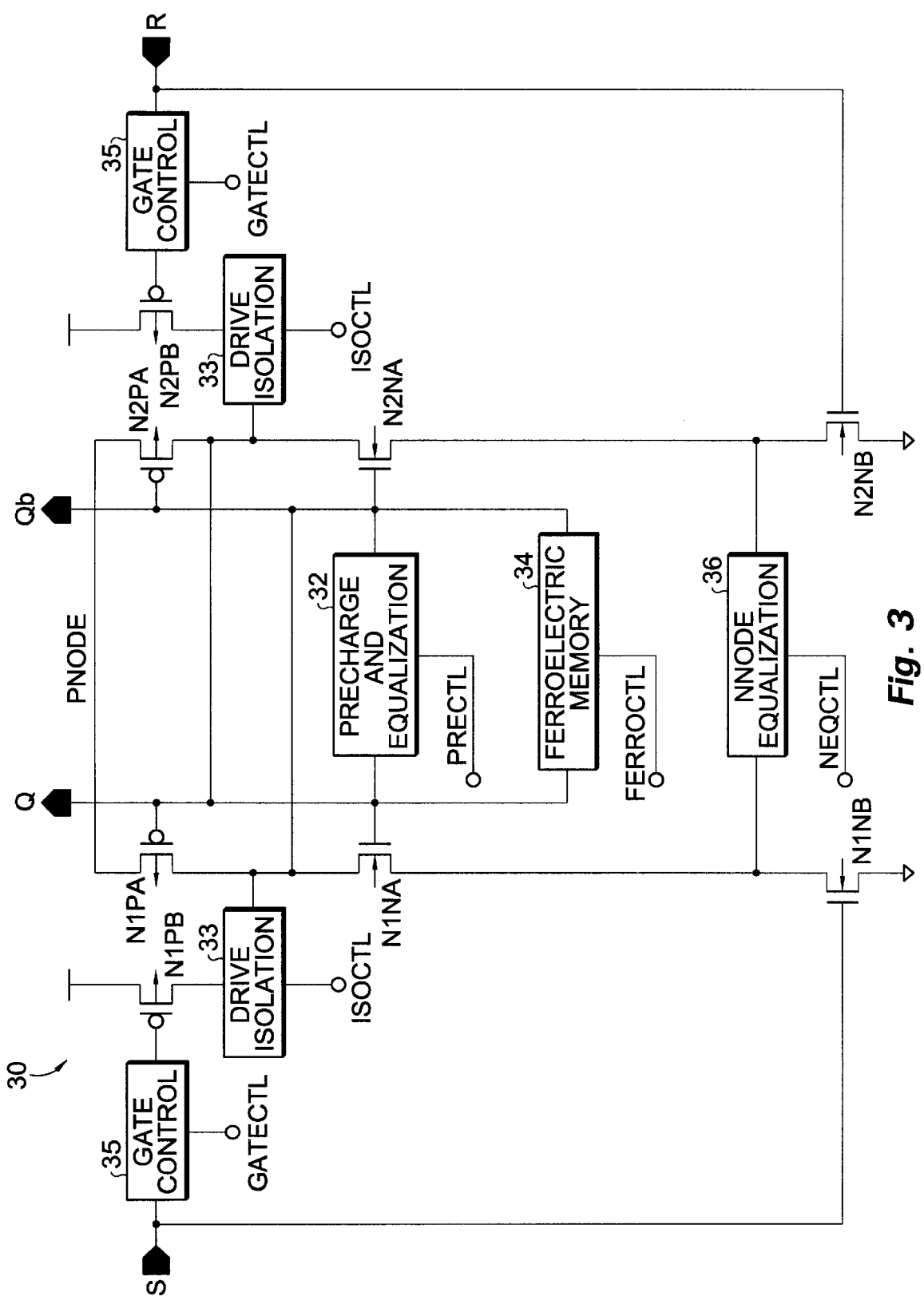
FIG. 3 shows a ferroelectric memory schematic/block diagram of a non-volatile NAND based SR flip-flop according to the present invention that can be implemented at the transistor level in a variety of ways.
Figure 4:
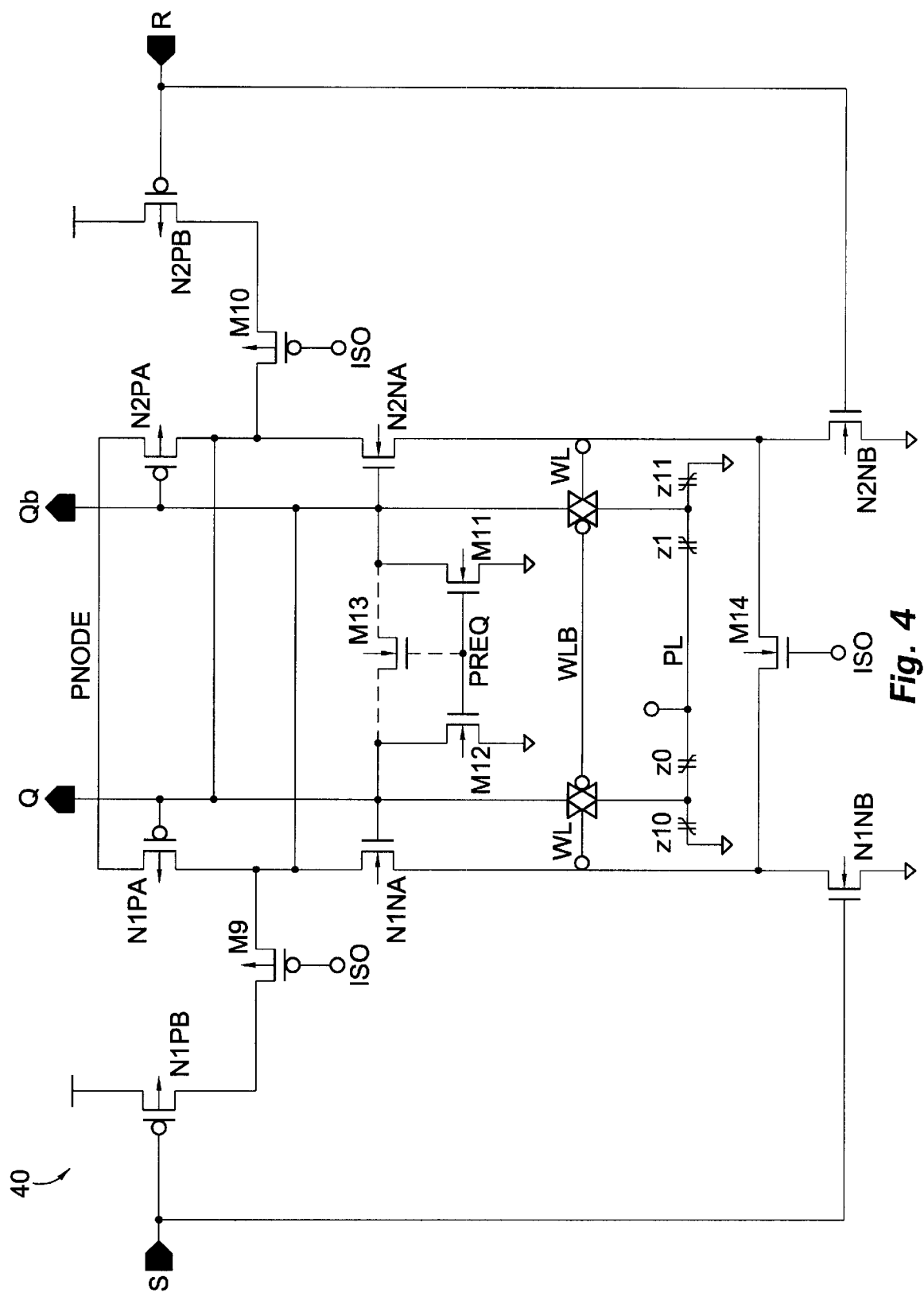
FIG. 4 shows a first complete version of the ferroelectric non-volatile SR flip-flop shown in FIG. 3 using drive isolation and no gate control.
Figure 5:
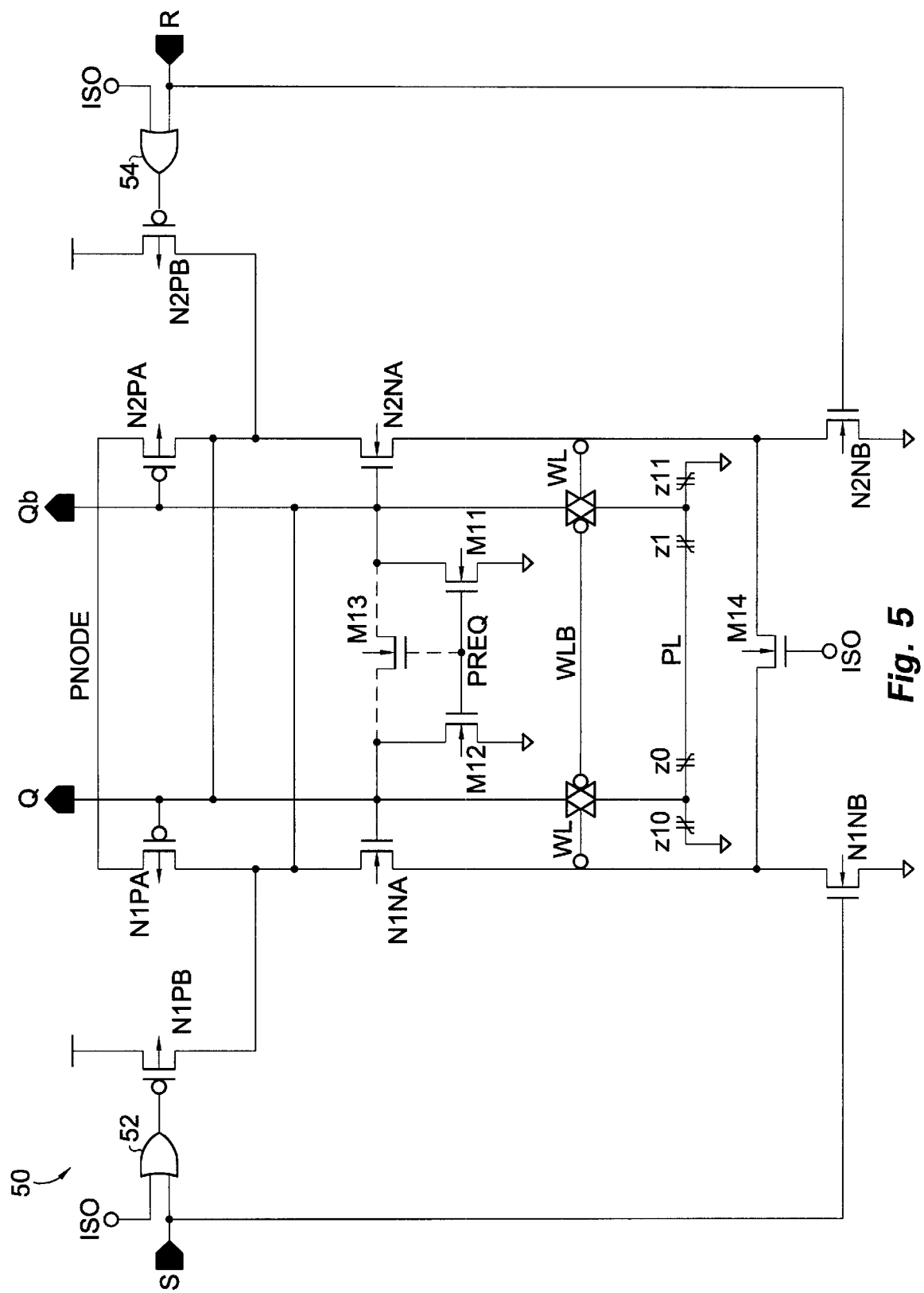
FIG. 5 shows a second complete version of the ferroelectric non-volatile SR flip-flop shown in FIG. 3 using gate control and no drive isolation.

Referring to FIG. 3, the sources of transistors N1PA and N2PA are disconnected from VDD and tied to the controlled PNODE power supply node. In current ferroelectric memory practice, PNODE is held low or tri-stated until a starting voltage differential is established between the Q and QB outputs. In the same way, the sources of transistors N1NA and N2NA are normally held high or tri-stated until a voltage differential is established between outputs Q and QB. In FIGS. 3–5, transistors N1NB and N2NB are used to tri-state the sources of the NMOS sense amplifier devices until sensing is desired. By leaving PNODE low or tri-stated, and by ensuring that transistors N1NB and N2NB are off, the starting voltage differential between outputs Q and QB depends only on the stored polarization state of the ferroelectric memory.

The basic ferroelectric memory block for the non-volatile SR flip-flop 30 shown in FIG. 3 can be implemented in a variety of ways, which are discussed in greater detail below. The FERROCTL signal refers to one or more control signals used in the actual ferroelectric memory block 34. FIGS. 4 and 5 each show one version of a complete ferroelectric non-volatile SR flip-flop 40 and 50. FIGS. 4 and 5 differ only in the method used to deactivate transistors N1PB and N2PB. FIG. 4 shows one possible method for implementing a drive isolation circuit in which the ISOCTL signal requires only one control signal named ISO. FIG. 5 shows one possible method of implementing a gate control circuit where the GATECTL signal requires only one control signal, which is also referred to as the ISO signal for this example.

Two optional blocks are shown in FIG. 3. The first block 32 is titled "Precharge and Equalization." Prior to interrogating a ferroelectric memory, it is common to ensure that the bit lines (Q and QB, in this case) start at a known voltage that is equal. The PRECTL signal refers to one or more control signals used in the precharge and equalization circuit block 32.

The second optional block 36 shown in FIG. 3 is titled "NNODE Equalization." In a typical CMOS sense-amplifier, the sources of transistors N1NA and N2NA would be tied together. The NNODE equalization block 36 effectively ties these sources together during sensing, thus making the sense amplifier look more typical.

Now that the additions necessary to make a CMOS SR flip-flop non-volatile have been introduced (the "Ferroelectric Memory" block 34 and either the "Drive Isolation" circuits 33 or the "Gate Control" circuits 35) and optional circuits have been suggested (the "Precharge and Equalization" circuit 32 and the "NNODE Equalization" circuit 36), the transistor-level implementation of FIGS. 4 and 5 is discussed in detail. In FIG. 4, transistors M9 and M10 implement the drive isolation approach to remove transistors N1PB and N2PB during sensing. A single ISO signal completes the ISOCTL bus. In FIG. 5, two OR gates 52 and 54 are used to force the gates of transistors N1PB and N2PB high when the ISO signal is high.

Conveniently, the ISO signal can also complete the NEQCTL bus in the NNODE equalization block 32. A single NMOS transistor, M14, fulfills the equalization role during sensing. NMOS devices M11, M12 and M3 accomplish precharge and equalization of outputs Q and QB. Again, only one signal, PREQ, is needed to satisfy the control requirements of PRECTL. Transistor M13 is an optional device in the circuits shown in FIGS. 4 and 5.

Because of the bilateral symmetry of SR flip-flops 30, 40, and 50, a 2T/2C ferroelectric memory architecture is employed. Capacitors Z0 and Z1 are the two storage ferroelectric capacitors. The FERROCTL bus is made up of three signals: PL, WL and optionally WLB. The ferroelectric memory architecture shown in FIGS. 4 and 5 deviates from standard ferroelectric memory architectures in two substantial ways. First, full CMOS transmission gates T1 and T2 provide access to the ferroelectric memory cell rather than NMOS-only pass gates. In arrayed ferroelectric memories, the improved cell density offered by NMOS-only pass gates more than justify the added WL (word-line) control complexity and boost circuitry. For low bit-count non-volatile logic applications, this justification is less obvious. Either NMOS or full CMOS pass gates approach could be used.

The second deviation from standard ferroelectric memories is the addition of ferroelectric load capacitors Z10 and Z11. These load capacitors have not been included in previous attempts to define non-volatile logic circuits. Ferroelectric capacitors Z10 and Z11 are necessary to establish an appropriate bit/cell ratio during ferroelectric capacitor interrogation. The bit/cell ratio determines how much of the PL interrogation voltage is dropped across the storage capacitors Z0 and Z1, and how much voltage appears on the bit lines, Q and QB, for sensing.

Figure 6:
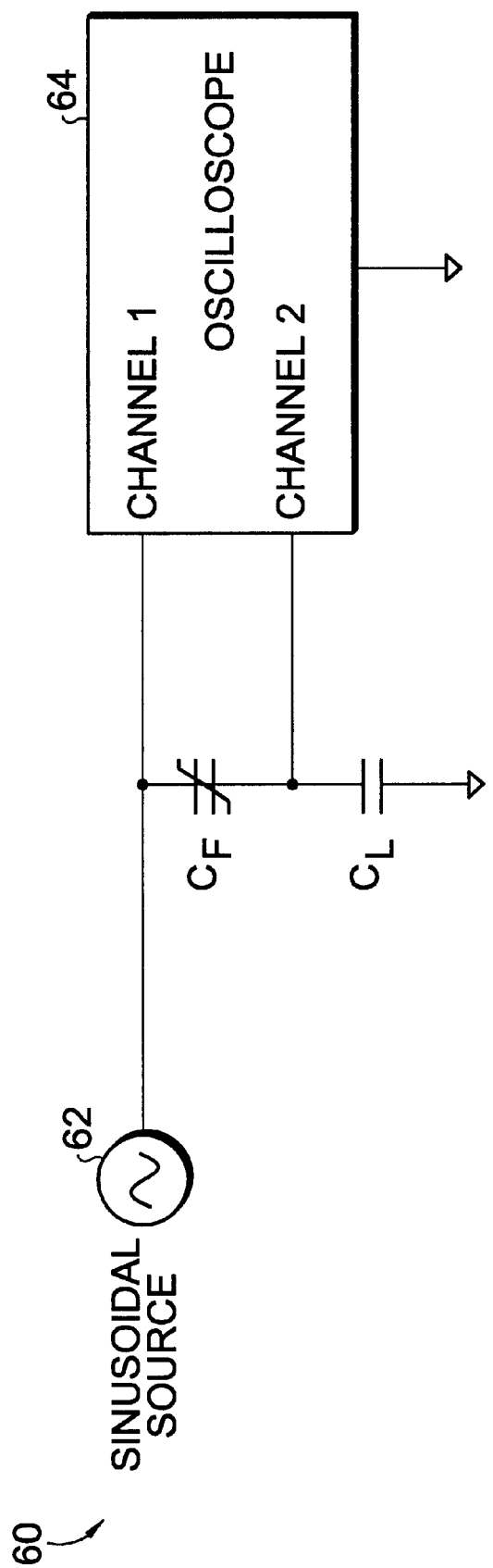
FIG. 6 shows a typical Sawyer Tower circuit for measuring the characteristics of ferroelectric capacitors in which the load capacitance $C_L$ is selected to be much greater than the capacitance of the ferroelectric capacitor under test, $C_F$.

The voltage dropped across a ferroelectric storage capacitor is referred to as the interrogation voltage. On a ferroelectric hysteresis loop, the voltage axis is actually this interrogation voltage, not the voltage applied to the Sawyer Tower test circuit most often used to measure ferroelectric hysteresis loops. In a typical Sawyer Tower circuit 60, shown in FIG. 6, the load capacitance $C_L$ is much greater than the capacitance of the ferroelectric capacitor under test, $C_F$. If $C_L$ is much greater than $C_F$, most of the applied voltage is dropped across $C_F$, so the interrogation voltage is approximately equal to the applied voltage. In a ferroelectric memory array, the parasitic capacitance of the bit line compared to the switched charge of the ferroelectric capacitor determines the bit/cell ratio. For a bit/cell ratio of nine, which is analogous to $C_L$ equal to nine times $C_F$ in the Sawyer Tower circuit 60, the interrogation voltage is equal to 90% [9/(9+1)] of the applied voltage. For lower bit/cell ratios, the interrogation voltage as a fraction of the applied voltage decreases accordingly.

Figure 7:
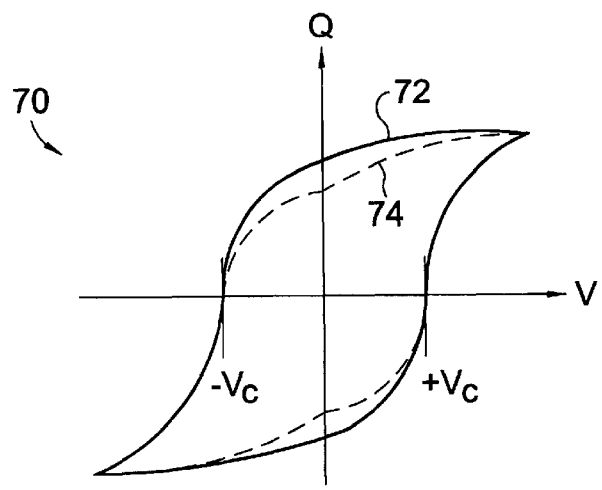
FIG. 7 depicts a non-ideal ferroelectric performance characteristic generally referred to as "relaxation"
Figure 8:
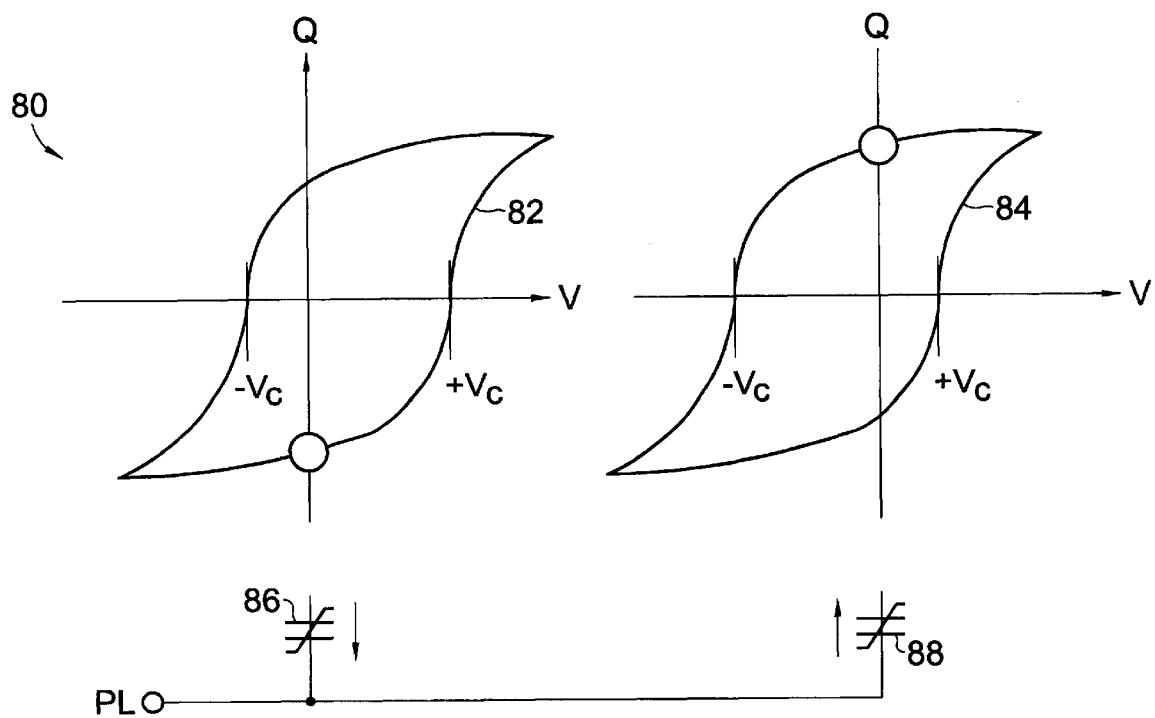
FIG. 8 depicts a non-ideal ferroelectric performance characteristic generally referred to as "imprint"

The importance of the interrogation voltage stems from the non-idealities of existing ferroelectric materials. FIGS. 7 and 8 depict two of these non-idealities, relaxation and imprint, respectively. In a 2T/2C memory, two ferroelectric storage capacitors are polarized in the opposite direction during a write and are read with the same applied voltage. Assuming no remaining DRAM charge, both storage capacitors begin with zero volts across them but at opposite polarization states prior to sensing. Both capacitors are then pulsed with positive voltage. As explained earlier, the actual interrogation voltage is reduced from the applied voltage because of a low finite bit/cell ratio.

A combination hysteresis loop 70 is shown in FIG. 7. Examining an ideal hysteresis loop 72 shown by the solid line in FIG. 7, very little interrogation voltage is required before the slopes of the oppositely polarized capacitors are measurably different. The instantaneous slope of the hysteresis curve defines the instantaneous capacitance of a ferroelectric capacitor. Furthermore, at no point on the idealized hysteresis loop does the capacitance of a 'zero state' capacitor exceed the capacitance of 'one state' capacitor.

Unfortunately, no known ferroelectric materials yield an ideal hysteresis loop over all conditions. One phenomenon observed for ferroelectric materials is relaxation. According to the theoretical explanation of relaxation, some dipoles return to their original state after the polarizing voltage is removed. This back switching leads to an increased linear term and a decreased switching term during the next interrogation.

The dotted lines 74 in FIG. 7 show the effects of relaxation on the ideal hysteresis loop 72. As can be seen, a sufficient interrogation voltage can still result in the correct state being sensed, but this required interrogation voltage is increased compared to the ideal case. Moreover, at low interrogation voltages, the instantaneous capacitance of a 'zero' capacitor could exceed the capacitance of a 'one' capacitor due to relaxation. Thus relaxation alone places two requirements on non-volatile logic designs. First, the interrogation voltage is ideally a high enough fraction of the applied voltage to guarantee that the charge output of the 'one' capacitor exceeds the charge output of the 'zero' capacitor. This is accomplished by load capacitors Z10 and Z11 shown in FIGS. 4 and 5. Second, active sensing should not begin until the interrogation voltage passes out of the range of ambiguity created by relaxation. This is accomplished by the controlled PNODE source connections of N1PA and N2PA.

Figure 9:
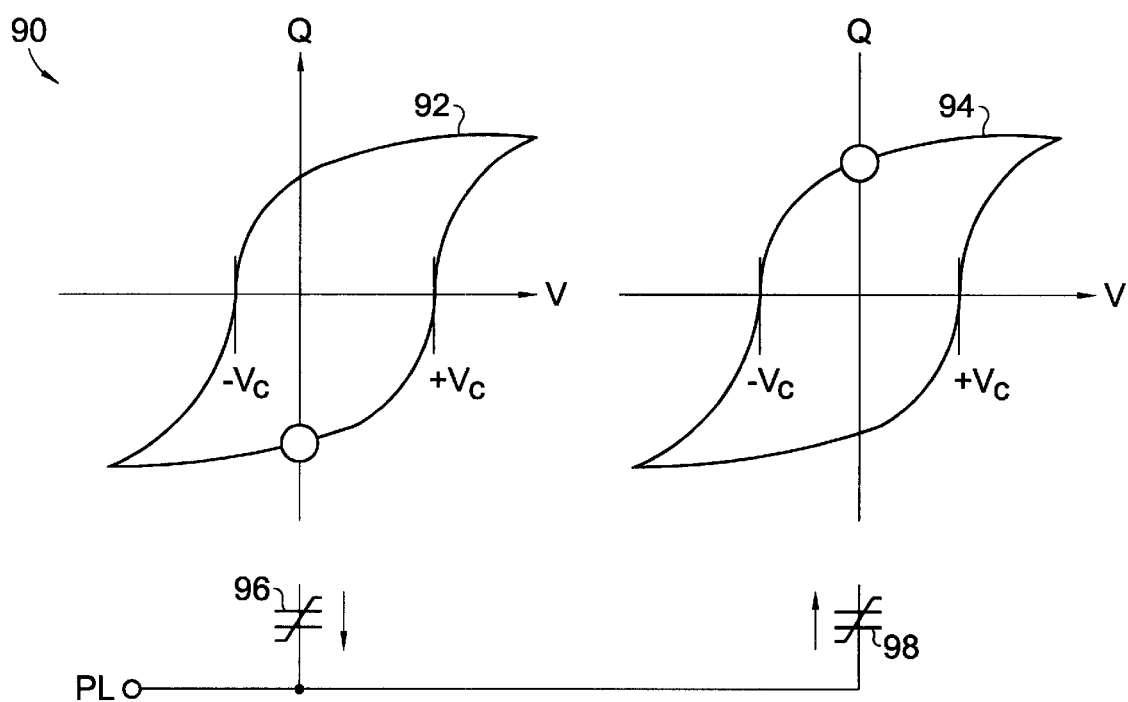
FIG. 9 depicts asymmetric imprint of complementary hysteresis loops.

FIG. 8 is a hysteresis and schematic diagram 80 that depicts the effect of imprint on polarized ferroelectric capacitors. An imprinted ferroelectric capacitor behaves as if the loop were shifted along the voltage axis. When a capacitor is imprinted, a higher voltage is required to change the polarization state of the capacitor. FIG. 8 shows symmetrically imprinted complementary capacitors 86 and 88 and the corresponding shifted hysteresis loops 82 and 84. Experimental measurements have shown imprint to be an interface related phenomenon. This data indicates that capacitors polarized with the top electrode positive with respect to the bottom electrode may exhibit different imprint than capacitors polarized with the top electrode negative with respect to the bottom electrode. As a result, FIG. 9 depicts the effect of asymmetric imprint on complementary hysteresis loops 92 and 94 corresponding to oppositely polarized capacitors 96 and 98. Analysis of FIG. 9 reveals that for low interrogation voltages, a 'zero' capacitor and a 'one' capacitor are difficult to distinguish. Again, a sufficient bit/cell ratio and controlled sensing address this second non-ideality arising from imprint. In actual measurements, relaxation and imprint are difficult to separate, but both act to increase the required interrogation voltage.

In a standalone non-volatile logic circuit, the bit line parasitic capacitance is greatly reduced compared to a memory array. As such, it may be necessary to increase the load capacitance. Ferroelectric materials provide a high dielectric constant, which minimizes this capacitor area. The load capacitors Z10 and Z11 in FIGS. 4 and 5 are connected directly to the storage capacitors Z0 and Z1. The load capacitance could also be connected outside the access devices T1 and T2. The shown connection minimizes the capacitive load placed on the SR flip-flop, thereby maintaining the speed performance of the original volatile logic element.

Figure 10:
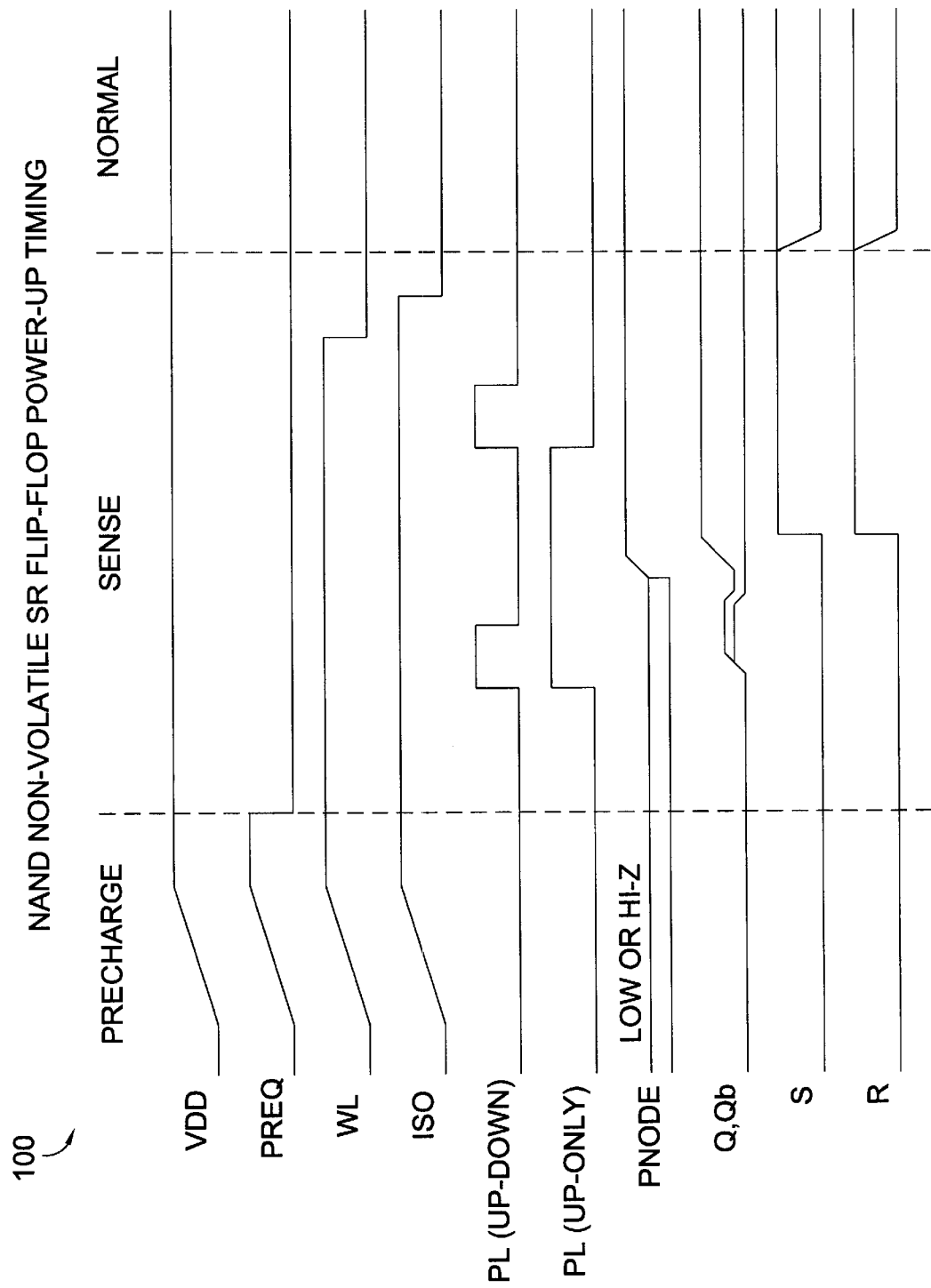
FIG. 10 shows one possible power-up timing sequence for the NAND based non-volatile SR flip-flops shown in FIGS. 4 and 5.

FIG. 10 shows one possible power-up timing sequence for the NAND based non-volatile SR flip-flops shown in FIGS. 4 and 5. The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines, Q and QB. During precharge, WL is also held high to precharge the internal ferroelectric memory nodes. The WLB signal is not shown, but it is always the complement of WL. The ISO signal is also forced high at this time to deactivate transistors N1PB and N2PB and to create a virtual NNODE at the sources of transistors N1NA and N2NA. Control logic additionally keeps the S and R inputs low to disable the sense amplifier pulldown. Finally, PNODE is either held low or tri-stated during precharge to prevent premature sensing.

The sensing sequence begins with the failing of the PREQ signal, which floats the bit lines Q and QB. Next, the PL pulsing interrogation begins. Both "up-only" and "up-down" plate pulsing are shown in FIG. 10, but the bit line response is shown for only "up-down" plate pulsing. After plate pulsing, a voltage differential based on the polarization of the ferroelectric capacitors exists on the bit lines and is ready for sensing. The sense amplifier consisting of transistors N1PA, N2PA, N1NA, and N2NA is then activated by driving PNODE high and by forcing the S and R inputs high. The relative timing of PNODE and S and R can be optimized for the required sense amplifier sensitivity and speed.

Once the correct logic state is sensed and Q and QB achieve full-rail separation, the ferroelectric storage capacitors are restored due to the destructive nature of the read operation. The restore is accomplished by forcing the PL signal both high and low for some minimum restore time. The mode of operation shown in FIG. 10 involves only accessing the ferroelectric capacitors during read and write operations and disconnecting the ferroelectric storage capacitors from the flip-flop at all other times. The storage and load capacitors are isolated from the flip-flop by bringing WL low. Next, the ISO signal is brought low to disable NNODE equalization and to enable transistors N1PB and N2PB. At this point, the state of the SR flip-flop has been returned to the value that was stored in the ferroelectric non-volatile memory and the S and R inputs are forced to the "hold" state of a NAND based SR flip-flop.

Finally, the control logic relinquishes control of the S and R inputs and enables their normal connections. If the S and R inputs for the NAND based SR flip-flop become anything but '11', the restored state will be replaced with the new forced state. The flip-flop is now in normal operation mode and will behave like a standard NAND based CMOS flip-flop.

Figure 11:
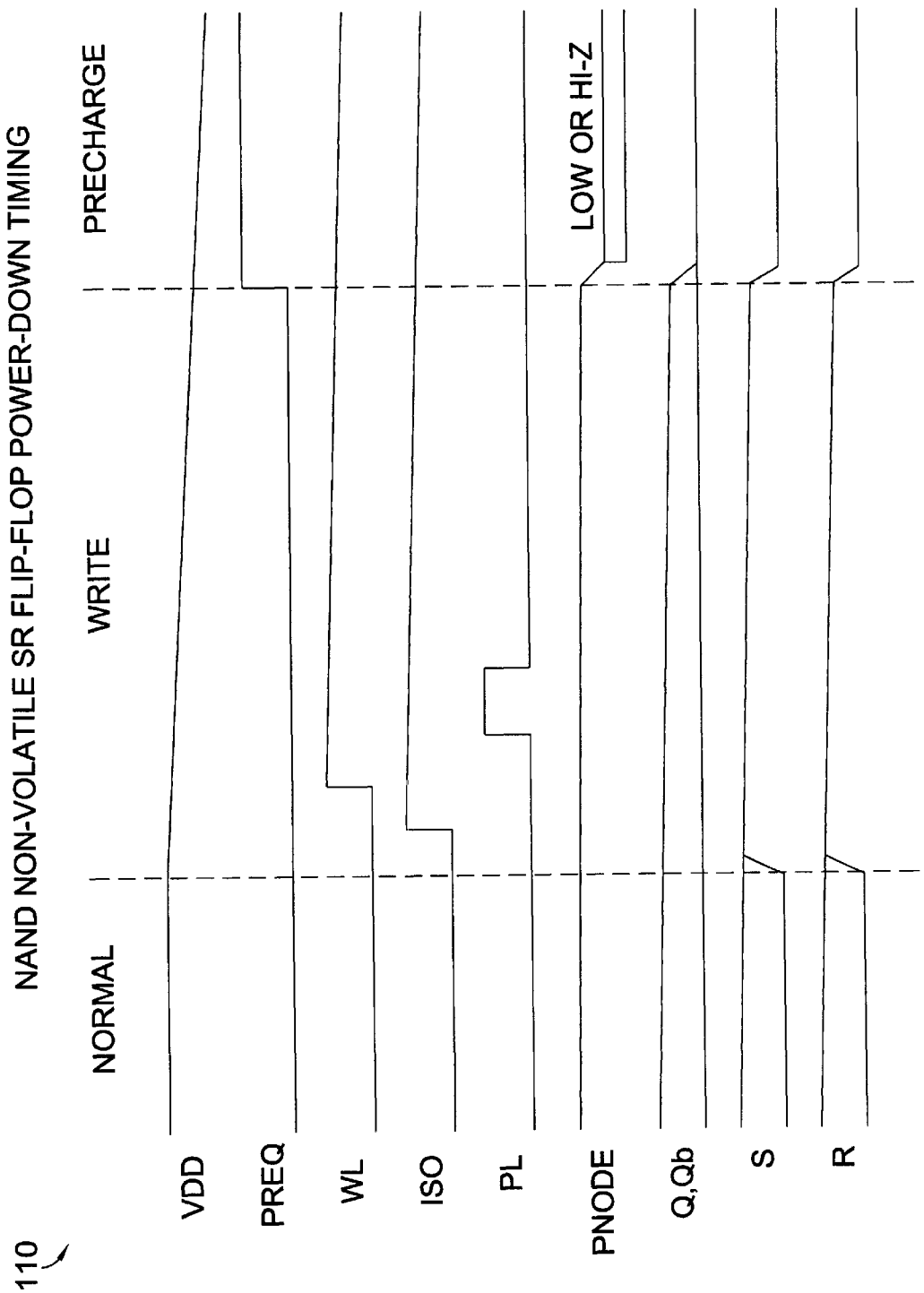
FIG. 11 depicts one possible write timing sequence for the NAND based non-volatile SR flip-flops shown in FIGS. 4 and 5.

FIG. 11 depicts one possible write timing sequence. In FIG. 11, the write to the ferroelectric memory occurs at power-down. As soon as control circuitry detects a falling power supply, the S and R inputs to the NAND based SR flip-flop are forced high to latch the current state of the flip-flop. Next, the ISO signal goes high to deactivate N1PB and N2PB as done during the read operation. Then, WL rises and WLB falls to connect the bit lines to the ferroelectric capacitors. The PL is then forced high and low to polarize both capacitors. When PL is high, the 'zero' capacitor is polarized and when PL is low, the 'one' capacitor is polarized. The order of capacitor polarization is not critical. After the minimum polarization time on each capacitor has been satisfied, the precharge cycle can begin. In FIG. 11, the precharge cycle does not begin immediately. Rather control circuitry detects some minimum voltage below which precharge occurs.

Latching the flip-flop during a write is not strictly necessary, but it may allow control logic sharing between read and write operations. If S and R are not forced high during a write, a '00' input should be avoided as both ferroelectric capacitors would be polarized in the same direction. Upon power-up, the sense amplifier then forces Q and QB to unknown but opposite states, which would not be the '11' output normally forced by a '00' input. If S and R are both forced high during a write, the ISO signal does not need to go high during a write, but again, this may allow control logic sharing between read and write operations.

FIGS. 10 and 11 show timing that fits well in a design that reads the non-volatile memory on power-up and writes the non-volatile memory on power down. Other approaches could also be used. In most practical cases, reads will only be required on power-up, but writes to the non-volatile memory could be done at any time. Write on power-down, as shown in FIG. 11, places the least stress on the ferroelectric material, but write on state-change is another approach that could be used. For ferroelectric materials with suitably low time-at-bias dependent imprint and low time-dependent-dielectric-breakdown (TDDB) risk, and in a system where the SR flip-flop delay does not require minimization, the ferroelectric capacitors could be accessed at all times. In this scenario, WL is high during normal operation, and PL could be pulsed at power-down, periodically pulsed, or even held at VDD/2 if the ferroelectric material exhibits a sufficiently low coercive voltage.

Figure 12A:
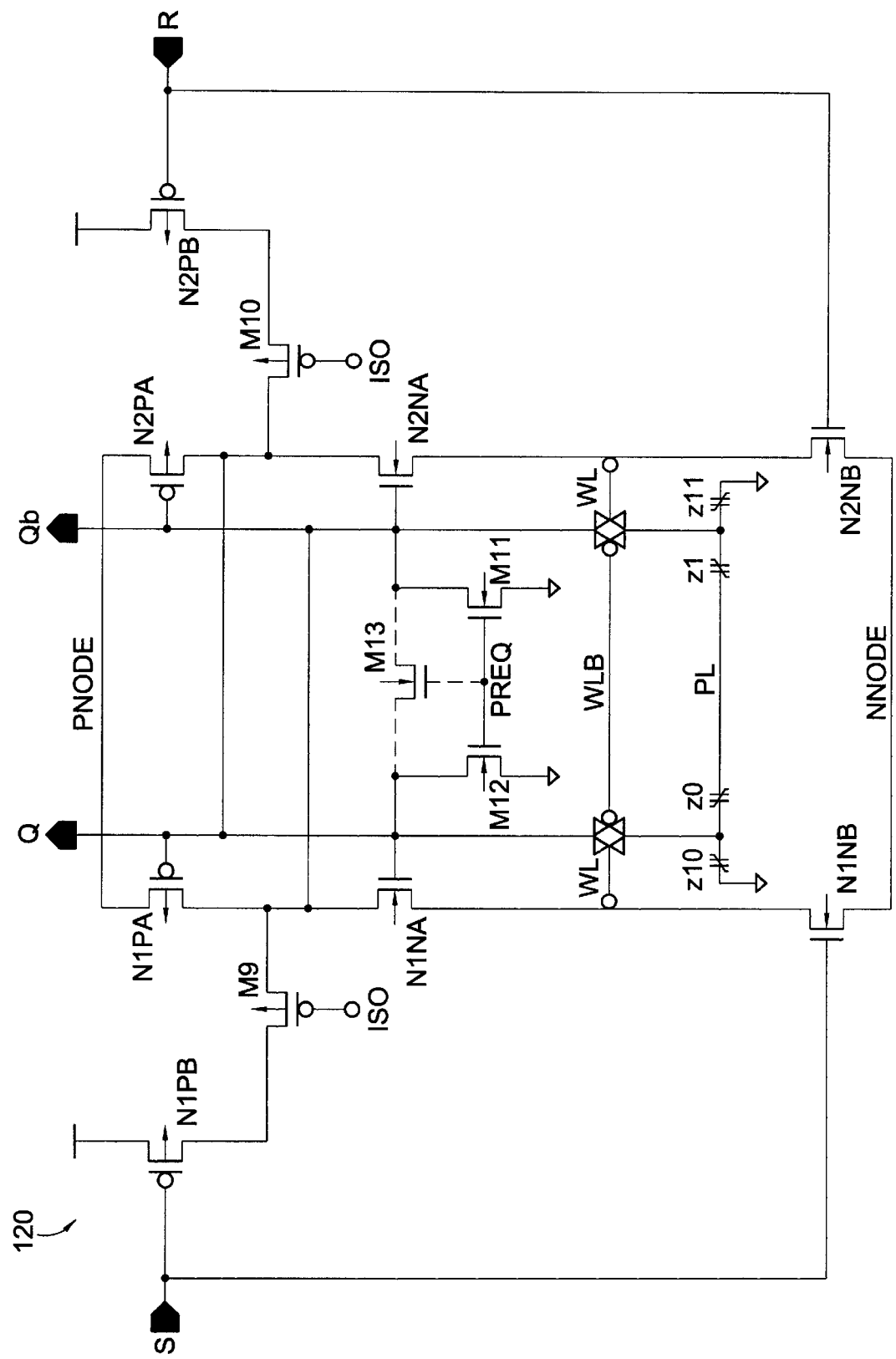
FIG. 12A shows another possible NAND based non-volatile SR flip-flop.
Figure 12B:
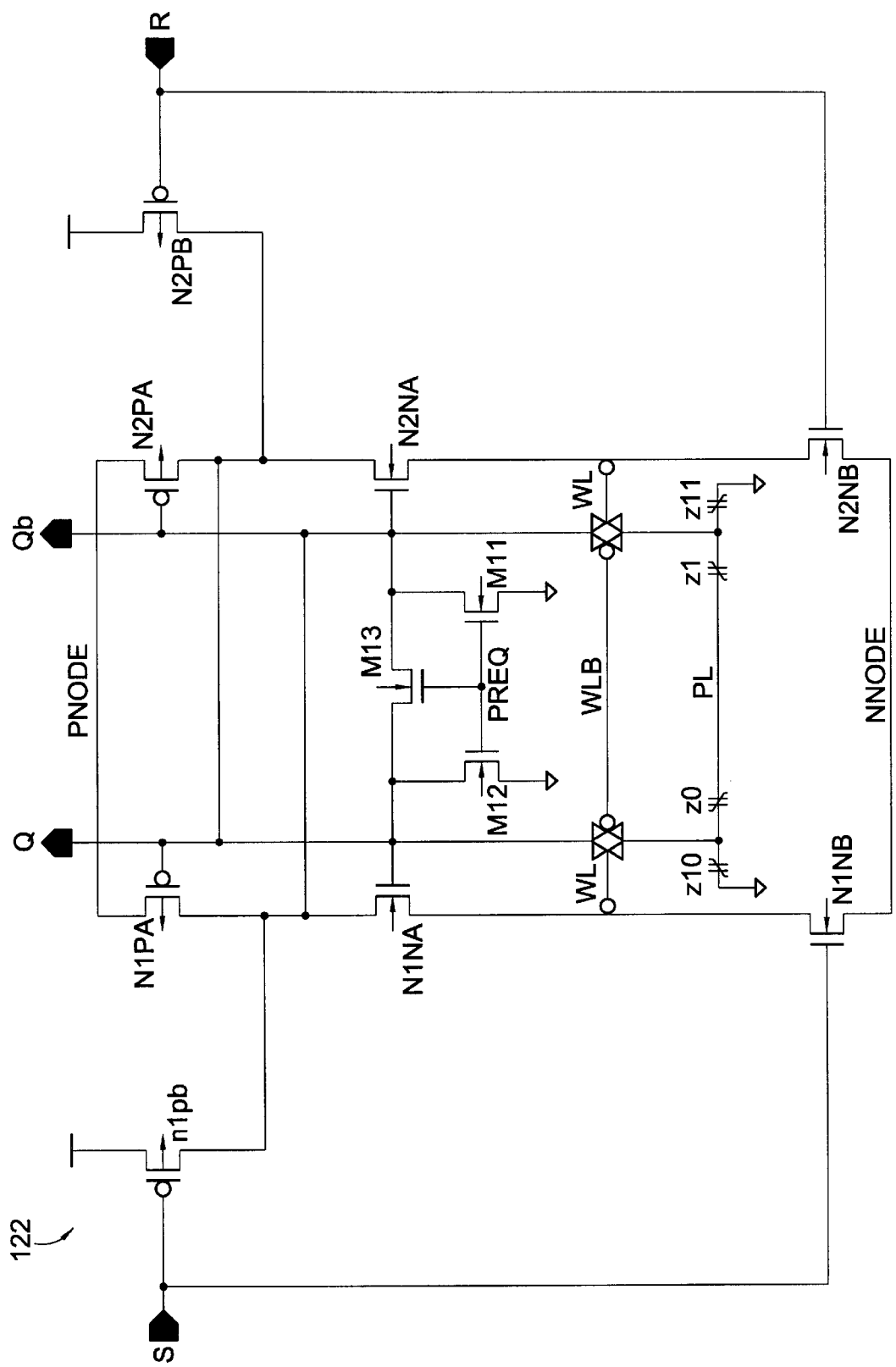
FIG. 12B shows a simplified configuration of the flip-flop of FIG. 12A.

Another possible NAND based non-volatile SR flip-flop 120 is introduced by FIG. 12A. This configuration is useful in expanding the SR flip-flop to create other logic elements. This configuration implements control supplies for both PNODE and NNODE. By controlling both supplies independently of the S and R inputs, the sense amplifier can be disabled when the S and R inputs of the NAND based SR flip-flop are high. The importance of is further explained during the subsequent discussion of the JK flip-flop. Because the sense amplifier supplies are controlled, the ISO signal in FIG. 12A is not required. FIG. 12B shows this simplified configuration. If S and R are forced high during the power-up read, transistors N1NB and N2NB are always on during sensing and do not significantly factor into the read operation. It should be noted that the sources of transistors N1PB and N2PB can also be tied to the controlled supply PNODE instead of the global supply without any change in functionality.

Figure 12C:
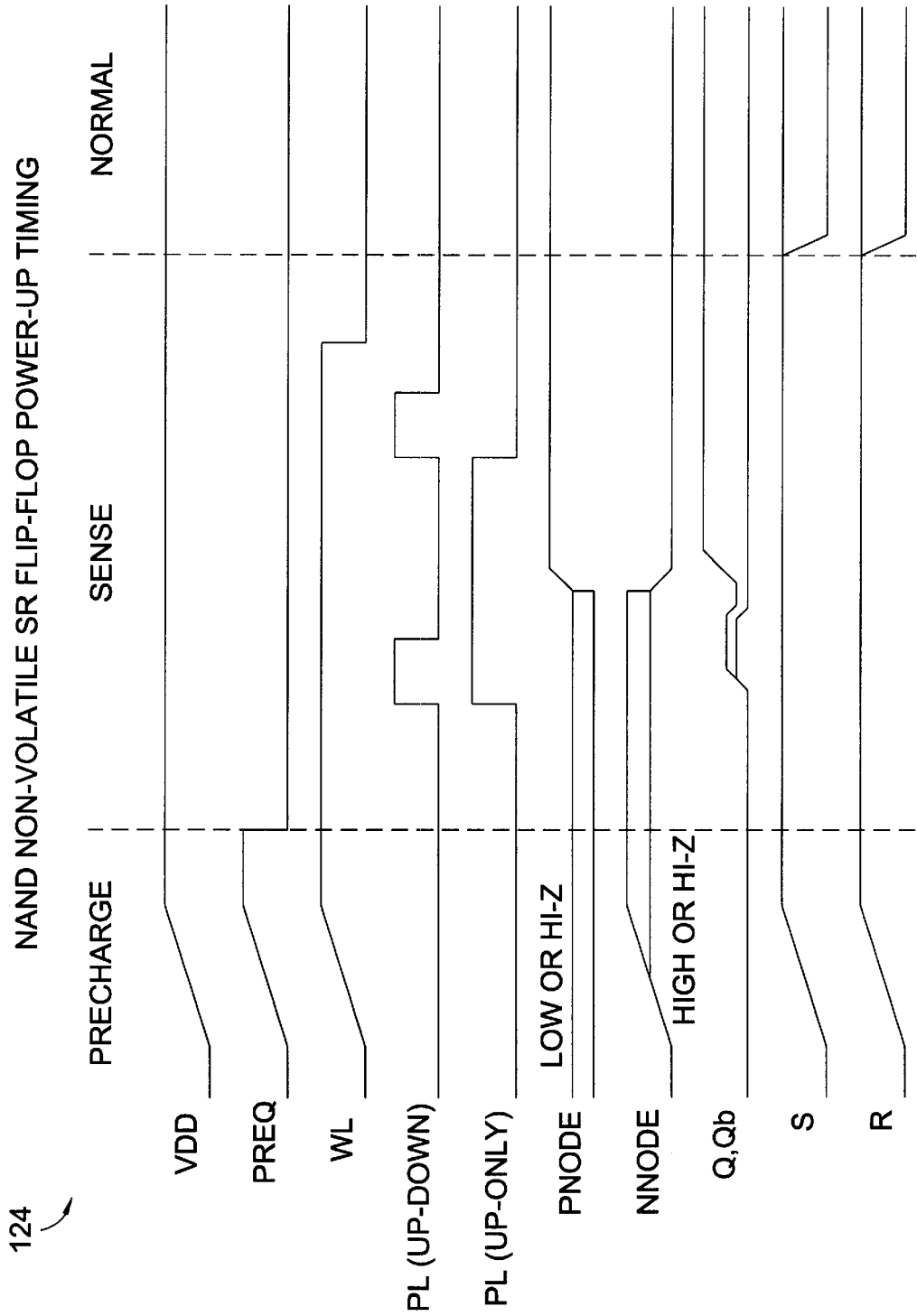
FIG. 12C shows one possible power-up timing sequence for the NAND based non-volatile SR flip-flops shown in FIGS. 12A and 12B.

FIG. 12C shows one possible power-up timing sequence 124 for the NAND based non-volatile SR flip-flops shown in FIGS. 12A and 12B. The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines, Q and QB. During precharge, WL is also held high to precharge the internal ferroelectric memory nodes. The WLB signal is not shown, but it is always the complement of WL. Control logic keeps the S and R inputs high to activate transistors N1NB and N2NB to prepare the sense amplifier pulldown. During precharge, the sense amplifier pulldown is disabled by tri-stating NNODE or driving NNODE high. Finally, PNODE is either held low or tri-stated during precharge to prevent premature sensing.

The sensing sequence begins with the failing of the PREQ signal, which floats the bit lines Q and QB. Next, the PL pulsing interrogation begins. Both "up-only" and "up-down" plate pulsing are shown in FIG. 12C, but the bit line response is shown for only "up-down" plate pulsing. After plate pulsing, a voltage differential based on the polarization of the ferroelectric capacitors exists on the bit lines and is ready for sensing. The sense amplifier consisting of transistors N1PA, N2PA, N1NA, and N2NA is then activated by driving PNODE high and by driving NNODE low. The relative timing of PNODE and NNODE can be optimized for the required sense amplifier sensitivity and speed.

Once the correct logic state is sensed and Q and QB achieve full-rail separation, the ferroelectric storage capacitors are restored due to the destructive nature of the read operation. The restore is accomplished by forcing the PL signal both high and low for some minimum restore time. The mode of operation shown in FIG. 12C involves only accessing the ferroelectric capacitors during read and write operations and disconnecting the ferroelectric storage capacitors from the flip-flop at all other times. The storage and load capacitors are isolated from the flip-flop by bringing WL low. At this point, the state of the SR flip-flop has been returned to the value that was stored in the ferroelectric non-volatile memory and the S and R inputs are forced to the "hold" state of a NAND based SR flip-flop.

Finally, the control logic relinquishes control of the S and R inputs and enables their normal connections. If the S and R inputs for the NAND based SR flip-flop become anything but '11', the restored state will be replaced with the new forced state. The flip-flop is now in normal operation mode and will behave like a standard NAND based CMOS flip-flop.

Figure 13:
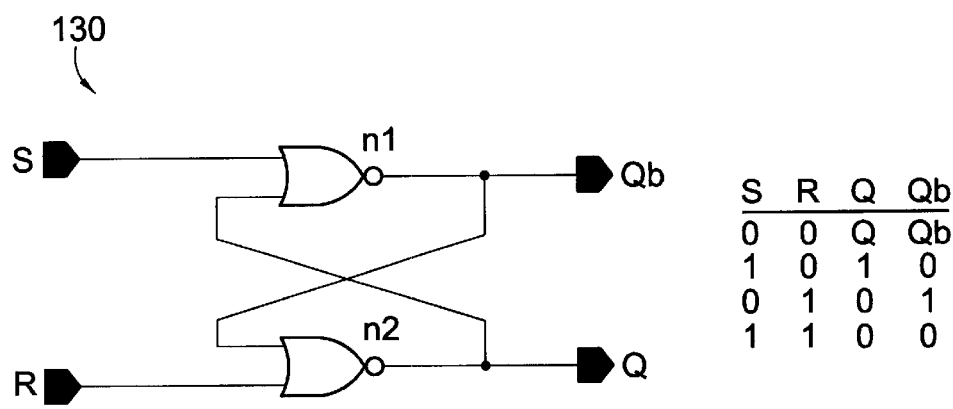
FIG. 13 shows the standard gate representation of a NOR based SR flip-flop and its truth table.
Figure 14:
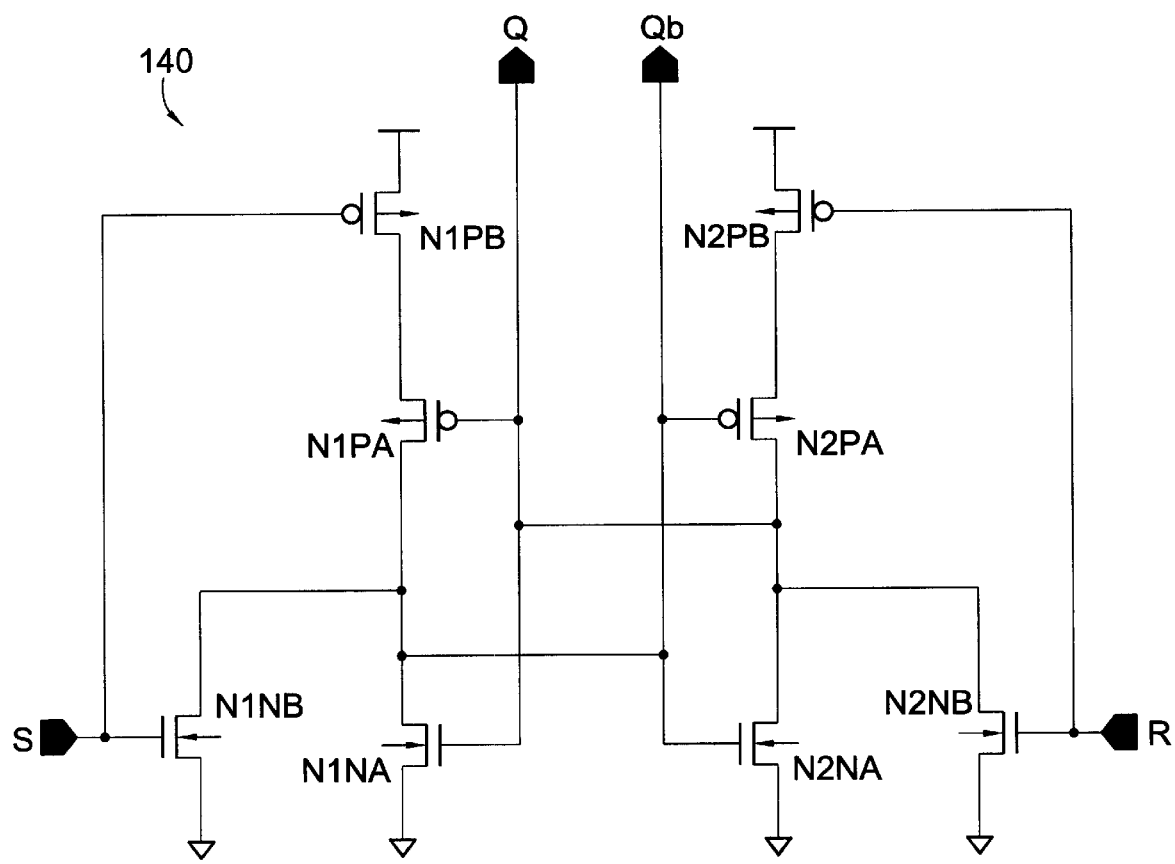
FIG. 14 shows one possible CMOS implementation of the flip-flop shown in FIG. 13.

Referring now to FIGS. 13–17, NOR-based SR flip-flops are discussed, beginning with a CMOS NOR-based SR flip-flop 130 shown in FIG. 13. FIG. 13 shows the standard gate representation of a NOR-based SR flip-flop 130 and its corresponding truth table. FIG. 14 shows one possible CMOS implementation 140 of flip-flop 130. NOR gate N1 of FIG. 13 is implemented by series-connected PMOS transistors N1PA and N1PB and NMOS transistors N1NA and N1NB. Similarly, NOR gate N2 of FIG. 13 is implemented by series-connected PMOS transistors N2PA and N2PB and NMOS transistors N2NA and N2NB.

Figure 15:
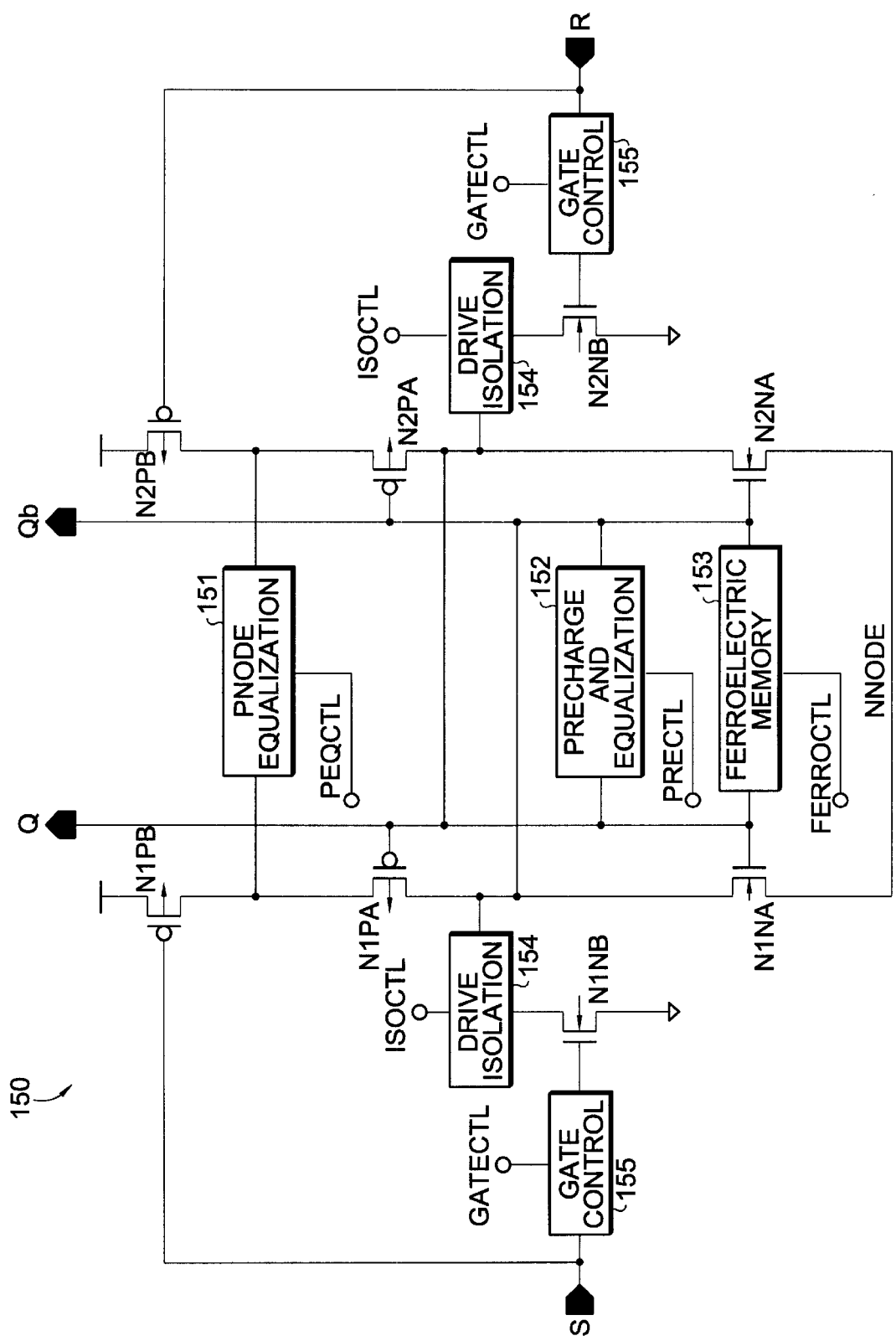
FIG. 15 shows a block/schematic diagram of a ferroelectric, non-volatile NOR-based SR flip-flop according to the present invention, wherein a "drive isolation" and a "gate control" are both shown, although only one of the circuits is necessary for a given topology.

FIG. 14 is drawn so that the cross-coupled sense amplifier devices required for the ferroelectric non-volatile memory are immediately obvious. During sensing, transistors N1PA, N2PA, N1NA and N2NA become the sense amplifier in FIGS. 15–17, while transistors N1PB and N2PB create a virtual supply for each side of the sense amplifier. Transistors N1NB and N2NB are deactivated during sensing by one of two methods. Both possible methods, "Drive Isolation" and "Gate Control," are shown in FIG. 15, but only one is necessary for the given topology.

Figure 16:
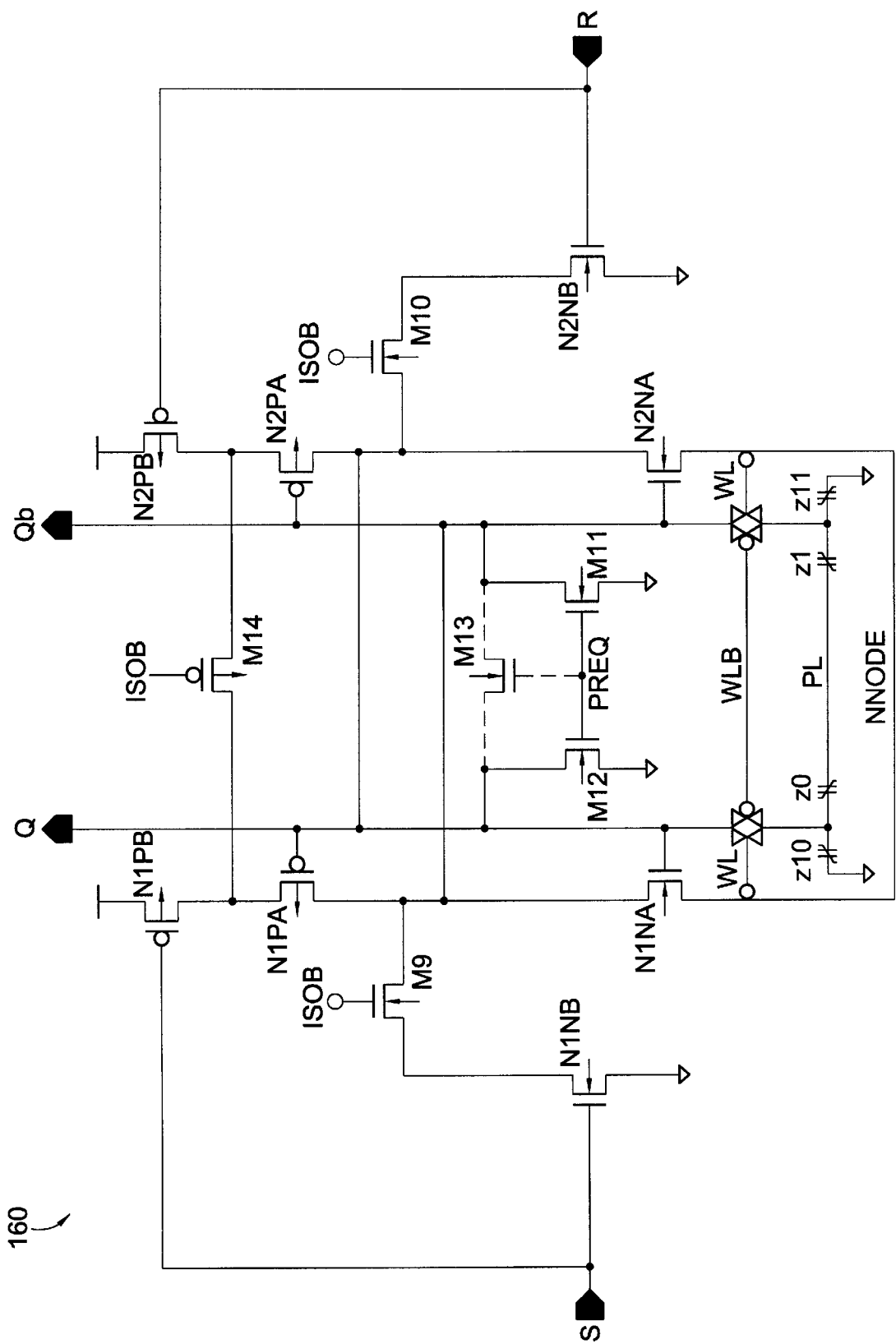
FIG. 16 shows a first complete version of the NOR-based ferroelectric non-volatile SR flip-flop of FIG. 15 using drive isolation and no gate control.
Figure 17:
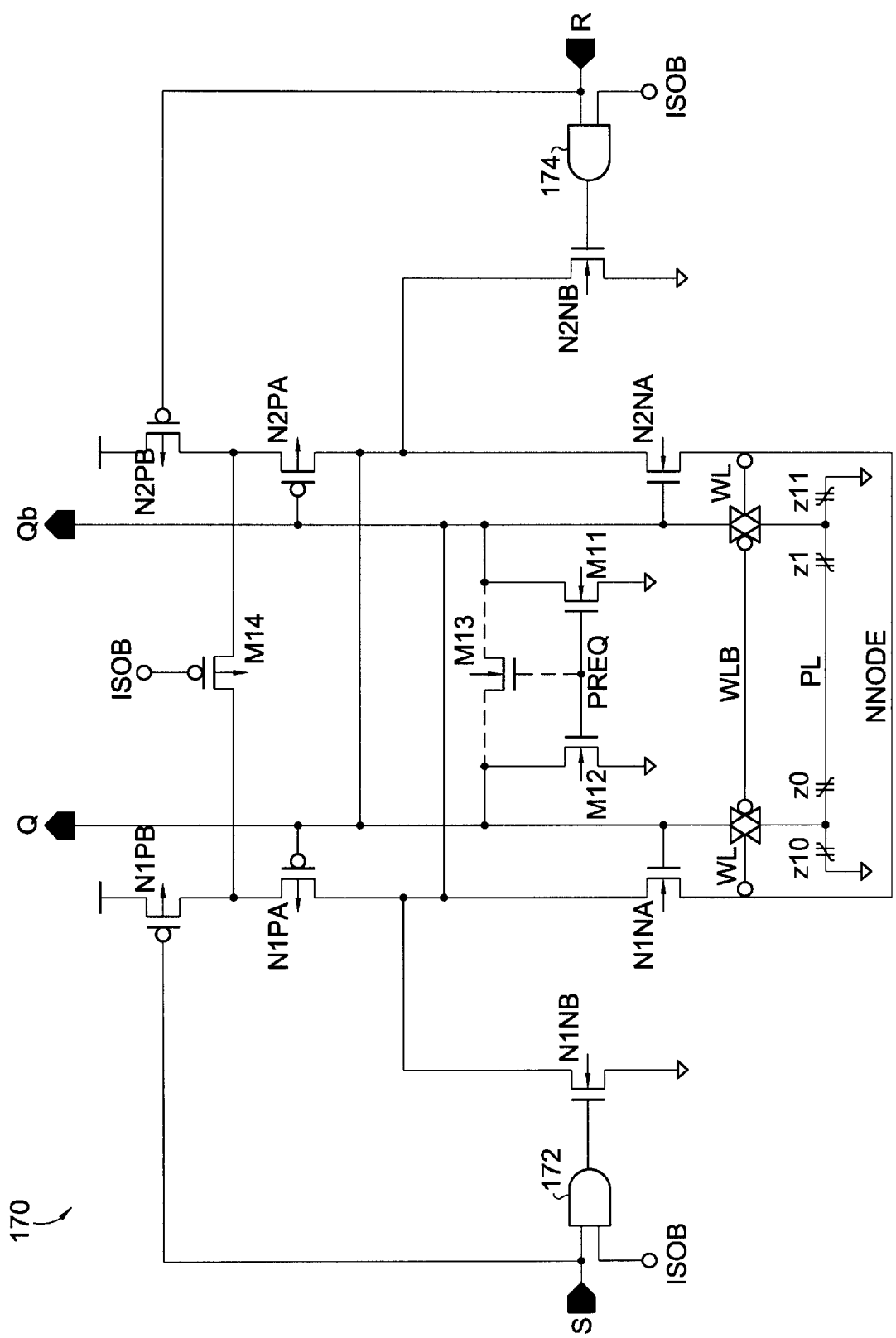
FIG. 17 shows a second complete version of the NOR-based ferroelectric non-volatile SR flip-flop of FIG. 15 using gate control and no drive isolation.

The sources of transistors N1NA and N2NA are disconnected from ground and tied to the controlled NNODE. In current ferroelectric memory practice, NNODE is held high or tri-stated until a starting voltage differential is established between Q and QB. In the same way, the sources of transistors N1PA and N2PA are normally held low or tri-stated until a voltage differential is established between outputs Q and QB. In FIGS. 15–17, transistors N1PB and N2PB are used to tri-state the sources of the PMOS sense amplifier devices until sensing is desired. By leaving NNODE high or tri-stated, and by ensuring transistors N1PB and N2PB are off, the starting voltage differential between Q and QB depends only on the stored polarization state of the ferroelectric memory.

The implementation of the ferroelectric memory shown in the flips-flops 160 and 170 of FIGS. 16 and 17 was generally described above in the discussion of the NAND-based SR flip-flops. More alternative implementations are discussed below. FIGS. 16 and 17 each show one version 160 and 170 of a complete NOR-based ferroelectric non-volatile SR flip-flop. FIGS. 16 and 17 differ only in the method used to deactivate transistors N1NB and N2NB. FIG. 16 shows one possible method of drive isolation, where the ISOCTL bus requires only one control signal named ISOB. FIG. 17 shows one possible method of implementing a gate control circuit in which the GATECTL bus requires only one control signal, which can be the same ISOB signal for this example.

As in the NAND based flip-flop description, two optional blocks are included. The optional precharge and equalization block 152 again implements a ground precharge via NMOS transistors and a single PREQ signal. The second optional block 151, named "PNODE Equalization" serves the same function as the "NNODE Equalization" block in the NAND based SR flip-flop. In a typical CMOS sense-amplifier, the sources of transistors N1PA and N2PA are tied together. The PNODE Equalization block 151 effectively ties these sources together during sensing, thus making the adapted sense amplifier function more like a standard sense amplifier.

In FIG. 16, transistors M9 and M10 implement the drive isolation approach to remove transistors N1NB and N2NB during sensing. A single active low ISOB signal completes the ISOCTL bus. In FIG. 17, two AND gates are used to force the gates of transistors N1NB and N2NB low when ISOB is low. Conveniently, the ISOB signal can also complete the PEQCTL bus in the PNODE Equalization block. A single PMOS transistor, M14, fulfills the equalization role during sensing. NMOS devices M1, M12 and M13 accomplish Precharge and Equalization of Q and QB. Transistor M13 is optional in the circuits depicted in FIGS. 16 and 17.

Figure 18:
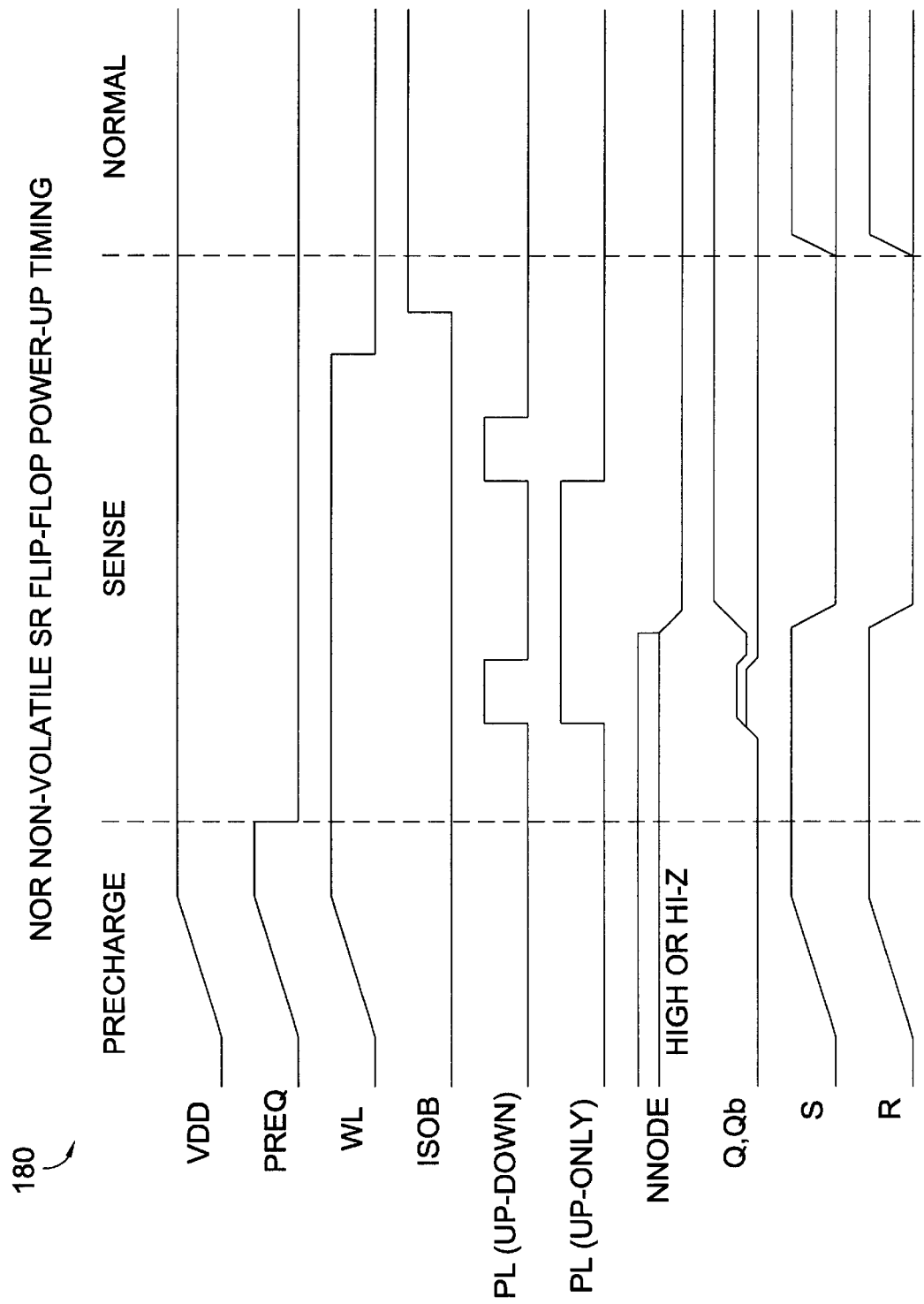
FIG. 18 depicts one possible power-up timing sequence for the NOR based non-volatile SR flip-flops shown in FIGS. 16 and 17.

FIG. 18 depicts one possible power-up timing sequence 180 for the NOR-based non-volatile SR flip-flops shown in FIGS. 16 and 17. The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines, Q and QB. During precharge, WL is also held high to precharge the internal Ferroelectric Memory nodes. The ISOB signal is also forced low at this time to deactivate transistors N1NB and N2NB and to create a virtual PNODE at the sources of transistors N1PA and N2PA. Control logic additionally keeps the S and R inputs high to disable the sense amplifier pullup. Finally, NNODE is either held high or tri-stated during precharge and plate pulsing to prevent premature sensing.

The sensing sequence begins with the falling of the PREQ signal, which floats the bit lines Q and QB. Next, the PL pulsing interrogation begins. Both "up-only" and "up-down" plate pulsing are shown in FIG. 18, but the bit line response is shown for only "up-down" plate pulsing. After plate pulsing, a voltage differential based on the polarization of the ferroelectric capacitors exists on the bit lines and is ready for sensing. The sense amplifier consisting of transistors N1PA, N2PA, N1NA and N2NA is then activated by driving forcing the S and R inputs low and by pulling NNODE low. The relative timing of the S and R inputs and NNODE can be optimized for the required sense amplifier sensitivity and speed.

Once the correct logic state is sensed and Q and QB achieve full-rail separation, the ferroelectric storage capacitors are restored due to the destructive nature of the read. The restore is accomplished by forcing the PL signal both high and low for some minimum restore time. The mode of operation shown in FIG. 18 involves only accessing the ferroelectric capacitors during read and write operations and disconnecting the ferroelectric storage capacitors from the flip-flop at all other times. The storage and load capacitors are isolated from the flip-flop by bringing WL low. Next, the ISOB signal is brought high to disable PNODE equalization and to enable transistors N1NB and N2NB. At this point, the state of the SR flip-flop has been returned to the value that was stored in the ferroelectric non-volatile memory and the S and R inputs are forced to the "hold" state of a NOR based SR flip-flop.

Finally, the control logic relinquishes control of the S and R inputs and enables their normal connections. If the S and R inputs for the NOR based SR flip-flop become anything but '00', the restored state is replaced with the new forced state. The flip-flop is now in normal operation mode and will behave like a standard NOR based CMOS flip-flop.

Figure 19:
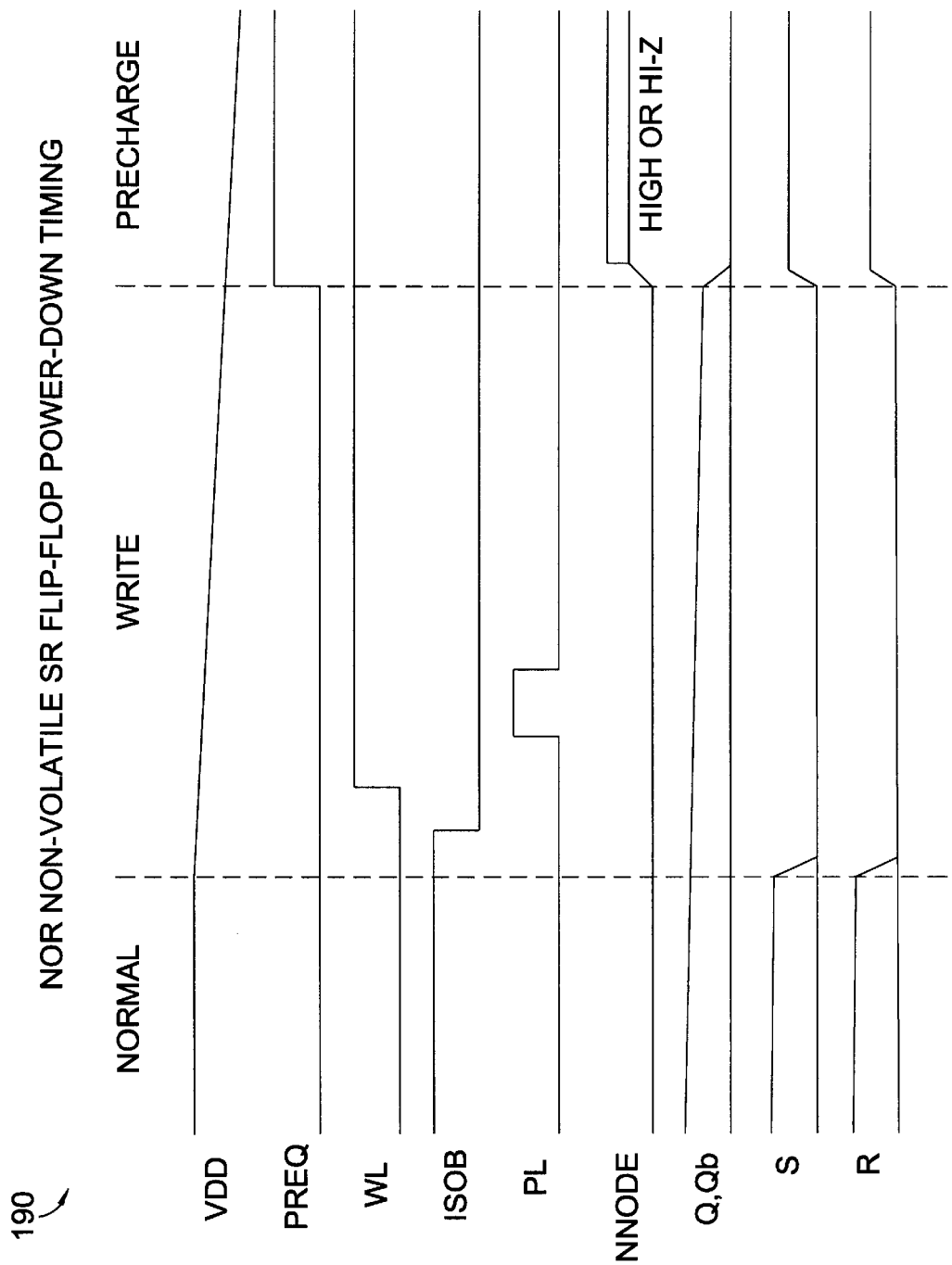
FIG. 19 depicts one possible write timing sequence for the NOR based non-volatile SR flip-flops shown in FIGS. 16 and 17.

FIG. 19 depicts one possible write timing sequence 190. In FIG. 19, the write to the ferroelectric memory occurs at power-down. As soon as control circuitry detects a falling power supply, the S and R inputs to the NOR-based SR flip-flop are forced low to latch the current state of the flip-flop. Next, the ISOB signal goes low to deactivate transistors N1NB and N2NB as is done during the read operation. Then, WL rises and WLB falls to connect the bit lines to the ferroelectric capacitors. The PL signal is then forced high and low to polarize both capacitors. When PL is high, the 'zero' capacitor is polarized and when PL is low, the 'one' capacitor is polarized. The order of capacitor polarization is not critical. After the minimum polarization time on each capacitor has been satisfied, the precharge cycle can begin. In FIG. 19, the precharge cycle does not begin immediately. Rather, control circuitry detects some minimum voltage below which precharge occurs.

Latching the flip-flop during a write is not strictly necessary, but it may allow control logic sharing between read and write operations. If S and R are not forced high during a write, a '11' input should be avoided as both ferroelectric capacitors would be polarized in the same direction. Upon power-up, the sense amplifier would then force Q and QB to unknown but opposite states, which would not be the '00' output normally forced by a '11' input. If S and R are both forced low during a write, the ISOB signal does not need to go low during a write, but again, doing so may allow control logic sharing between read and write operations.

FIGS. 18 and 19 show timing that fits well in a design that reads the non-volatile memory on power-up and writes the non-volatile memory on power down. Other approaches could also be used. In most practical cases, reads will only be required on power-up, but writes to the non-volatile memory could be done at any time. Alternate write approaches were discussed previously in the NAND-based SR flip-flop description.

The technique of adding non-volatility to various circuit elements according to the present invention can be expanded to include ferroelectric non-volatile JK flip-flops. In standard logic, the SR flip-flop forms the basis of many other logic elements. In the same way, the non-volatile SR flip-flops described above can be used as building blocks for other non-volatile logic elements. A non-volatile JK flip-flop is discussed first. For the sake of this discussion, only the NAND-based non-volatile SR flip-flop is used, but the NOR based non-volatile SR flip-flop can also be used.

Figure 20:
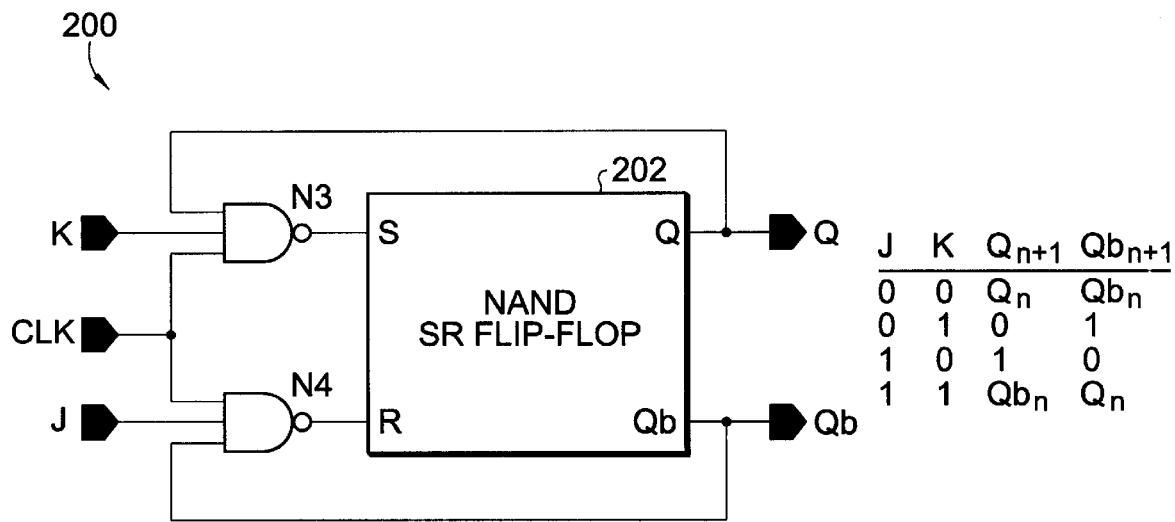
FIG. 20 shows a typical representation of a JK flip-flop along with its truth table.

FIG. 20 shows a typical representation of a JK flip-flop 200 along with its corresponding truth table. The volatile SR flip-flop 202 of FIG. 20 can be replaced with a ferroelectric non-volatile SR flip-flop, such as the ones detailed with respect to FIGS. 12A and 12B, to create a non-volatile JK flip-flop.

Figure 21:
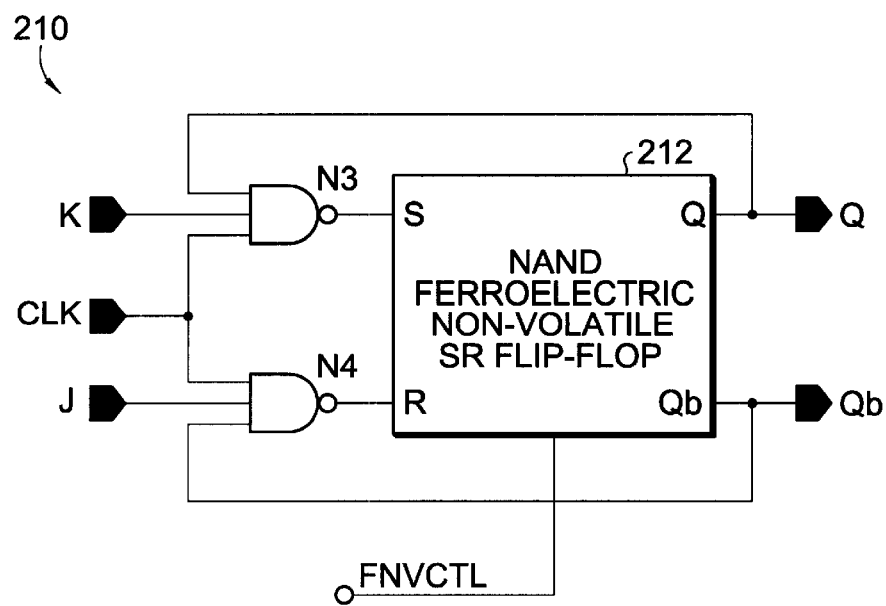
FIG. 21 depicts the substitution of a ferroelectric, non-volatile SR flip-flop along with the necessary control signal bus FNVCTL to form a non-volatile JK flip-flop.

FIG. 21 depicts the substitution of a non-volatile SR flip-flop 212 along with the necessary control signal bus FNVCTL. If the non-volatile flip-flop from FIG. 12A is used for the non-volatile SR flip-flop 212, the FNVCTL bus consists of the following signals: PNODE, NNODE, PL, WL, WLB, ISO and PREQ. If the non-volatile flip-flop from FIG. 12B is used for the SR flip-flop 212, the ISO signal is removed from the FNVCTL list. In the remaining discussion of logic elements based on the non-volatile SR flip-flop, the flip-flop of FIG. 12B is the preferred embodiment. The ISO signal is included in the following timing diagrams and descriptions but does not apply if the non-volatile flip-flop in FIG. 12B is used.

Figure 22:
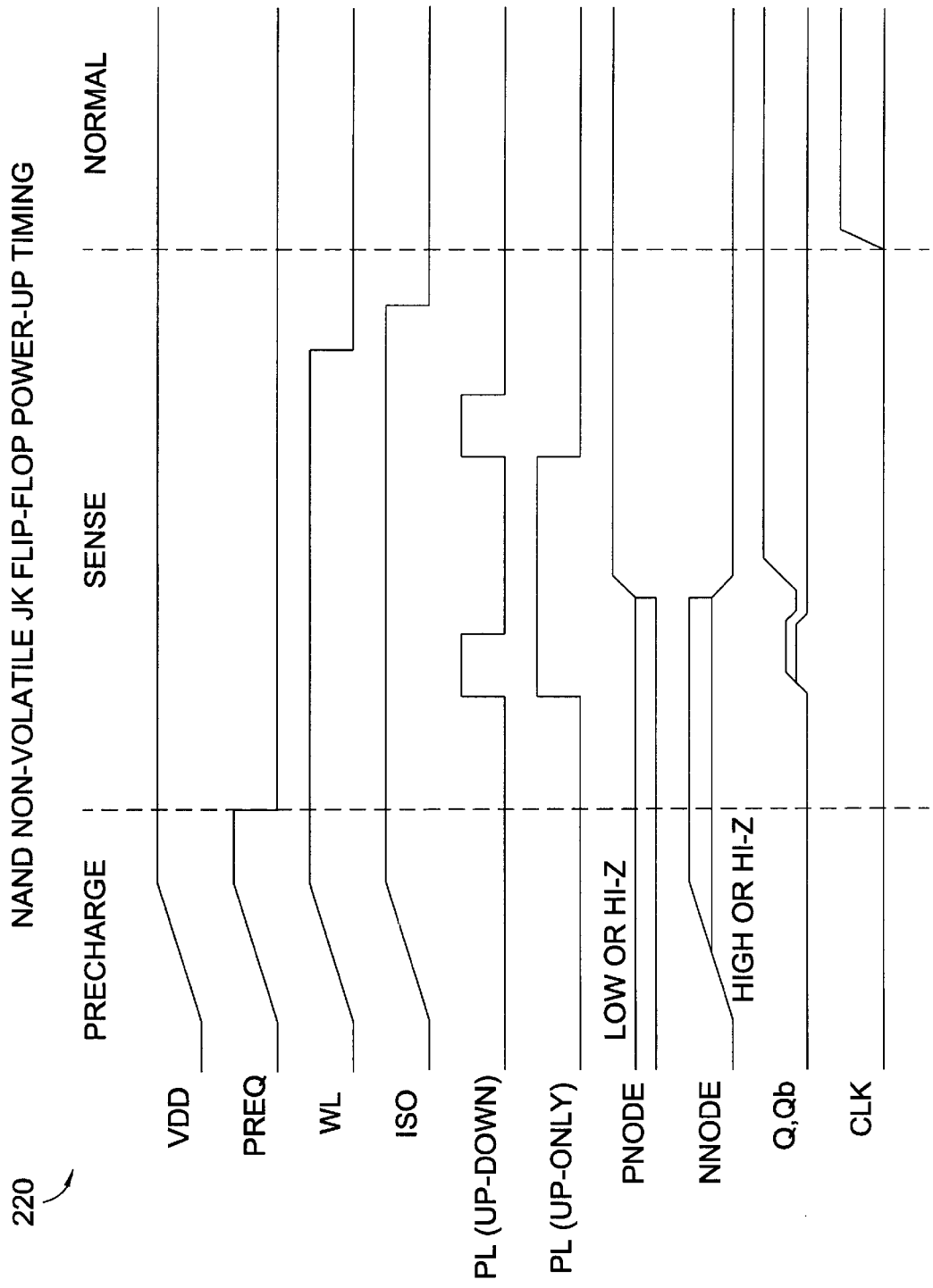
FIG. 22 shows one possible power-up timing sequence for the non-volatile JK flip-flop of FIG. 21 (assuming the use of the non-volatile SR flip-flop shown in FIG. 12A)

FIG. 22 shows one possible power-up timing sequence for the non-volatile JK flip-flop 210 shown in FIG. 21 (assuming the use of the non-volatile SR flip-flop shown in FIG. 12A). The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines, Q and QB. During precharge, WL is also held high and WLB forced low to precharge the internal ferroelectric memory nodes. The ISO signal is also driven high at this time to deactivate transistors N1PB and N2PB. Control logic forces the CLK input low during precharge, which in turn causes the S and R inputs to both go high. Finally, PNODE is either held low or tri-stated and NNODE is either held high or tri-stated.

The sensing sequence begins with the falling of the PREQ signal, which floats the bit lines Q and QB. Next, the PL pulsing interrogation begins. Both "up-only" and "up-down" plate pulsing are shown in FIG. 22, but the bit line response is shown for only "up-down" plate pulsing. After plate pulsing, a voltage differential based on the polarization of the ferroelectric capacitors exists on the bit lines and is ready for sensing. The sense amplifier in FIG. 12A consisting of transistors N1PA, N2PA, N1NA, and N2NA is then activated by driving PNODE high and by driving NNODE low. The relative timing of PNODE and NNODE can be optimized for the required sense amplifier sensitivity and speed.

Once the correct logic state is sensed and Q and QB achieve full-rail separation, the ferroelectric storage capacitors is restored due to the destructive nature of the read operation. The restore is accomplished by forcing the PL signal both high and low for some minimum restore time. The mode of operation shown in FIG. 22 involves only accessing the ferroelectric capacitors during read and write operations and disconnecting the ferroelectric storage capacitors from the flip-flop at all other times. The storage and load capacitors are isolated from the flip-flop by bringing WL low. Next, the ISO signal is brought low to enable transistors N1PB and N2PB. At this point, the state of the internal SR flip-flop, and thus the JK flip-flop, has been returned to the value that was stored in the ferroelectric non-volatile memory and the S and R inputs remain at the "hold" state of a NAND based SR flip-flop due to the CLK signal being low.

Finally, the control logic relinquishes control of the CLK input and enables its normal connection. The flip-flop is now in normal operation mode and will behave like a standard JK flip-flop. If the J and K inputs for the NAND based SR flip-flop are anything but '00' when CLK rises, the restored state will be replaced with the new forced state.

Figure 23:
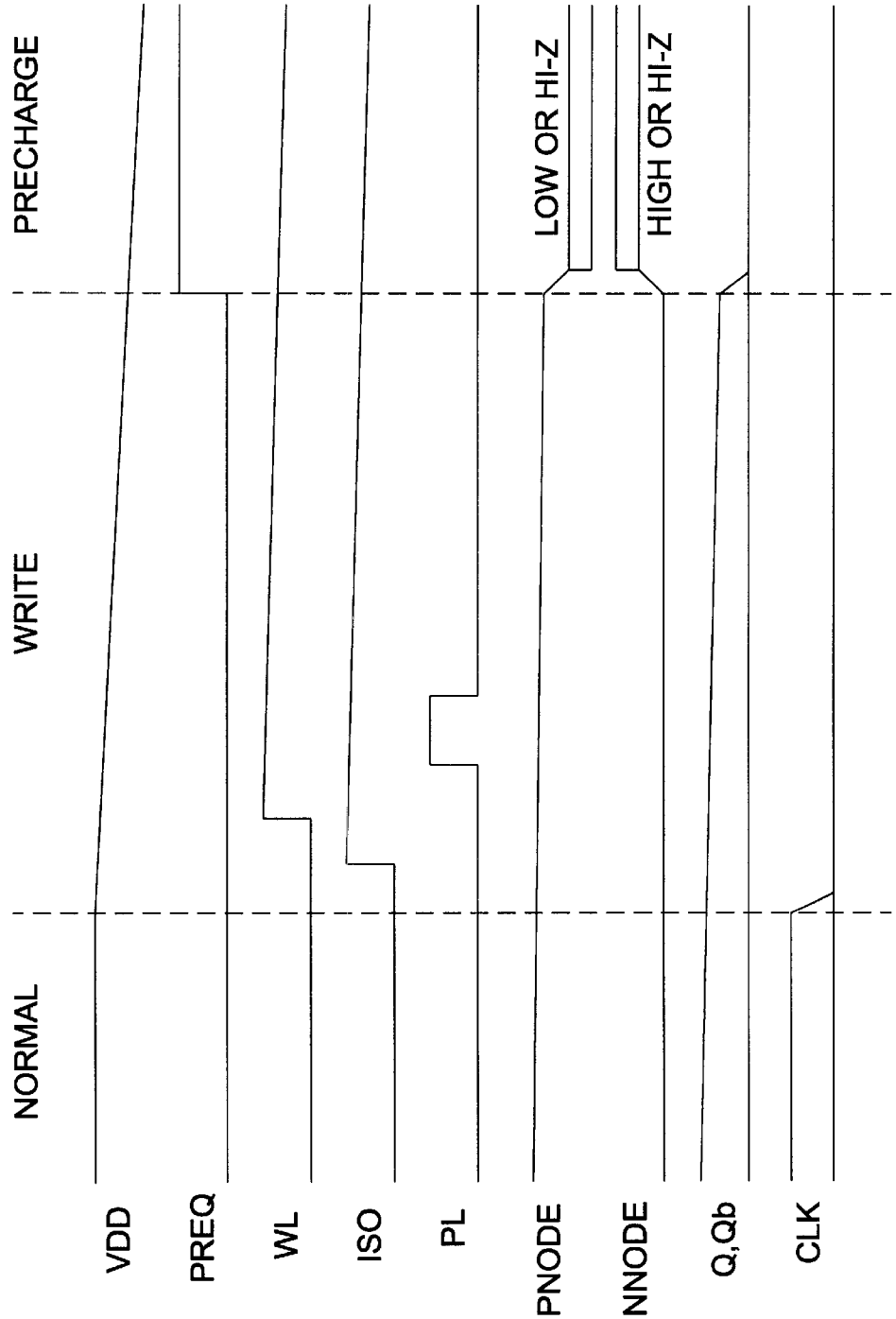
FIG. 23 depicts one possible write timing sequence for the non-volatile JK flip-flop of FIG. 21.

FIG. 23 depicts one possible write timing sequence for the non-volatile JK flip-flop 210. In FIG. 23, the write to the ferroelectric memory occurs at power-down. As soon as control circuitry detects a falling power supply, the CLK signal is driven low, which forces the S and R inputs to the NAND based SR flip-flop high to latch the current state of the flip-flop. Next, the ISO signal goes high to deactivate transistors N1PB and N2PB as done during the read operation. Then, WL rises and WLB falls to connect the bit lines to the ferroelectric capacitors. The PL is then forced high and low to polarize both capacitors. When PL is high, the 'zero' capacitor is polarized and when PL is low, the 'one' capacitor is polarized. The order of capacitor polarization is not critical. After the minimum polarization time on each capacitor has been satisfied, the precharge cycle can begin. In FIG. 23, the precharge cycle does not begin immediately. Rather control circuitry detects some minimum voltage below which precharge occurs.

FIGS. 22 and 23 show timing that fits well in a design that reads the non-volatile memory on power-up and writes the non-volatile memory on power down. Other approaches could also be used, as were originally discussed in the NAND based SR flip-flop section.

The JK flip-flop 200 shown in FIG. 20 and made non-volatile in FIG. 21 form the basis for additional flip-flops. One important device that builds on the JK flip-flop is the edge-triggered JK master-slave flip-flop 240 depicted in FIG. 24. This flip-flop is falling-edge triggered, meaning that data is loaded into the master when CLK is high and transferred into the slave on the falling edge of CLK. The output of the flip-flop is taken from the Q and QB outputs of the slave stage. Flip-flop 200 includes an SR flip-flop 242 in the master stage, an SR flip-flop 244 in the slave stage, and supporting logic circuitry including logic gates N2, N3, N4, and N5.

Figure 24:
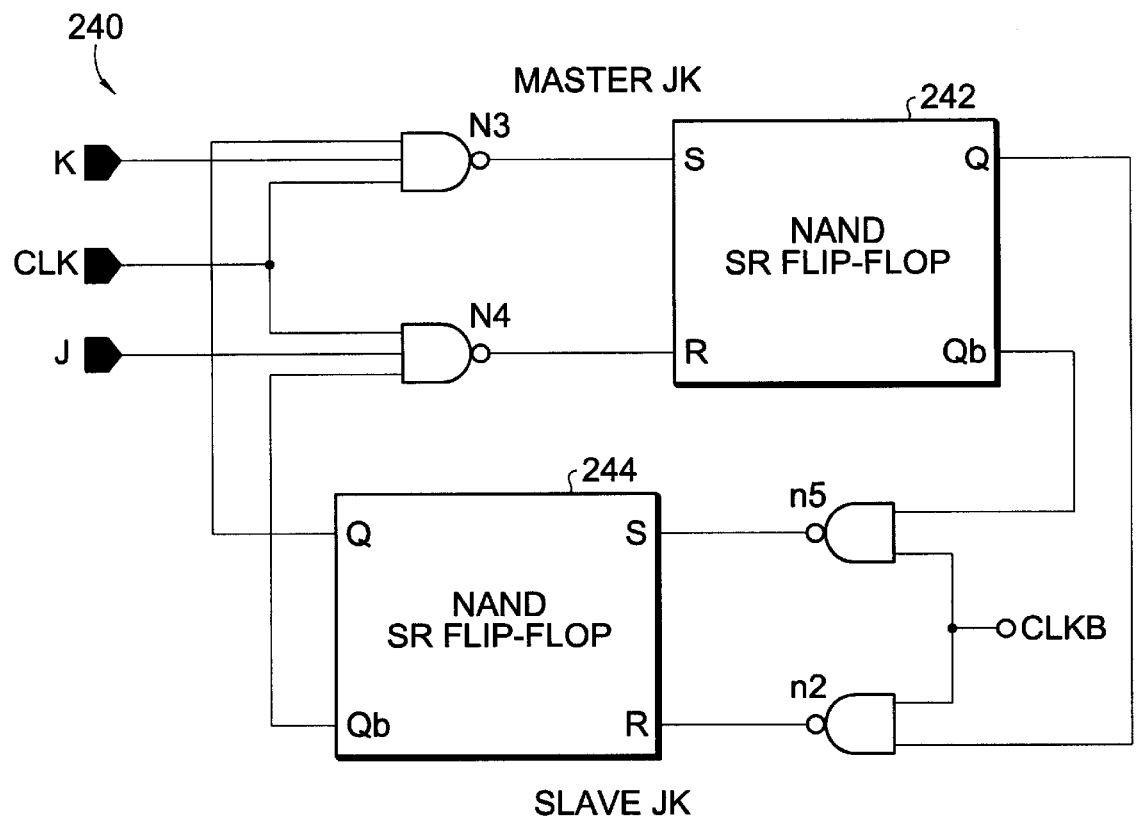
FIG. 24 shows a master-slave JK flip-flop including a master NAND-based SR flip-flop, a slave NAND-based SR flip-flop, and four supporting NAND gates.
Figure 25:
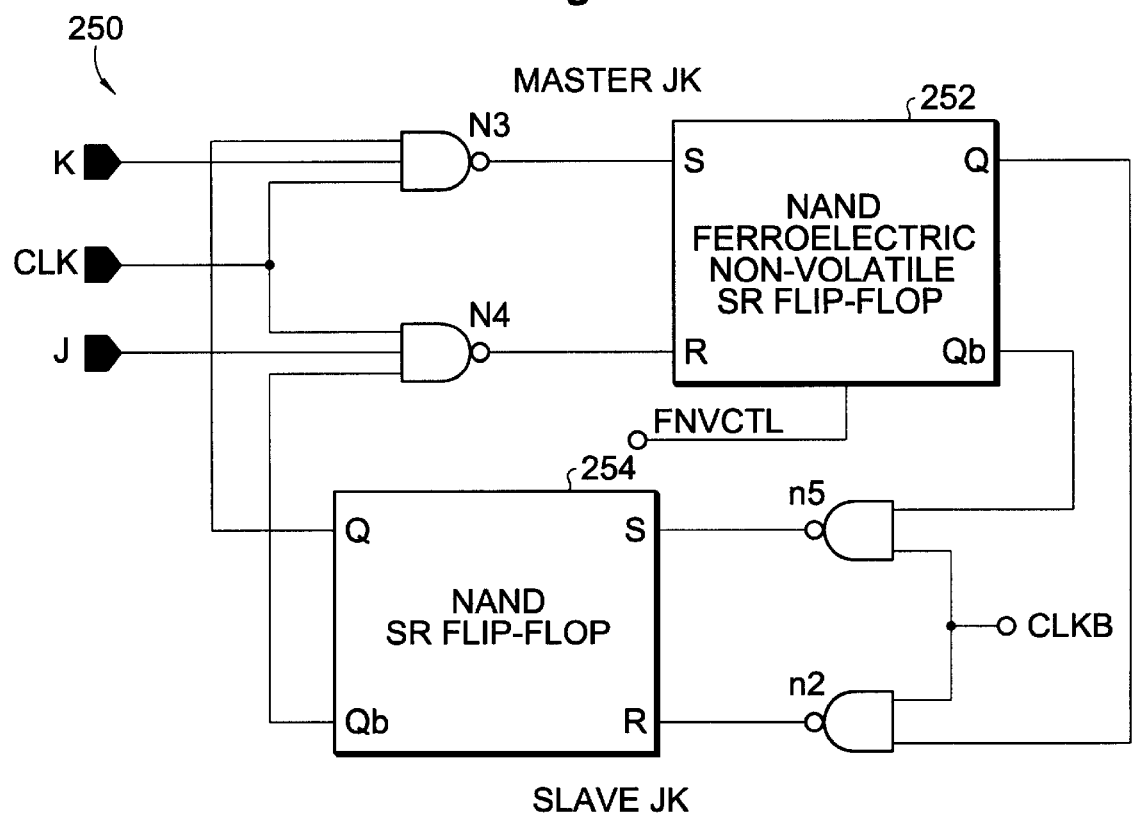
FIG. 25 shows a non-volatile version of the flip-flop of FIG. 24 by the substitution of a ferroelectric non-volatile SR flip-flop, such as the SR flip-flop of FIG. 12A, into the master stage of the edge-triggered JK master-slave flip-flop of FIG. 24.

Flip-flop 240 can be made non-volatile by substituting a non-volatile SR flip-flop, such as the SR flip-flop in FIG. 12A, for one or both of the SR flip-flops shown in FIG. 24. The simplest method of achieving non-volatility is to substitute a non-volatile SR flip-flop 252 into the master stage of the edge-triggered JK master-slave flip-flop 250. This substitution is shown in FIG. 25. The other SR flip-flop 254 remains a volatile SR flip-flop.

The example timing diagrams of FIGS. 22 and 23 also apply to the master-slave JK flip-flop 250 shown in FIG. 25. During precharge and sense operations, the CLK signal is again forced low. With CLK low, the S and R inputs of the NAND ferroelectric non-volatile SR flip-flop 252 in the master stage of the JK flip-flop are both forced high allowing the FNVCTL signals to control the precharge and sensing. When CLK is low, CLKB is high, thereby allowing the output of the master stage to feed directly into the slave stage during the power-up read. As soon as the non-volatile SR flip-flop 252 in the master stage has been restored, the last stored state will appear from the slave stage.

Another useful logic element that can be built up from an SR flip-flop is the ferroelectric non-volatile D-type flip-flop. The D-type (or simply "D") flip-flop can also be constructed using transmission gates. This section discusses the methodologies used to create non-volatile D flip-flops from both basic volatile D flip-flop designs.

Figure 26:
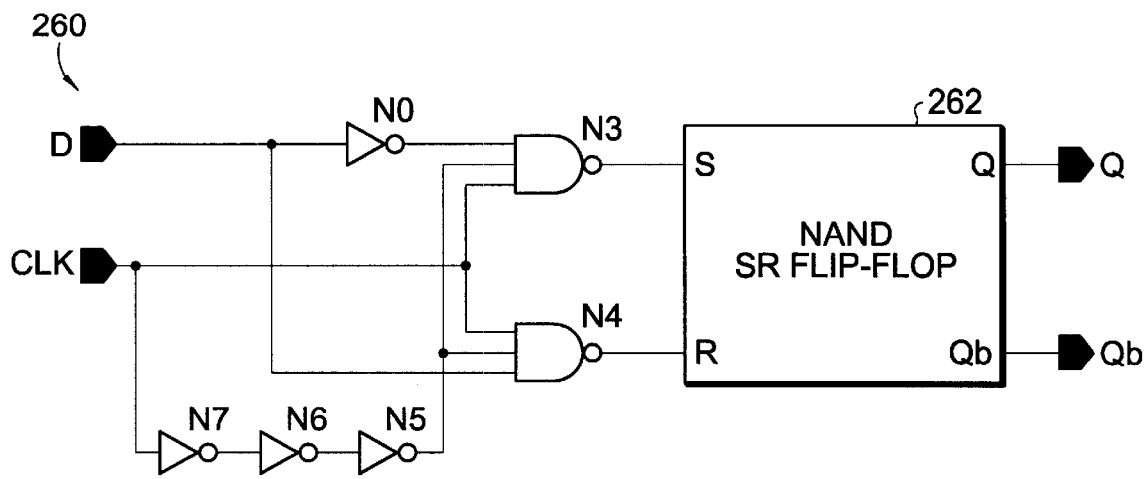
FIG. 26 shows one example of a D-type flip-flop created from an SR flip-flop and additional logic circuitry.

A D flip-flop can be created by building upon an SR flip-flop. On example from this found in many circuit textbooks is flip-flop 260 shown in FIG. 26. This D flip-flop works by keeping the S and R inputs of the SR flip-flop at '11' at all times except for a brief period after CLK transitions from low to high. During this rising edge, both CLK and CLKB are high for a brief period of time. During this transient state, the S input of the SR flip-flop will be equal to D and the R input will be equal to the complement of D. As a result, at the rising edge of CLK, the Q output is set to D, and Q and QB are always set to opposite data states. At all other times, the SR flip-flop retains the last latched state.

Figure 27:
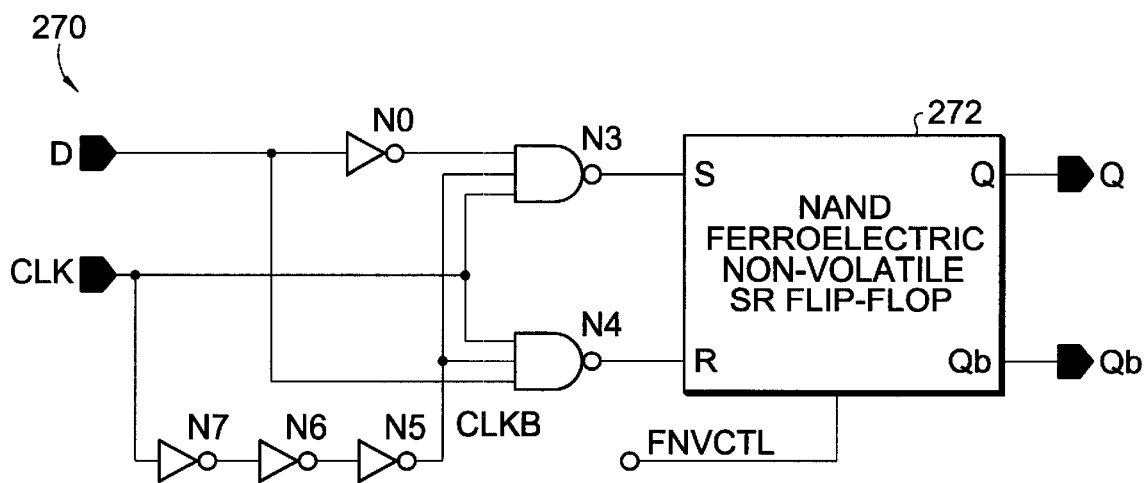
FIG. 27 shows a ferroelectric non-volatile SR flip-flop, such as the one in FIG. 12A, substituted for the volatile SR flip-flop into the non-volatile D flip-flop of FIG. 26.

A non-volatile SR flip-flop 272, such as the one shown in FIG. 12A, can be directly substituted for the volatile SR flip-flop as shown by the non-volatile D flip-flop 270 shown in FIG. 27. Once again, the timing from FIGS. 22 and 23 can be used for power-up and power-down. During power-up, CLK is forced low to allow the non-volatile SR flip-flop to complete precharge and sensing.

Figure 28:
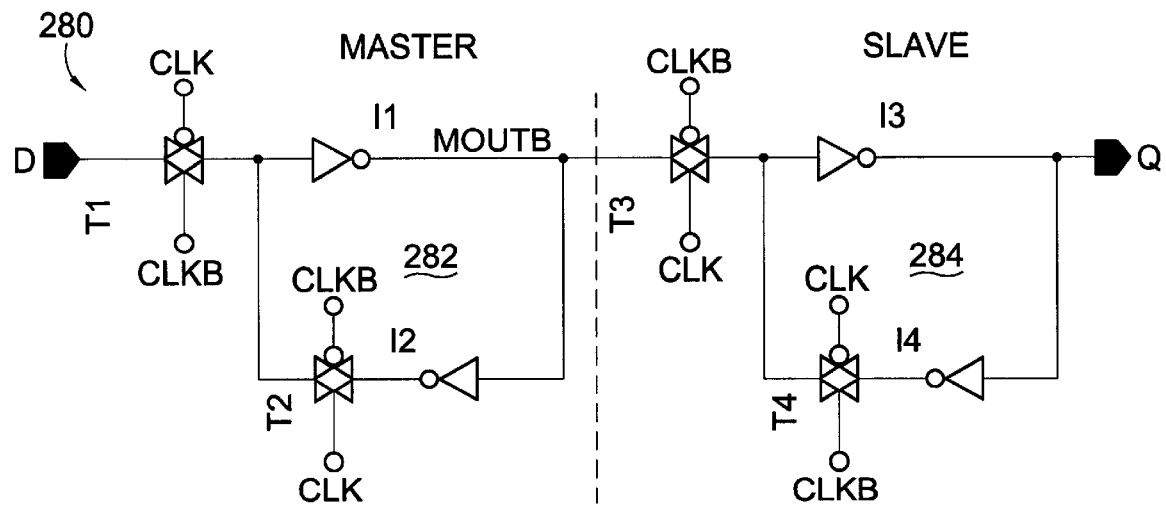
FIG. 28 shows a volatile transmission gate based D flip-flop including two sets of cross-coupled inverter pairs.

A D flip-flop can also be implemented using a master-slave approach with inverters and transmission gates. This type of flip-flop can be modified to create a non-volatile D flip-flop much in the same way the SR flip-flop was made non-volatile. A volatile transmission gate based D flip-flop 280 is shown in FIG. 28. When the CLK signal is low, the D input is loaded into the master stage 282, and the previously latched data is held in the slave stage 284. When the CLK signal rises, the data loaded into the master 282 is transferred to the slave 284, and the D input is isolated from the master. When the CLK signal is high, the data loaded into the master 282 is latched and directly drives the slave stage 284. So, only the data present at the D input at the rising edge of CLK is passed through to the output.

Two sets of cross-coupled inverter pairs are shown in FIG. 28. The first pair, I1 and I2 resides in the master section 282, and the second pair I3 and I4, resides in the slave section 284. Either of these cross-coupled inverter pairs can be adapted to serve as the sense amplifier for a ferroelectric non-volatile D flip-flop. Both possible non-volatile adaptations are discussed below.

Figure 29A:
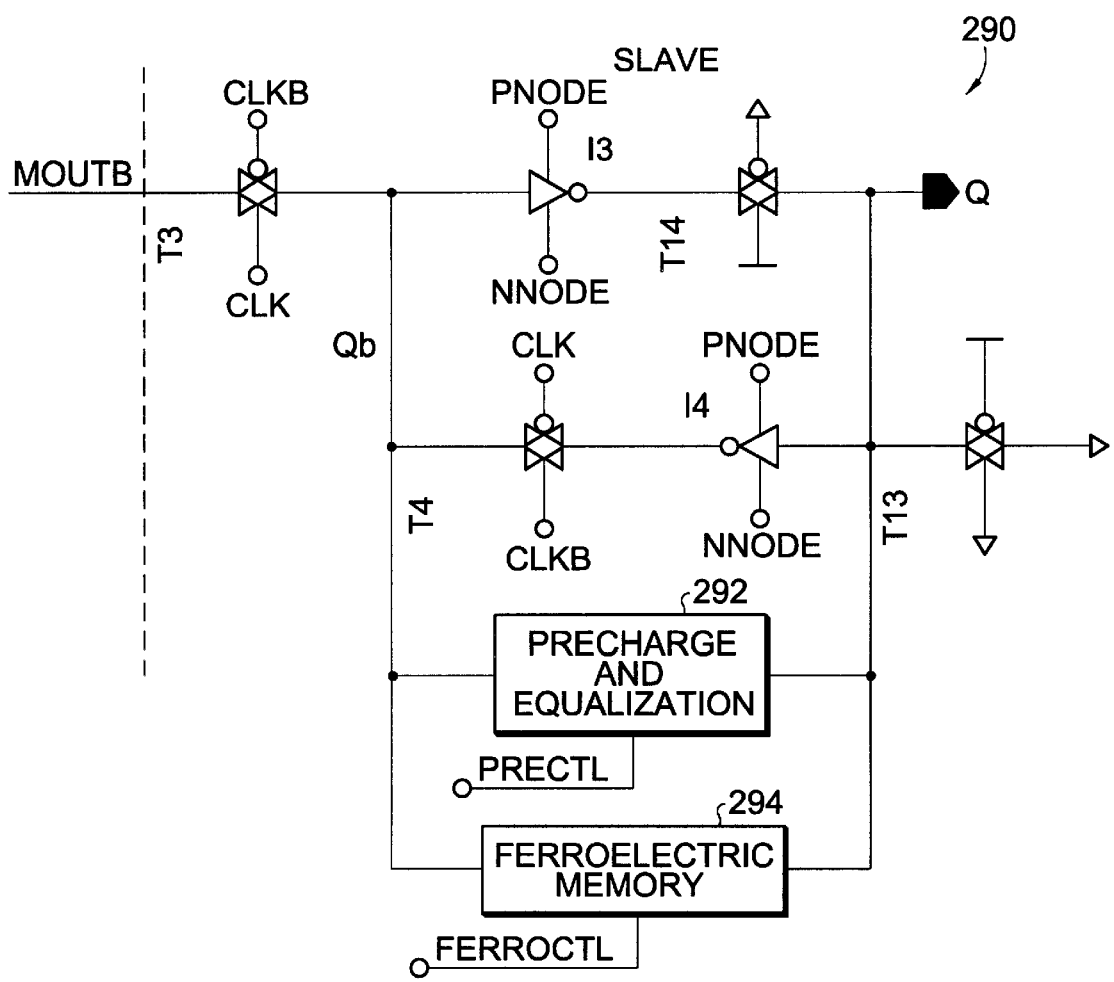
FIGS. 29A and 29B show modified slave stages of the transmission gate based D flip-flop of FIG. 28 to make the flip-flop non-volatile.

FIG. 29A shows how a slave stage 290 of the transmission gate based D flip-flop can be modified to make the flip-flop non-volatile. Inverters I3 and I4 are modified to provide controlled supplies for the sense amplifier. Two dummy transmission gates T13 and T14 are added in order to achieve the best possible resistance and capacitance matching for the sense amplifier. Transmission gate T14 is added in series with inverter I3 in the same way that transmission gate T4 is in series with inverter I4 to maintain resistive balance. Transmission gate T14 is kept on at all times by the transmission gate connections. Transmission gate T13 is added as a dummy load to the Q output to mirror the load that T3 has on the QB output. To ensure the best possible sense amplifier balance, the gate load of the next stage on the Q output should also be added to the QB output. As no load is shown on the Q output in FIG. 29A, no load is shown on the QB output.

Figure 29B:
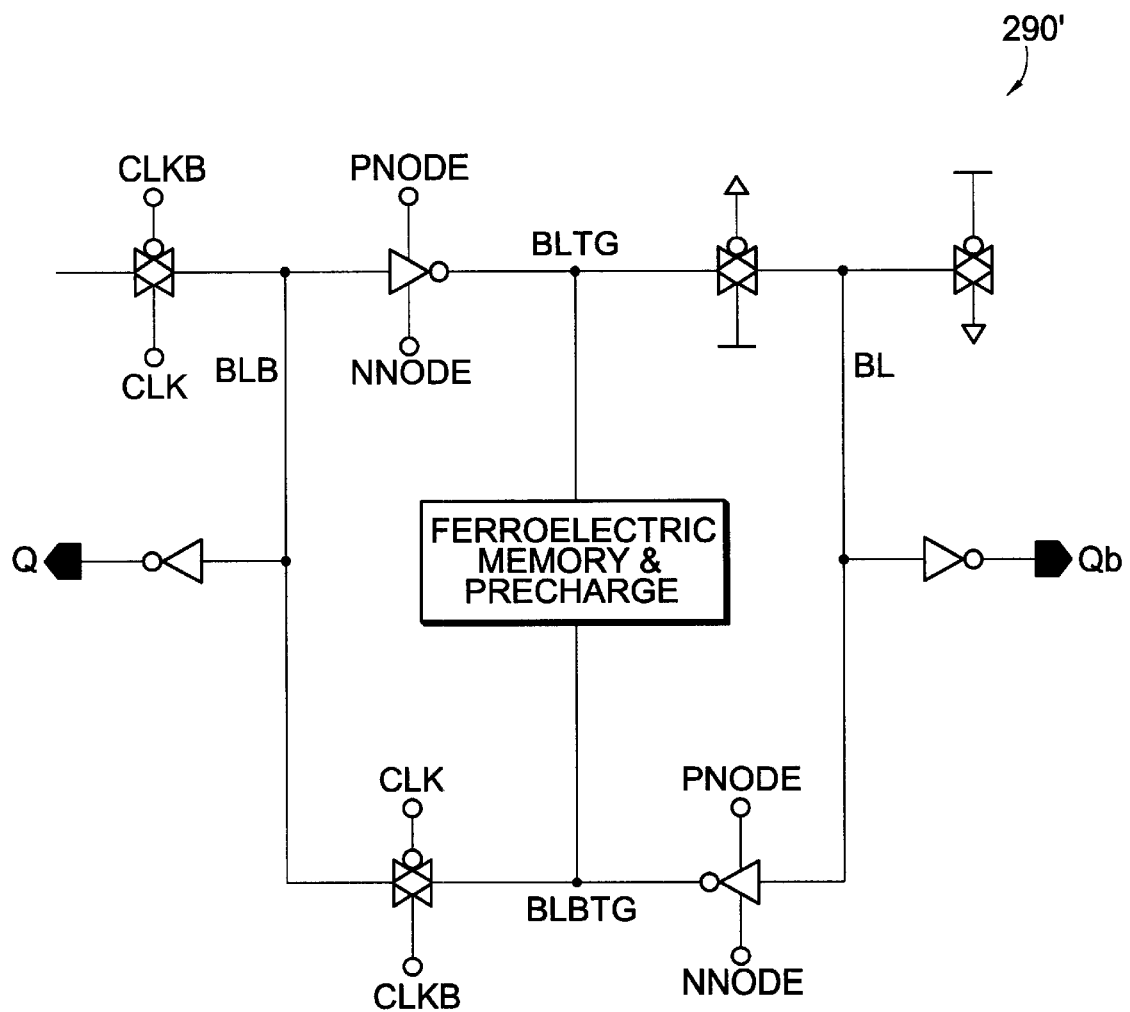

FIG. 29B shows an alternative slave stage in which the ferroelectric memory and precharge circuits are coupled between the BLTG and BLBTG nodes.

With the establishment of a balanced and controlled sense amplifier, the ferroelectric non-volatile memory and control signals can be added. The "Precharge and Equalization" block 292 is not required, but it provides operation that is consistent with existing ferroelectric memory practice. Suitable "Ferroelectric Memory" blocks were previously presented in the non-volatile SR flip-flop discussion and are discussed in greater detail later.

Figure 30A:
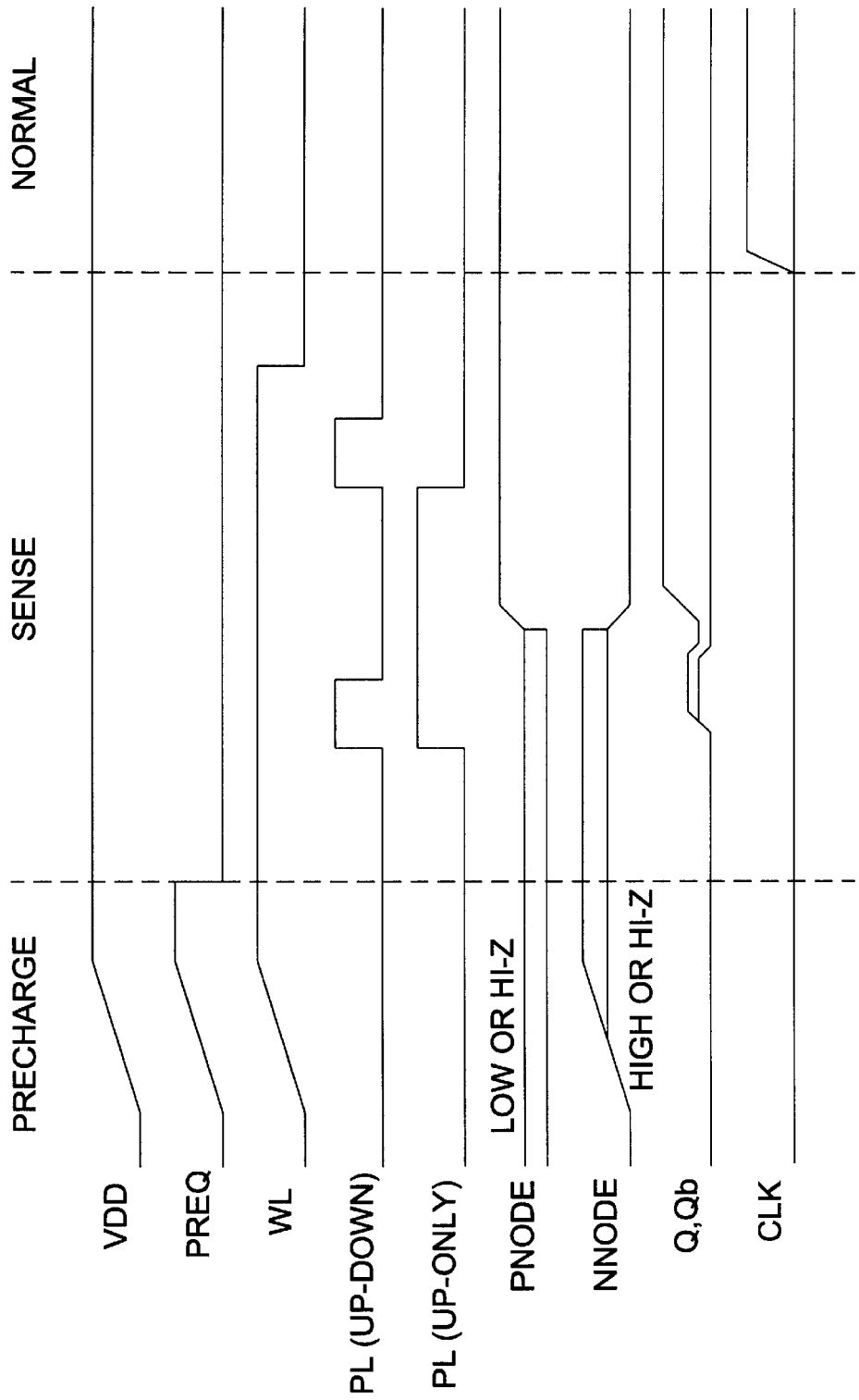
FIGS. 30A and 30B show possible power-up timing sequences corresponding to the non-volatile D flip-flop using the non-volatile slave stages shown in FIGS. 29A and 29B.

FIG. 30A shows one possible power-up timing sequence for the non-volatile D flip-flop 280 using the non-volatile slave stage 290 shown in FIG. 29A. The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines, Q and QB. During precharge, WL is also held high and WLB forced low to precharge the internal ferroelectric memory nodes. Control logic forces the CLK input low during precharge, which turns off transmission gate T3, thus disconnecting the slave stage from the master. With CLK low and CLKB high, transmission gate T4 is on, thereby enabling the sense amplifier feedback. During precharge and sensing, transmission gates T4 and T14 effectively behave as resistors. Finally, PNODE is either held low or tri-stated and NNODE is either held high or tri-stated during precharge.

The sensing sequence begins with the falling of the PREQ signal, which floats the bit lines Q and QB. Next, the PL pulsing interrogation begins. Both "up-only" and "up-down" plate pulsing are shown in FIG. 30A, but the bit line response is shown for only "up-down" plate pulsing. After plate pulsing, a voltage differential based on the polarization of the ferroelectric capacitors exists on the bit lines and is ready for sensing. The sense amplifier in FIG. 29A consisting of I3, T14, I4 and T4 is then activated by driving PNODE high and by driving NNODE low. The relative timing of PNODE and NNODE can be optimized for the required sense amplifier sensitivity and speed.

Once the correct logic state is sensed and Q and QB achieve full-rail separation, the ferroelectric storage capacitors are restored due to the destructive nature of the read. The restore is accomplished by forcing the PL signal both high and low for some minimum restore time. The mode of operation shown in the timing diagram 300 of FIG. 30A involves only accessing the ferroelectric capacitors during read and write operations and disconnecting the ferroelectric storage capacitors from the flip-flop at all other times. The storage and load capacitors are isolated from the flip-flop by bringing WL low. At this point, the state of the slave stage, and thus the D flip-flop, has been returned to the value that was stored in the ferroelectric non-volatile memory, and the low CLK maintains the slave stage in "data hold" mode.

Finally, the control logic relinquishes control of the CLK input and enables its normal connection. The flip-flop is now in normal operation mode and will behave like a standard D flip-flop.

Figure 30B:
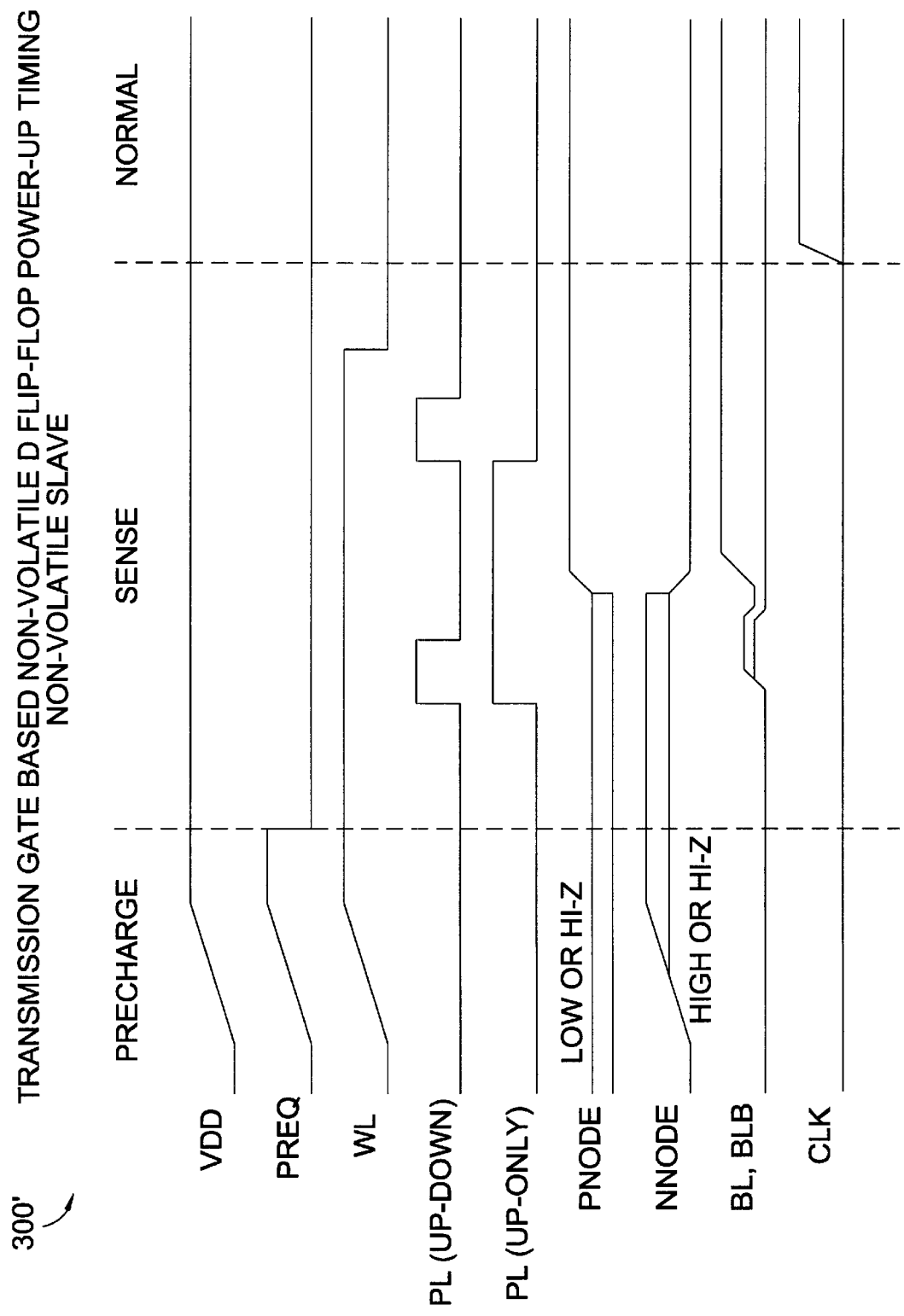

The timing diagram of FIG. 30B is similar to FIG. 30A and corresponds to the slave stage shown in FIG. 29B.

Figure 31A:
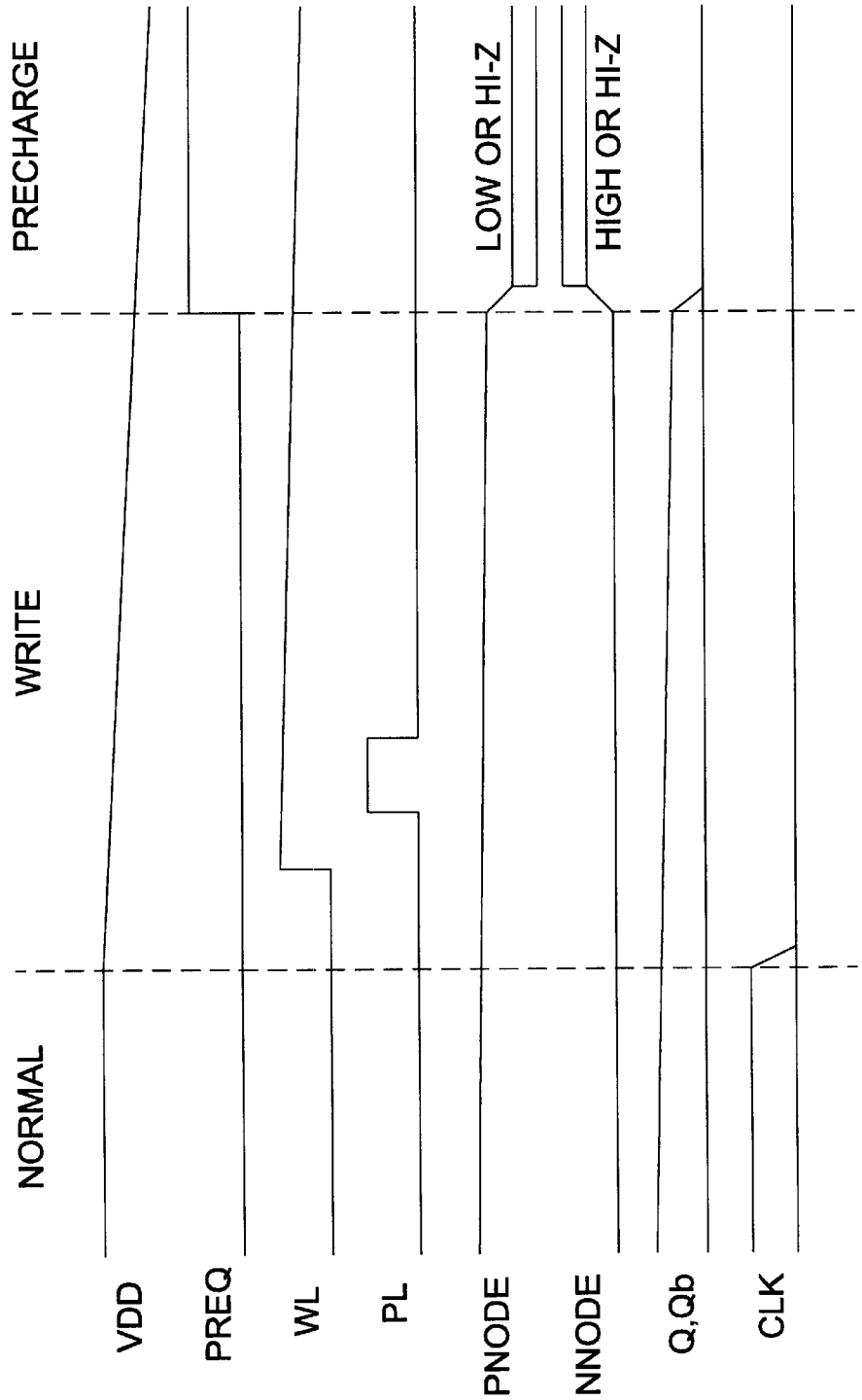
FIGS. 31A and 31B depict possible write timing sequences corresponding to the transmission gate based non-volatile D flip-flop that employs the non-volatile slave stages shown in FIGS. 29A and 29B.

FIG. 31A depicts one possible write timing sequence 310 for the transmission gate based non-volatile D flip-flop 280 that employs a non-volatile slave stage 290. In FIG. 31A, the write to the ferroelectric memory occurs at power-down. As soon as control circuitry detects a falling power supply, the CLK signal is driven low, which puts the slave stage 290 in a "data hold" mode. The CLK signal does not need to go low for a write, but it may allow logic sharing between read and write operations. Also, always accessing the ferroelectric memory in the same mode simplifies device sizing. Next, WL rises and WLB falls to connect the bit lines to the ferroelectric capacitors. The PL is then forced high and low to polarize both capacitors. When PL is high, the 'zero' capacitor is polarized and when PL is low, the 'one' capacitor is polarized. The order of capacitor polarization is not critical. After the minimum polarization time on each capacitor has been satisfied, the precharge cycle can begin. In FIG. 31A, the precharge cycle does not begin immediately. Rather control circuitry detects some minimum voltage below which precharge occurs.

Figure 31B:
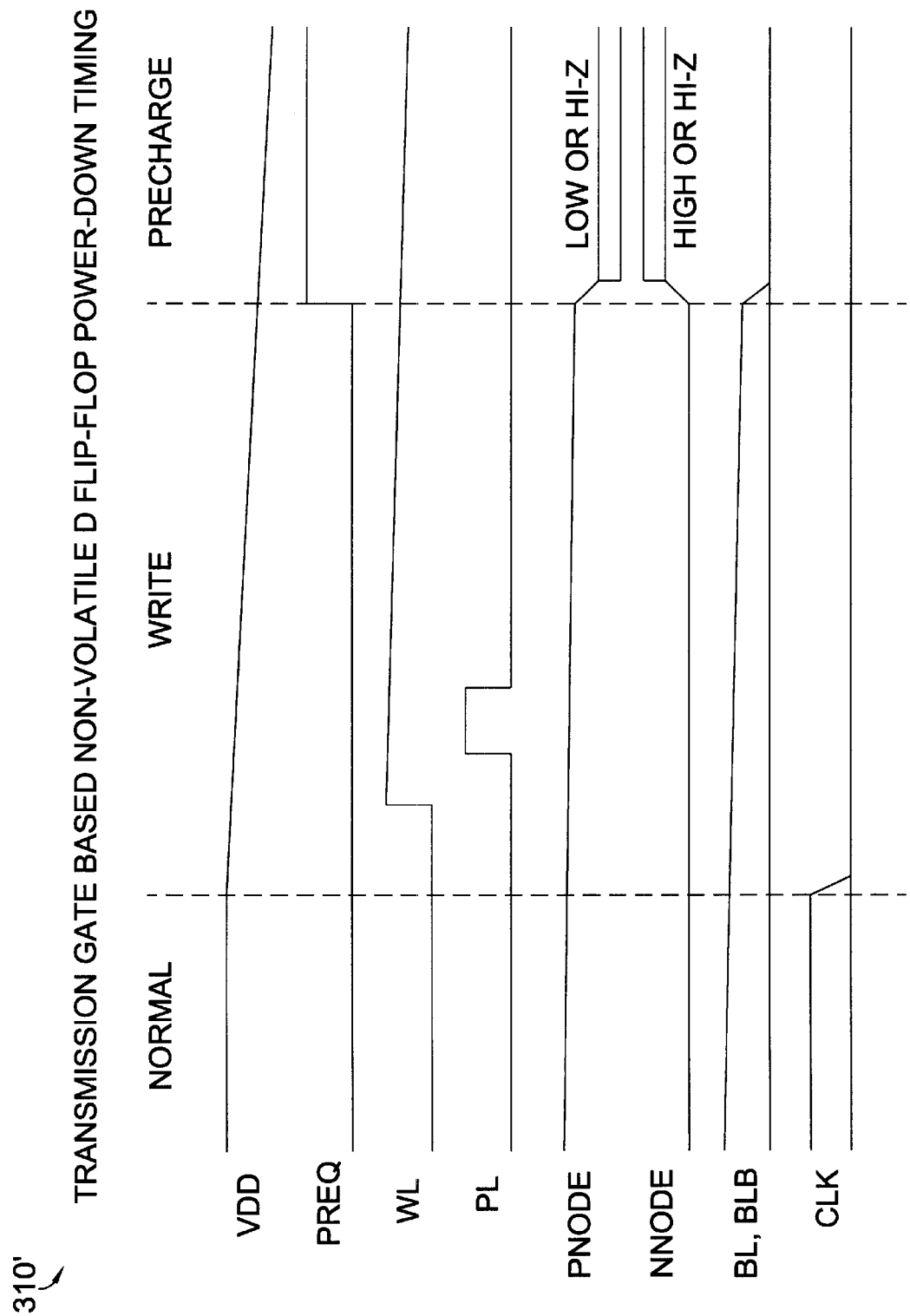

The timing diagram of FIG. 31B is similar to FIG. 31A and corresponds to the slave stage shown in FIG. 29B.

FIGS. 30A, 30B, 31A and 31B show timing that fits well in a design that reads the non-volatile memory on power-up and writes the non-volatile memory on power down. Other approaches could also be used, as were originally discussed in the NAND based SR flip-flop section.

Figure 32:
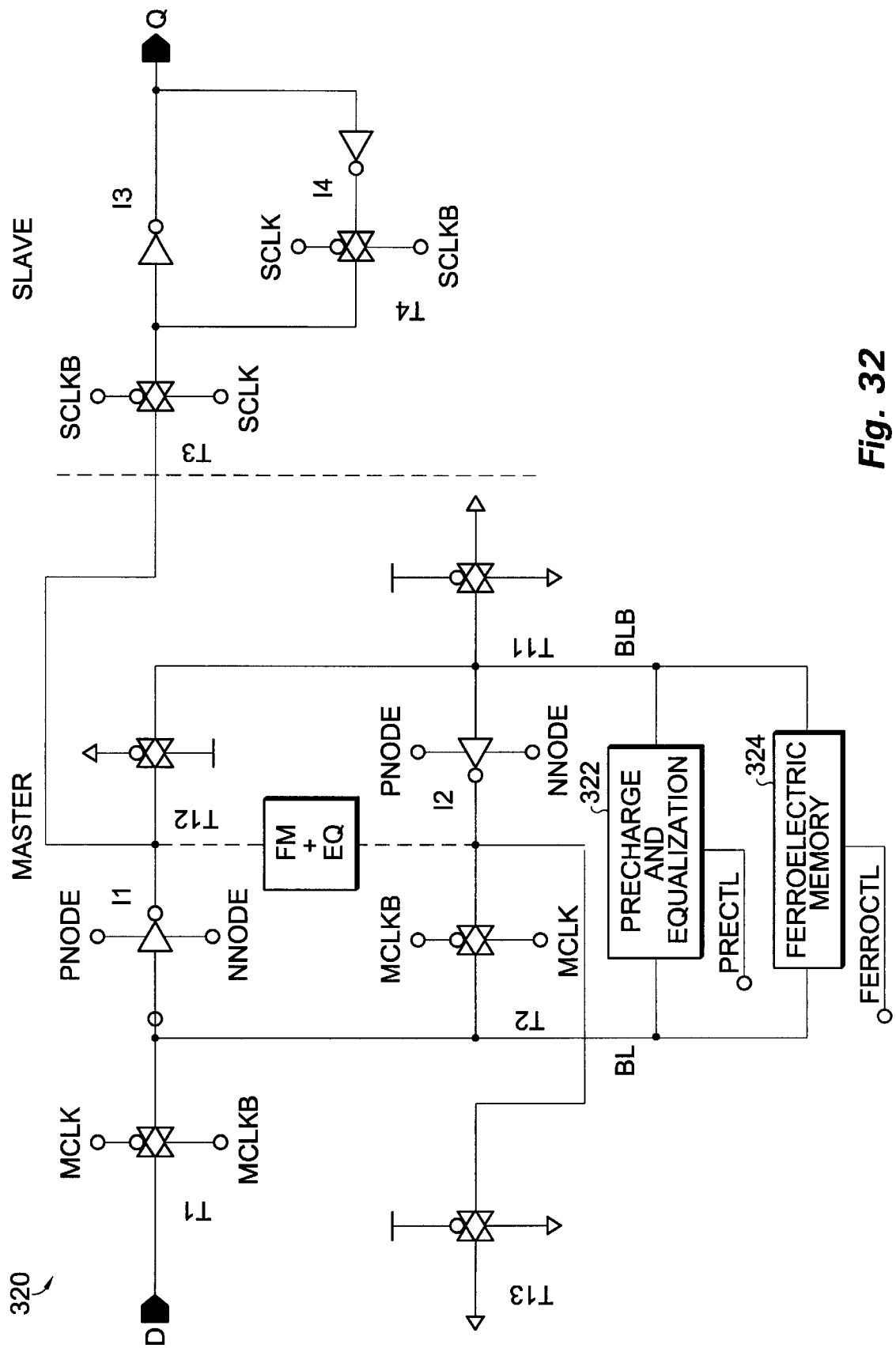
FIG. 32 shows a non-volatile D-type flip-flop including a modified ferroelectric non-volatile master stage.

As stated above, the master stage of the transmission gate based D flip-flop can also be made non-volatile. FIG. 32 depicts a master stage 320 modified for ferroelectric non-volatility. The sense-amplifier now consists of inverter I1, transmission gate T12, inverter I2 and transmission gate T2. Transmission gate T12 is added in series with inverter I1 to match the effective resistance of transmission gate T2, which is in series with inverter I2. The output of the master stage is taken directly from inverter I1 to minimize the resistance of the data propagation path, and thereby minimize the propagation delay. To guarantee symmetrical capacitive loading, transmission gate T13 is added to the output of inverter I2, which corresponds to the load transmission gate T3 places on inverter I1. Also, transmission gate T11 is added to the gate of inverter I2 to match the load that transmission gate T1 has on the gate of inverter I1.

Figure 33:
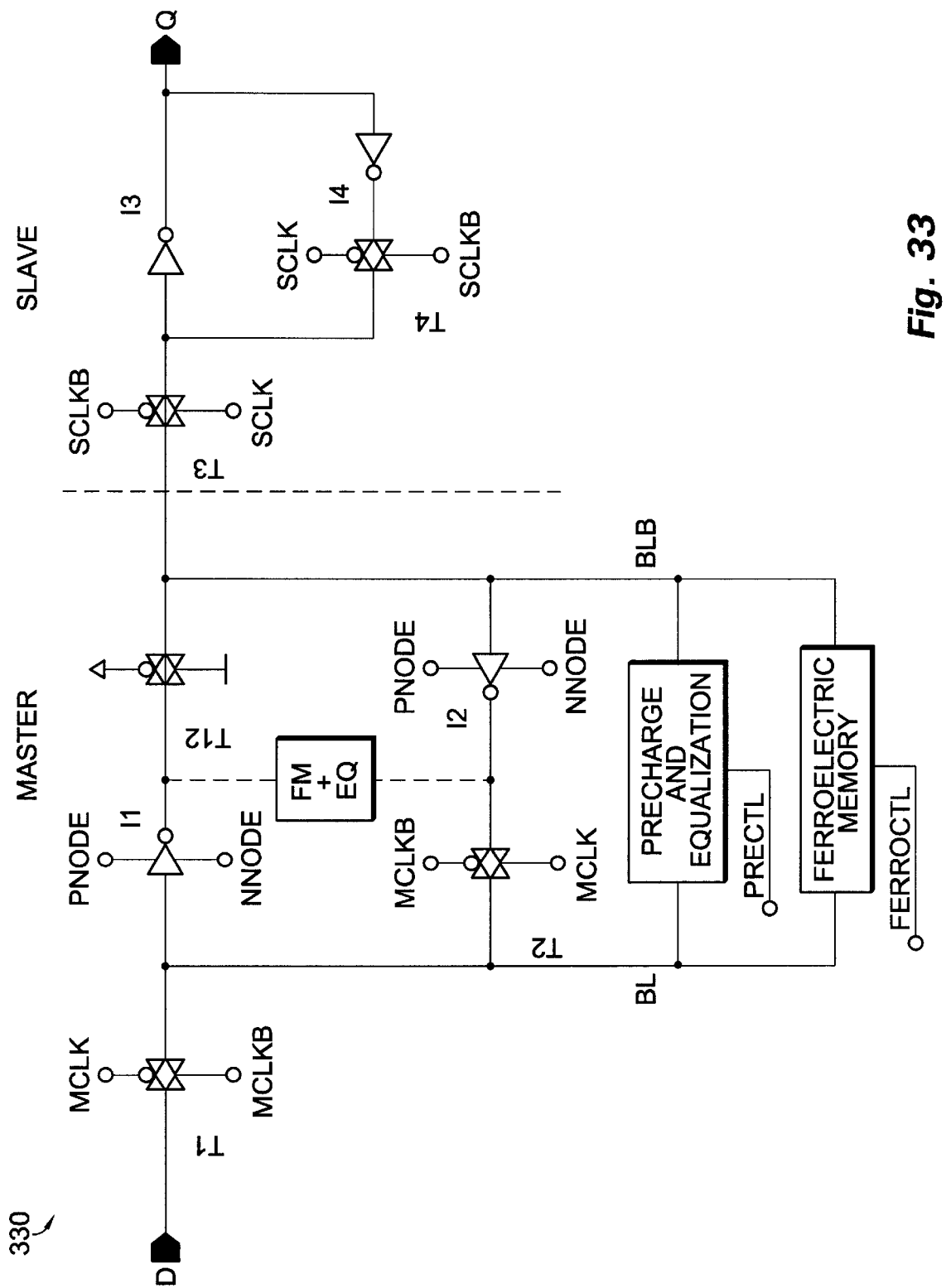
FIG. 33 shows an alternative non-volatile D-type flip-flop including a modified ferroelectric non-volatile master stage.

While the configuration shown in FIG. 32 helps to minimize latch propagation delay, three new transmission gates have been introduced. Another possible configuration of a non-volatile master stage 330 requiring only one extra transmission gate is shown in FIG. 33. Here, only transmission gate T12 is added for resistive balance. Transmission gates T3 and T1 can then be properly sized and laid out to provide symmetrical load capacitance.

In both FIGS. 32 and 33, the clock signal in the master stage is ideally held high during sensing to prevent the D input from forcing the state of the master stage. The clock signal may also be high in the slave stage during sensing, but transmission gate T3 is then on, and the added gate load of inverter I3 and the source/drain load of transmission gate T4 results in a capacitive imbalance. Therefore, the clock signals are separated into a master clock, MCLK, and a slave clock, SCLK.

Figure 34:
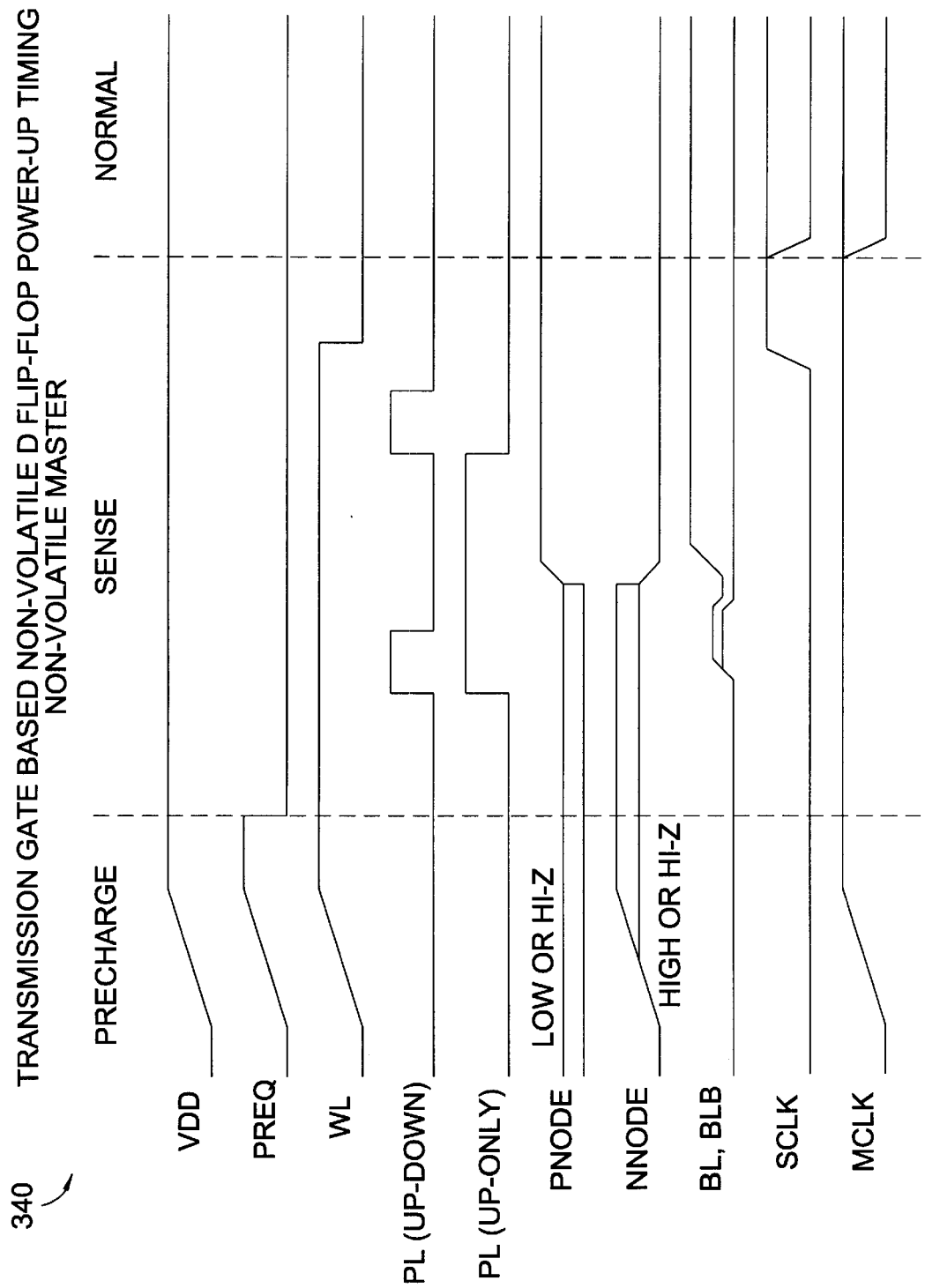
FIG. 34 shows one possible power-up timing sequence for the non-volatile D flip-flop employing a non-volatile master stage such as the ones shown in FIGS. 32 and 33.

FIG. 34 shows one possible power-up timing sequence 340 for the non-volatile D flip-flop employing a non-volatile master stage 320 and 330 as shown in FIGS. 32 and FIG. 33. The power-up sequence can be divided into three basic operations: precharge, sensing and normal operation. The precharge time consists of the time before the power supply, VDD, has reached a sufficient voltage to operate the ferroelectric memory reliably. During this time, the control logic forces PREQ high to precharge and equalize the bit lines in the master, BL and BLB. During precharge, WL is also held high and WLB forced low to precharge the internal ferroelectric memory nodes. Control logic forces the MCLK input high and the SCLK input low during precharge, which turns off transmission gates T1 and T3, thus disconnecting the D input and the slave stage from the master. With MCLK low and MCLKB high, T2 is on, thereby enabling the sense amplifier feedback. During precharge and sensing, transmission gates T2 and T12 effectively behave as resistors. Finally, PNODE is either held low or tri-stated and NNODE is either held high or tri-stated during precharge.

The sensing sequence begins with the falling of the PREQ signal, which floats the BL and BLB. Next, the PL pulsing interrogation begins. Both "up-only" and "up-down" plate pulsing are shown in FIG. 34, but the bit line response is shown for only "up-down" plate pulsing. After plate pulsing, a voltage differential based on the polarization of the ferroelectric capacitors exists on the bit lines and is ready for sensing. The sense amplifier in FIGS. 32 and 33 consisting of inverter I1, transmission gate T12, inverter I2 and transmission gate T2 is then activated by driving PNODE high and by driving NNODE low. The relative timing of PNODE and NNODE can be optimized for the required sense amplifier sensitivity and speed.

Once the correct logic state is sensed and BL and BLB achieve full-rail separation, the ferroelectric storage capacitors must be restored due to the destructive nature of the read. The restore is accomplished by forcing the PL signal both high and low for some minimum restore time. Some time after the data in the non-volatile master has been restored, control logic forces the SCLK input high to load the restored data into the slave stage so it is available at the output. The mode of operation shown in FIG. 34 involves only accessing the ferroelectric capacitors during read and write operations and disconnecting the ferroelectric storage capacitors from the flip-flop at all other times. The storage and load capacitors are isolated from the flip-flop by bringing WL low. At this point, the data stored in the master has been restored and passed into the slave.

Finally, the control logic relinquishes control of the MCLK and SCLK, making them both equal to the normal CLK input. The flip-flop is now in normal operation mode and behaves like a standard D flip-flop.

While the master stage can be used to hold the data state in the absence of power, getting the correct flip-flop data stored in the non-volatile memory is a challenge if the master stage is the non-volatile stage. This challenge arises from the way the master-slave transmission gate based D flip-flop works. When the clock is low, the D input is loaded into the master. Then, when the clock goes high, the data is propagated through to the slave. So, if a write to the ferroelectric memory occurs when the clock is low, it is the current data at the D input that is stored up in the ferroelectric memory, and not the data that has been latched and is available at the output of the slave.

This issue can be addressed in a variety of ways, two of which are described below. In one possible method, a requirement can be placed upon the system that writes only occur to the non-volatile memory when the clock is high. As this approach is impractical for nearly all practical applications, it will not be discussed further.

The second method involves controlling the clocks and sense amplifier supplies in such a way as to load the data from the slave into the master prior to writing to the ferroelectric memory. For this approach to work, the control signals of transmission gates T3 and T4 in FIGS. 32 and 33 need to be separated and given additional control logic such that both T3 and T4 can be turned on at the same time. In this second approach, a write begins by control logic turning T4 on and T3 off to latch the slave data. Next, control logic turns T1 off and sets PNODE and NNODE to their inactive levels. Then, T3 is turned on with T4 still on to establish the desired voltage at BLB. Then, PNODE and NNODE are returned to their active levels to complete the transfer of data from the slave back to the master. Finally, the data in the master is transferred into the ferroelectric memory.

Again, this second approach to write the correct data into a non-volatile master stage introduces an undesired level of control complexity. Therefore, the previously described non-volatile D flip-flop employing a non-volatile slave is the preferred embodiment of the non-volatile transmission gate based D flip-flop.

Figure 35:
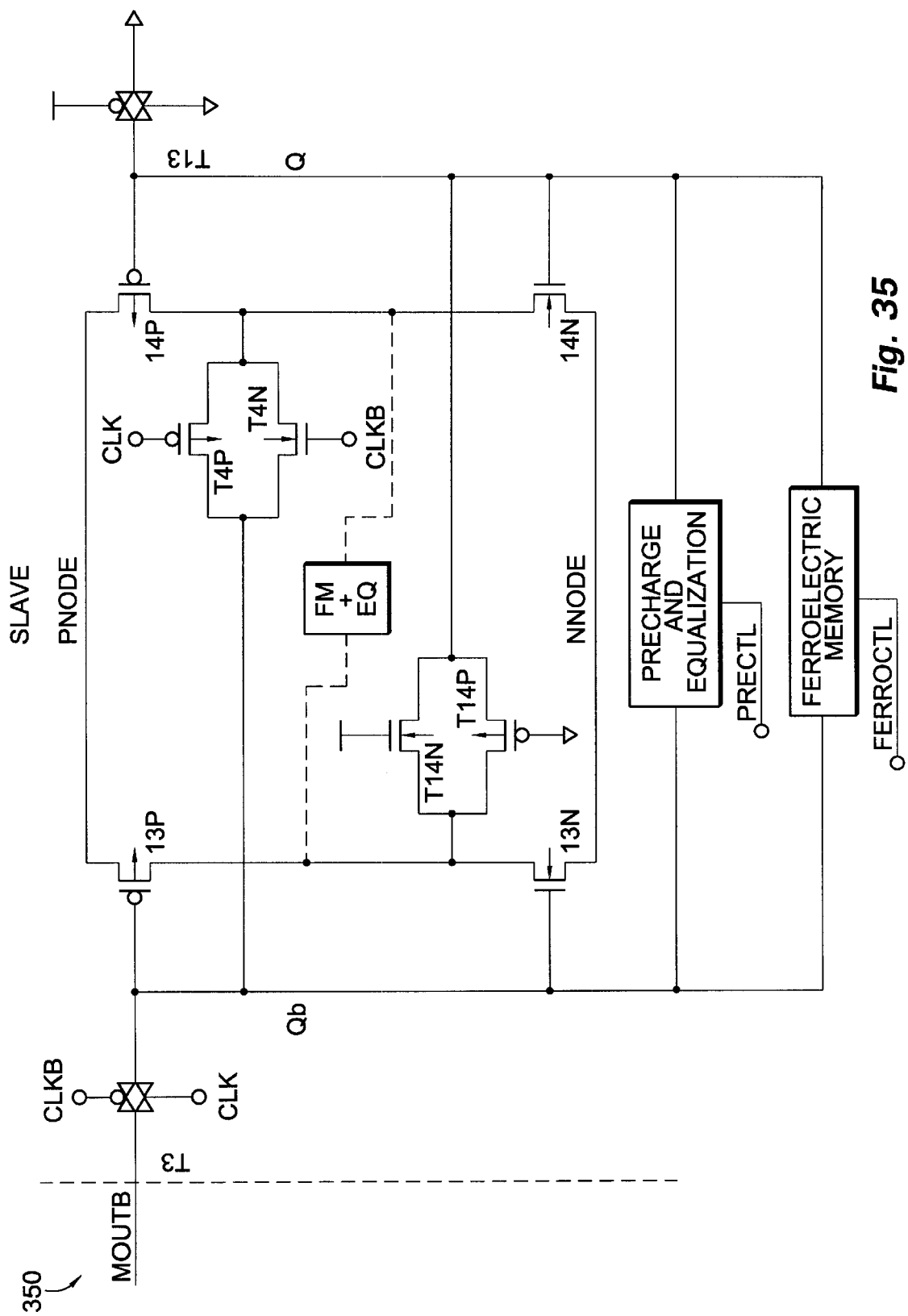
FIG. 35 shows the transistor level implementation the slave stage of a non-volatile D-type flip-flop including the transistor level implementation of the sense-amplifier powered by the two controlled power supply node PNODE and NNODE.

FIG. 35 shows the transistor level implementation of the sense-amplifier in the non-volatile D flip-flop introduced in FIG. 29. Only the slave stage 350 is shown. As with all the non-volatile logic elements discussed here, the key to reliable non-volatile performance is to maintain the maximum degree of capacitive and resistive balance between the bit lines. FIG. 29 shows the intended balance schematically, while FIG. 35 suggests a physical layout to provide the desired balance.

Figures 36, 37:
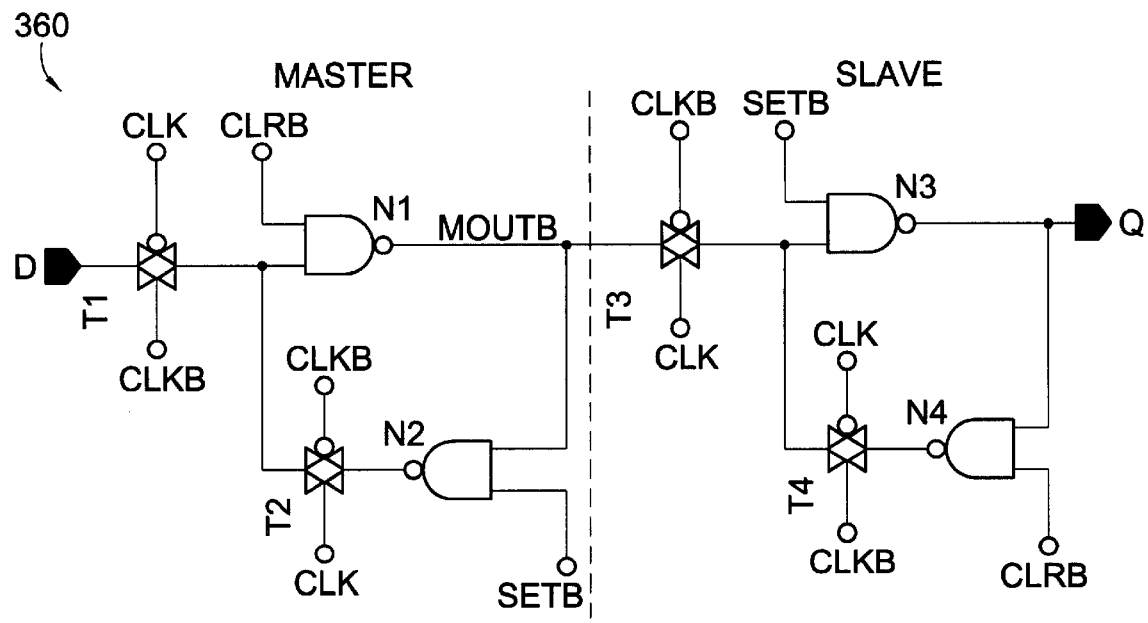
FIG. 36 shows another implementation of a D-type flip-flop including two-input NAND gates for providing a SET and CLR function.
FIG. 37 is the truth table corresponding to the D-type flip-flop of FIG. 36.
Figure 38A:
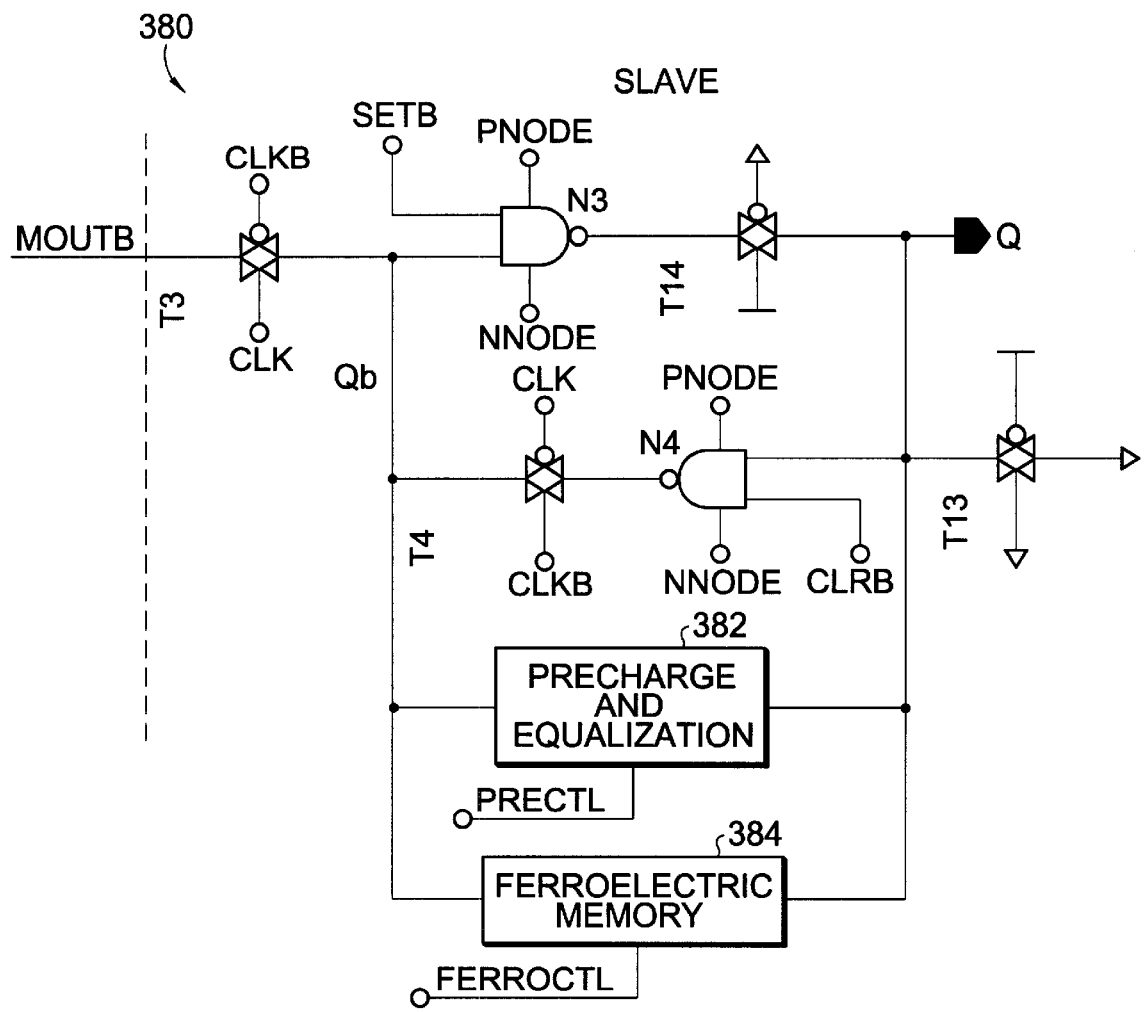
FIGS. 38A and 38B show the slave stage of FIG. 35 modified to include a controlled ferroelectric memory circuit to achieve non-volatility, as well as precharge and equalization circuits.
Figure 38B:
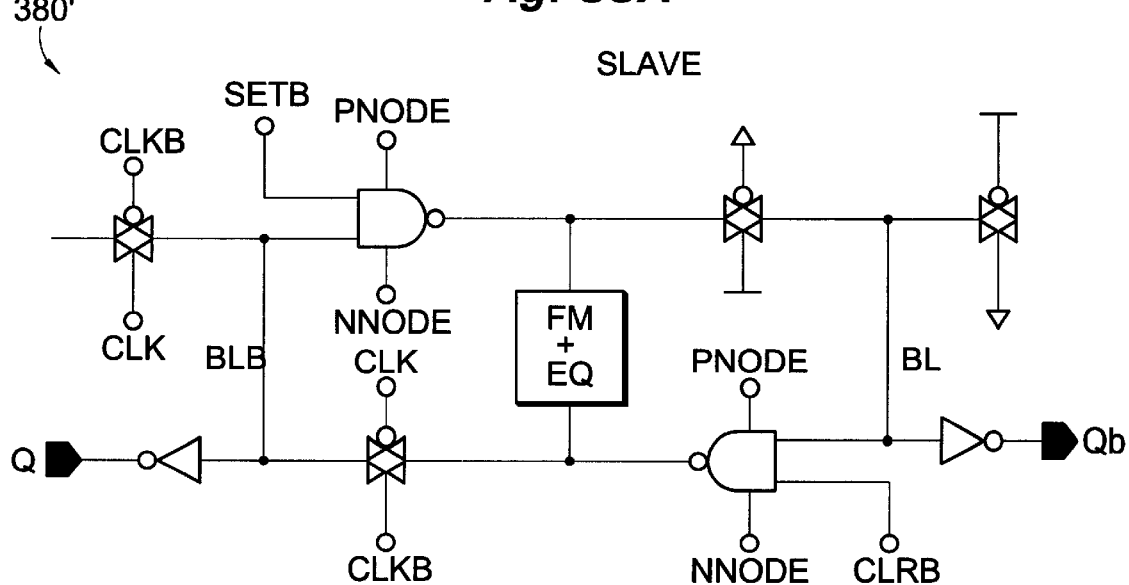

For many applications, asynchronous reset (clear) and preset (set) functionality in a D flip-flop may be desired. FIG. 36 shows one way this functionality is typically achieved in D flip-flop 360. Here, the inverters in the D flip-flop are replaced with NAND gates N1 and N2 in the master stage and NAND gates N3 and N4 in the slave stage. The SETB and CLRB signals are the active low set and clear inputs. The corresponding logic truth table for flip-flop 360 is shown in FIG. 37. Having described the method for making previous flip-flops non-volatile, the slave stage 380 for the non-volatile D flip-flop with asynchronous set and clear shown in FIG. 38A should seem familiar. FIG. 38A shows the NAND gates N3 and N4 being supplied by the controlled supply levels PNODE and NNODE. The sense amplifier of FIG. 38A is expanded to the transistor level in FIG. 39. An alternative slave stage is shown in FIG. 38B.

Figure 39:
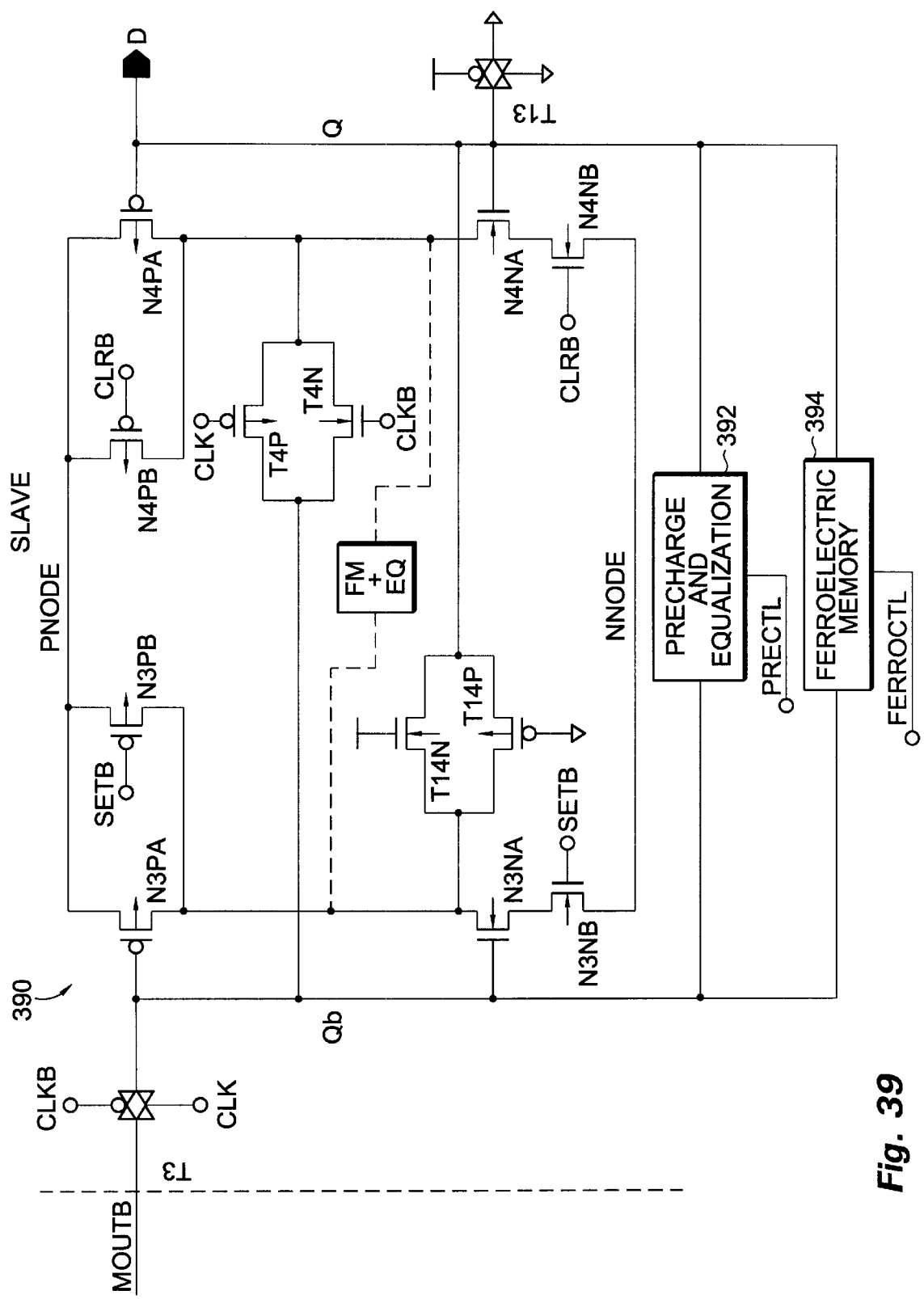
FIG. 39 shows the transistor-level implementation of the slave stage of FIG. 38, including a sense amplifier portion controlled via switchable power supplies PNODE and NNODE.

Examination of FIG. 39 reveals the sense amplifier to be very similar to the non-volatile SR flip-flop presented in FIG. 12B. Two primary differences exist between these schematics. In FIG. 39, the sources of transistors N3PB and N4PB are tied to PNODE, while in FIG. 12B, the sources of transistors N1NB and N2NB are tied to the global supply rail. Just as the text describing FIG. 12B indicated that the source connection of transistors N1NB and N2NB can alternately be made to PNODE, the sources of transistors N3PB and N4PB in FIG. 12B can also be connected to the global supply rail instead of PNODE. The second and more substantial difference between the figures is the presence of transmission gates in series with the sense amplifier feedback paths in FIG. 39. Transmission gate T4, consisting of transistors T4P and T4N is a necessary part of the transmission gate based master-slave D flip-flop. Transmission gate T14, on the other hand, is not necessary for the fundamental logic device, but it is added to ensure resistive and capacitive balance in the sense amplifier during read operations.

Figure 40:
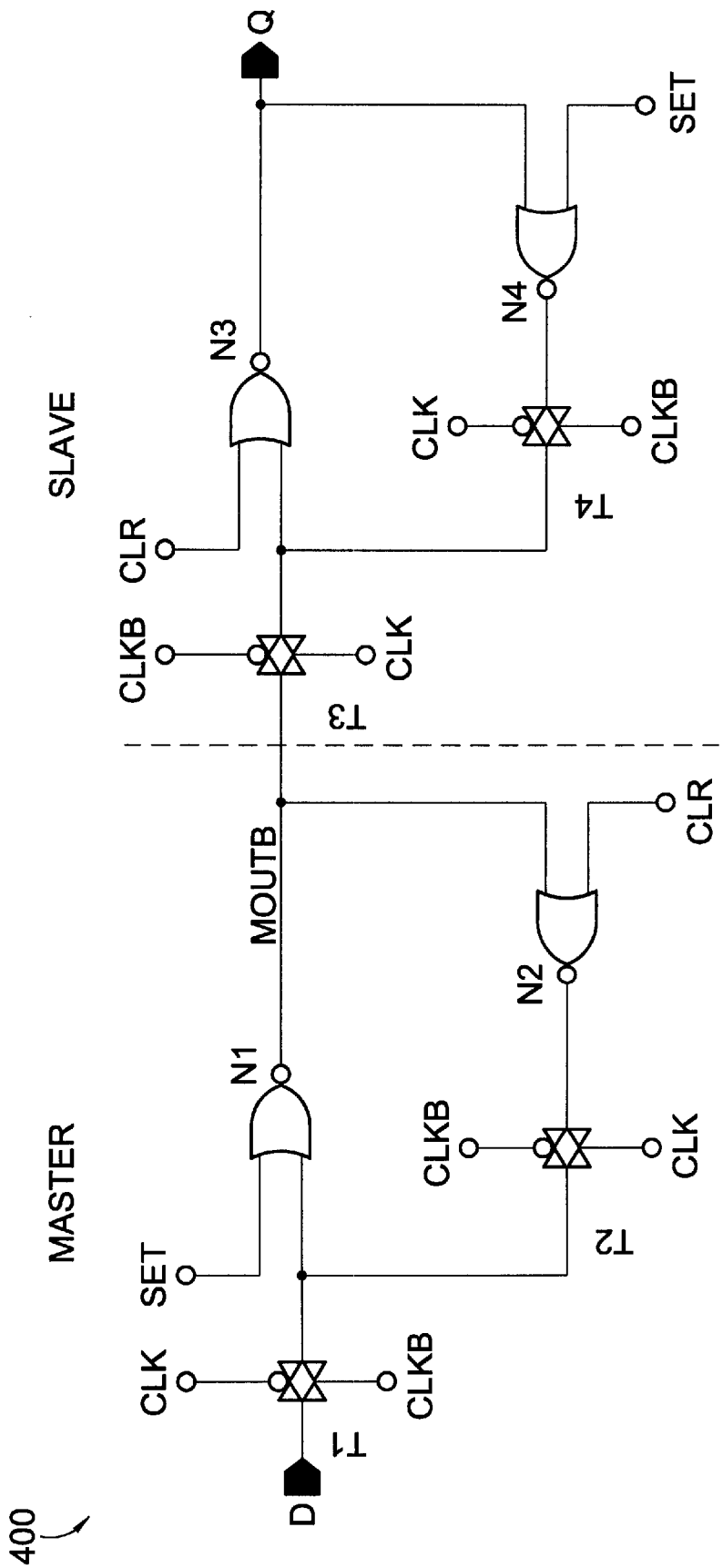
FIG. 40 shows a NOR-based D flip-flop with asynchronous set and clear functions.

For the sake of completeness, a NOR-based D flip-flop 400 with asynchronous set and clear is shown in FIG. 40. In FIG. 40, SET and CLR are active high signals. The non-volatile implementation proceeds as explained above with respect to the NAND-based D flip-flop 360 including the asynchronous set and clear functions.

Figure 41:
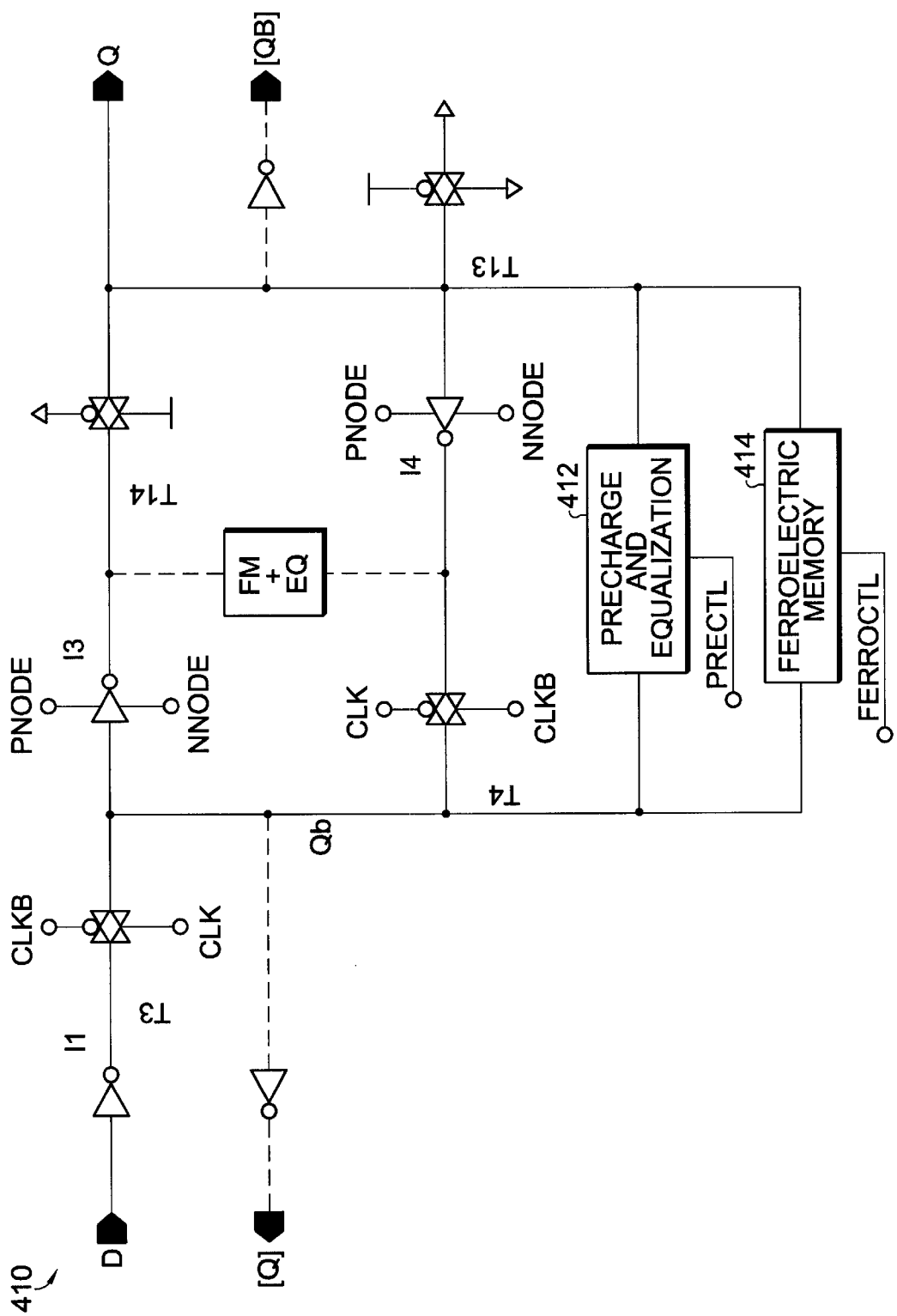
FIG. 41 shows another transmission gate based logic element generally referred to as a "level-sensitive latch" which is modified to present a non-volatile version according to the present invention.

Another useful transmission gate based logic element is the level-sensitive latch. A non-volatile version 410 of the latch is presented in FIG. 41. When the CLK signal is high, data from the D input passes directly through to the Q output. When CLK falls, the current state is latched into the cross-coupled inverters, and the D input is isolated. After the detailed description of the non-volatile slave transmission gate based D flip-flop, supra, the sense amplifier formed by I3, T14, I4 and T4 should be familiar. Because the data state is not latched unless CLK is low, it may be desirable for the non-volatile write logic to only write if CLK is low. Flip-flop 410 includes a "Precharge and Equalization" circuit block 412 and associated PRECTL bus, as well as a "Ferroelectric Memory" block 414 and associated FERROCTL bus.

Figure 42:
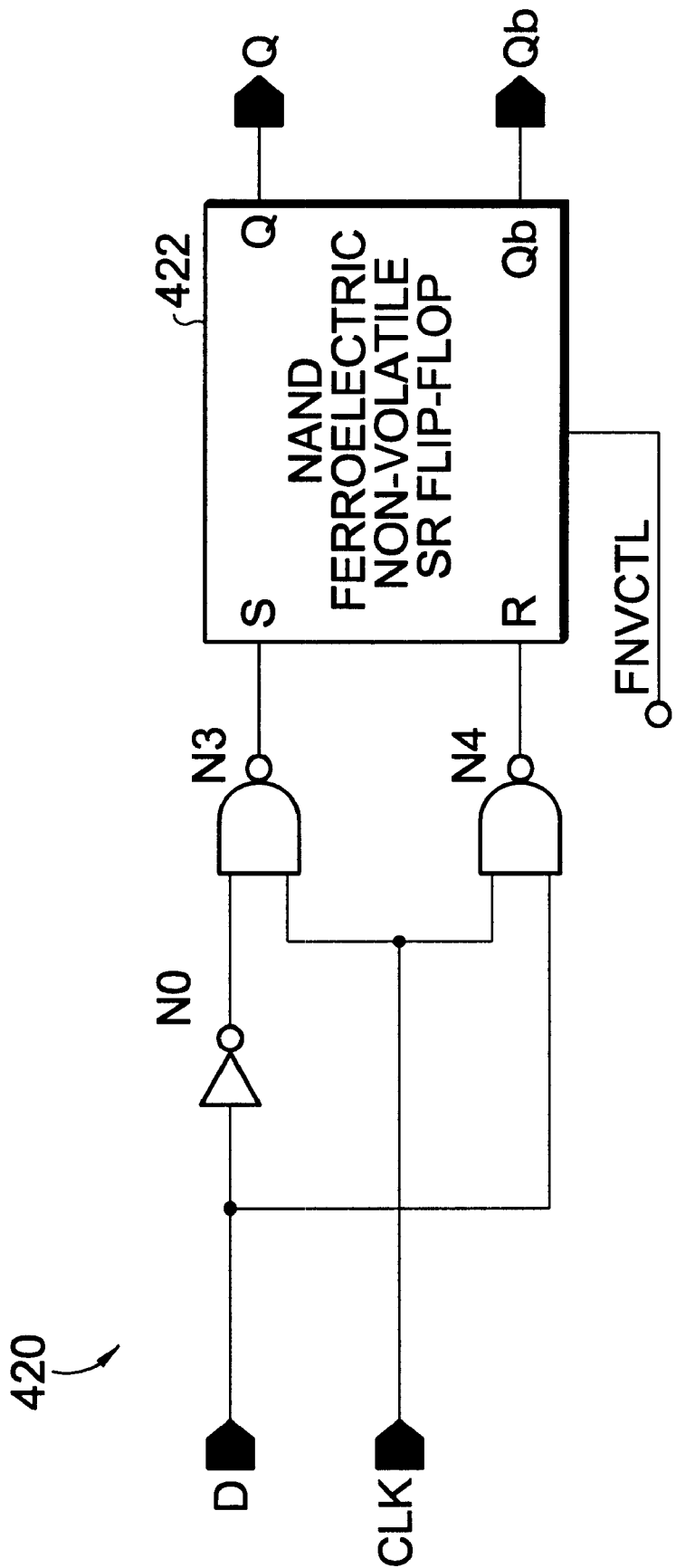
FIG. 42 shows an alternative non-volatile, level-sensitive latch implemented using a non-volatile NAND-based SR flip-flop.

The level-sensitive latch can also be implemented using an SR flip-flop. The non-volatile latch 420 based on a non-volatile SR flip-flop 422 is depicted in FIG. 42. Once again, the previous discussion of the non-volatile SR flip-flop serves to sufficiently explain the function of the non-volatile latch 420 shown in FIG. 42.

Figure 43:
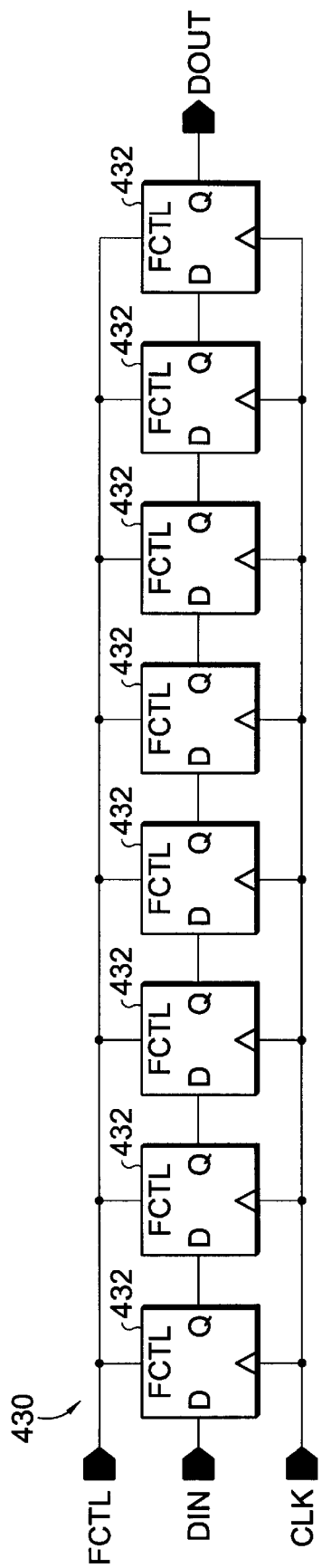
FIG. 43 shows an 8-bit non-volatile serial-in-serial-out shift register using a non-volatile D flip-flop, such as the ones presented in FIGS. 27 and 29.

Now that various non-volatile flip-flops have been described, their use in applications such as non-volatile logic systems can be demonstrated. FIG. 43 shows a series of interconnected non-volatile D flip-flops 432, such as the ones previously presented in FIGS. 27 and 29, used to create an 8-bit non-volatile serial-in-serial-out shift register 430. The Q output of one of the flip-flops 432 is coupled to the D input of the next flip-flop 432 in the series. The CLK and FCTL busses for each of the flip-flops 432 are coupled together to form two common busses, CLK and FCTL. The DIN input is the input to the first flip-flop 432 in the series and the DOUT output is the Q output of the last flip-flop 432 in the series.

Figure 44:
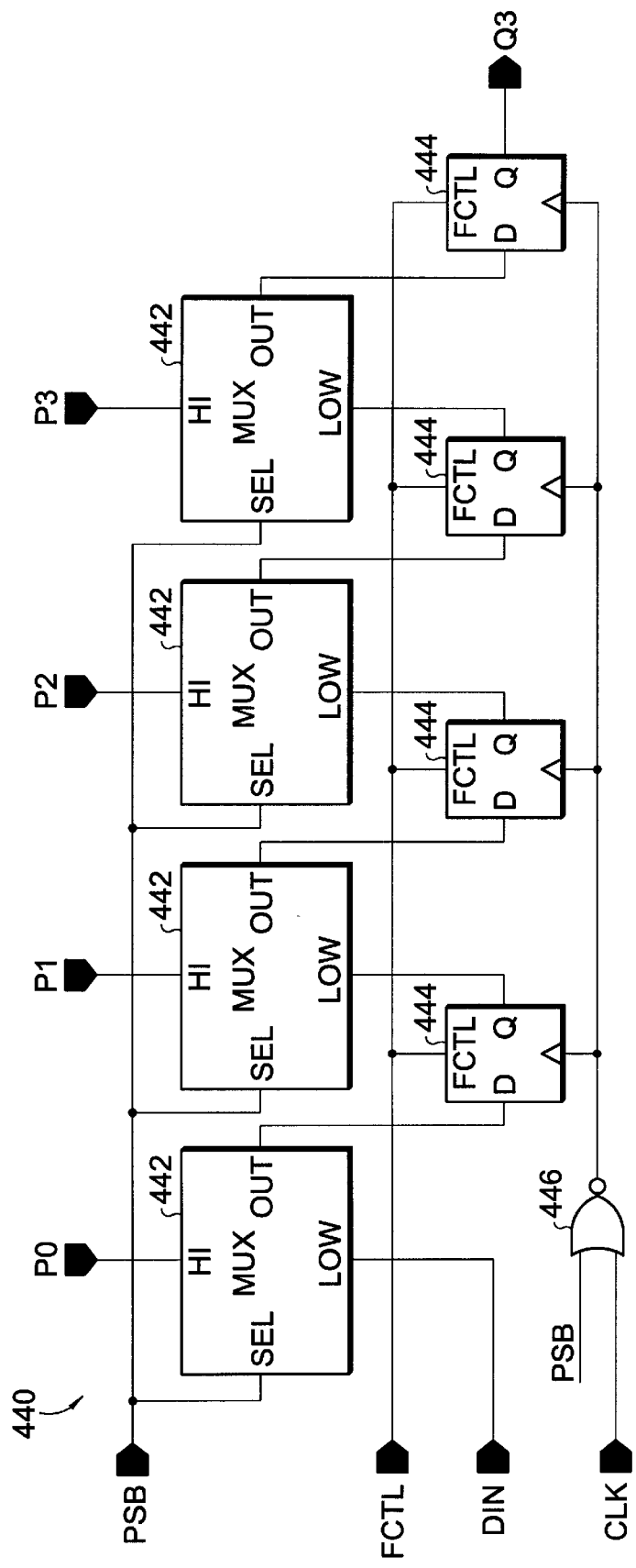
FIG. 44 demonstrates the construction of a 4-bit non-volatile parallel-in-serial-out shift register using non-volatile D-type flip-flops.

FIG. 44 demonstrates the construction of a 4-bit non-volatile parallel-in-serial-out shift register 440. In FIG. 44, the MUX blocks 442 can be implemented as combinatorial logic or transmission gates. The output of the MUX blocks 442 are coupled to the D inputs of flip-flops 444, and the Q output of flip-flops 444 are coupled to the LOW inputs of the MUX blocks 442, in sequential fashion. The H1 inputs of MUX blocks 442 form the parallel input and the Q output of the last flip-flop 444 forms the series output labeled Q3. The select inputs of MUX blocks 442 are coupled to a preset PSB bus, which is also used to gate the CLK clock signal. The ferroelectric control FCTL bus of each of the flip-flops 444 are coupled together and to a common bus. An initial data signal is provided to the LOW input of the first multiplexer 442.

In both examples above, the original volatile logic element is made non-volatile by direct substitution of the non-volatile D flip-flop and its associated control signals. This direct substitution allows a non-volatile flip-flop to be incorporated any place where a volatile flip-flop is used. Additional examples of where non-volatile flip-flops could be substituted for volatile flip-flops include the multiple registers within a microcontroller (program counter, accumulators, instruction register), event counters and state machine registers.

The availability of non-volatile logic elements also creates new design possibilities. Low current wait or stop modes in microcontrollers fitted with non-volatile logic could be replaced with true power-off modes. Event counters with non-volatile flip-flops could be powered by the event itself with the last value of the counter restored on power-up and then incremented before powering down. Non-volatile logic could create entirely new design possibilities that have not yet been imagined.

The ferroelectric memory discussed throughout the above description contains three fundamental elements: ferroelectric storage capacitors, load capacitors and access devices. In the preferred embodiment, the discrete load capacitors are implemented as ferroelectric capacitors to minimize the resulting capacitor area. Several configurations of the fundamental elements are possible, and the preferred configuration is presented here.

Figure 45:
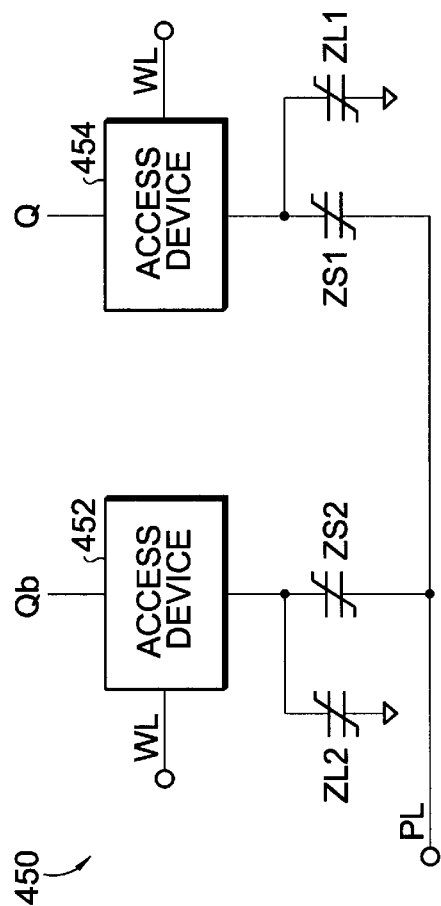
FIG. 45 shows that in a preferred embodiment of the present invention, the ferroelectric load capacitance is normally isolated from the logic device outputs Q and QB to minimize the impact on flip-flop timing.
Figure 46:
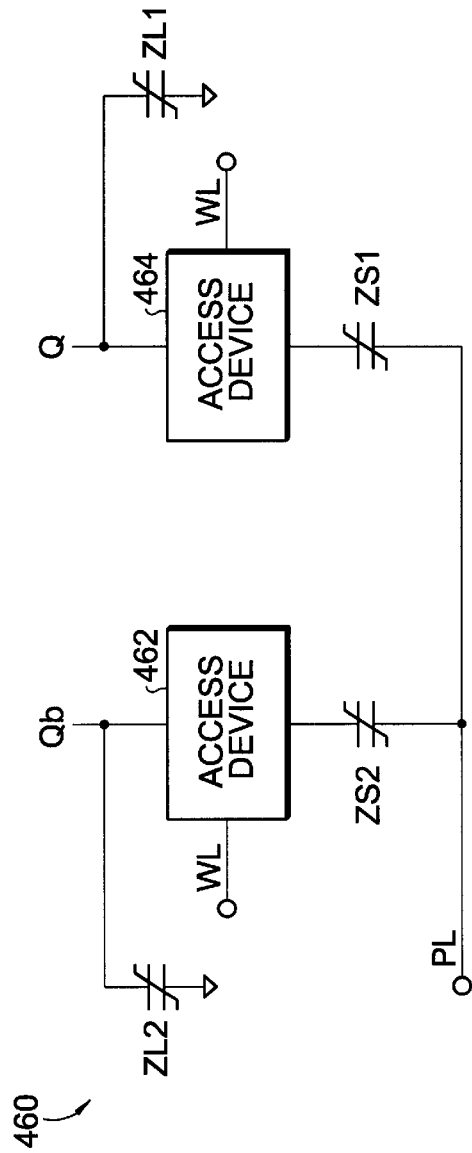
FIG. 46 shows an alternate configuration in which the ferroelectric load capacitance is tied to the Q and QB logic device outputs.

In the preferred configuration, the load capacitance is normally isolated from the logic device so as to minimize the impact on flip-flop timing. The preferred configuration 450 with the isolated load capacitance is shown in FIG. 45, while the alternate configuration 460 with the load capacitance tied to Q and QB is shown in FIG. 46. In arrayed ferroelectric memories, the configuration 460 of FIG. 46 is created by the parasitic bit line load capacitance. In FIG. 46, when Q and QB are forced to a new state, the load capacitors ZL1 and ZL2 help the sense amplifier switch the state of the ferroelectric storage capacitors ZS1 and ZS2. Even if the storage capacitors hold DRAM charge of the opposite polarity, the charge sharing from the load capacitance alone is enough to switch the storage devices.

In FIG. 45, however, the load capacitors ZL1 and ZL2 serve to help hold the DRAM charge if the voltage is left on the ferroelectric capacitors after a restore or write. If DRAM charge is left on the capacitors in FIG. 45, the sense amplifier alone must be strong enough to overturn the previous state. Therefore, care must be taken in device sizing and/or in the speed of access device activation. This design consideration does not apply if additional circuitry is added to equalize the capacitor voltages prior to a write, or if DRAM charge is removed from the capacitors after a restore or write operation.

Additional load strategies are possible, such as using separate access devices for the storage capacitors and the load capacitors. The load devices could also be separated into discrete sizes such that the load capacitance can be easily modified by changes to a metal layer. Such more elaborate configurations undesirably add to design complexity and size, so they are not described in detail here.

Given the preferred embodiment depicted in FIG. 45, the preferred layout of the ferroelectric storage and ferroelectric load capacitors is discussed. Electronic designs are typically optimized for either smallest size, fastest speed, lowest power or shortest design cycle time. The speed of the logic element has already been addressed as described above. The size of the ferroelectric portion of the design in FIG. 45 can be significantly reduced by flipping the typical ferroelectric capacitor stack upside-down and sharing the bottom electrode connection between the storage and load capacitors.

Figure 47:
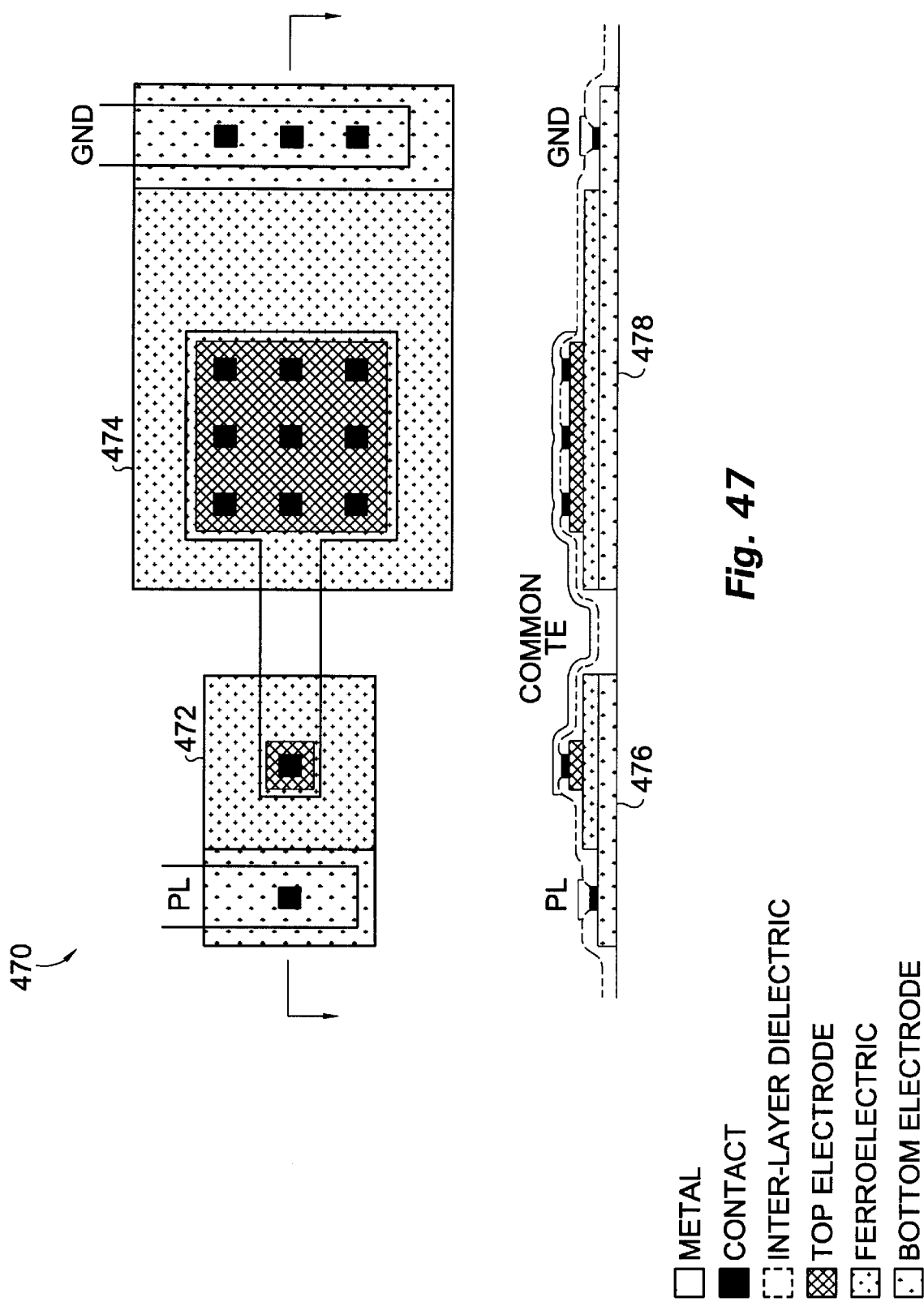
FIG. 47 depicts a conventional layout and cross section for a section of a ferroelectric capacitor load.
Figure 48:
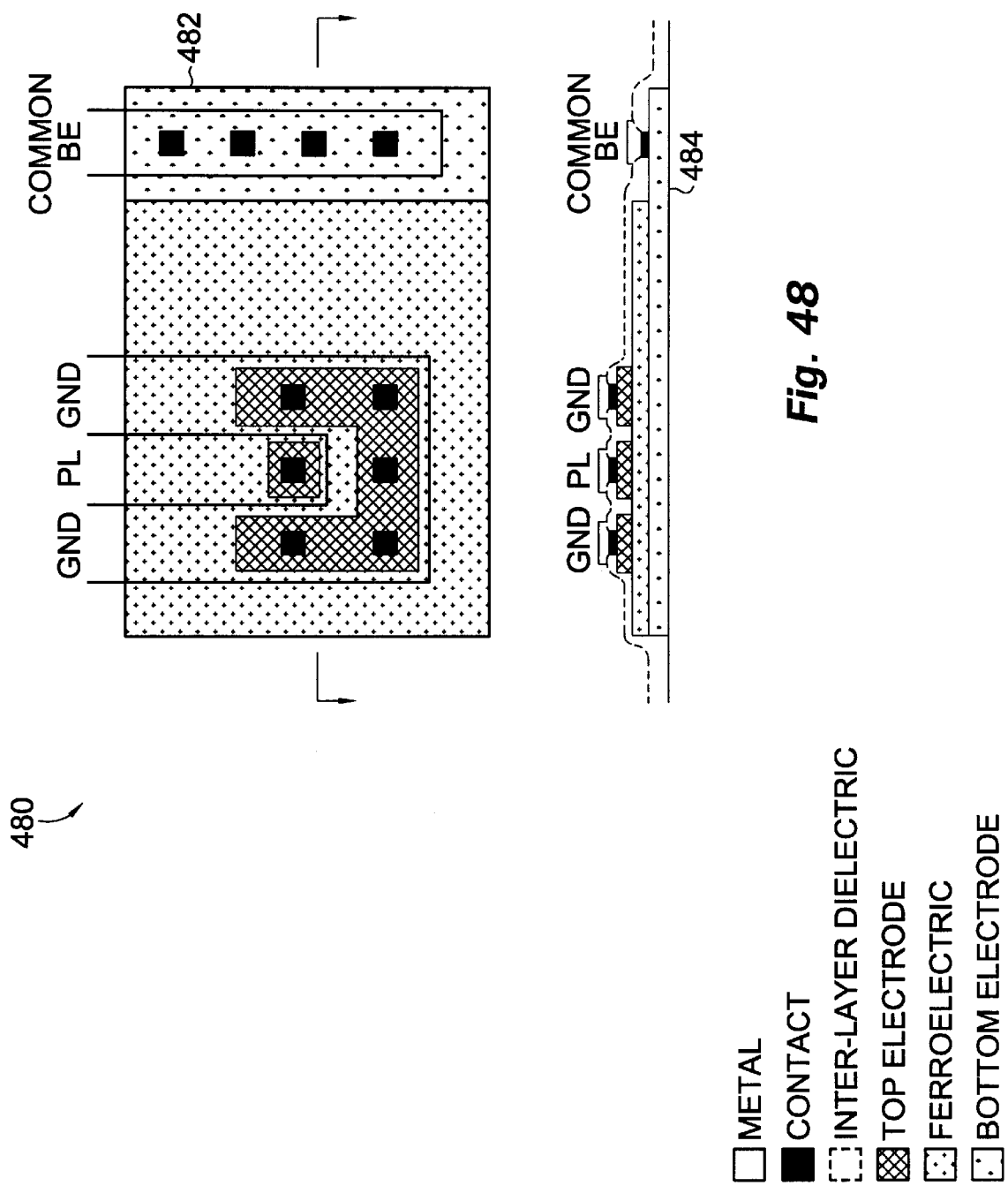
FIG. 48 shows the layout and cross-section for a section of a ferroelectric capacitor load according to the present invention.

FIG. 47 depicts a conventional layout 470 and cross section for one side of the ferroelectric memory, while FIG. 48 shows the proposed layout 480 and cross-section. In the typical ferroelectric memory, the bottom electrode is pulsed (PL) and the top electrode is sensed. In the proposed layout, however, the top electrode of the storage capacitor is pulsed, and the common bottom electrode is sensed. Both FIG. 47 and FIG. 48 are functional implementations of the circuit configuration of FIG. 45, with FIG. 48 being the preferred embodiment.

FIG. 47 depicts a conventional layout 470 having a first capacitor 472 and a second load capacitor 474. The corresponding cross section shows a cross section 476 of the first capacitor and a cross section 478 of the second load capacitor. FIG. 48 depicts the merged layout 480 showing a merged layout of the first and second capacitors. The corresponding cross section shows the merged cross section 484 including the merged first and second ferroelectric capacitors. The key point regarding FIG. 48 is that topology extremes are minimized near the memory capacitor, and that the load capacitor is used as a "dummy" capacitor, i.e. to protect the memory capacitor from etching edge effects.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

I claim:

1. A ferroelectric, non-volatile, D-type flip-flop comprising:
   a D input;
   a Q output;
   a clocked transmission-gate based master stage having an input coupled to the D input, and an output; and
   a ferroelectric, non-volatile, transmission-gate based slave stage having an input coupled to the output of the master stage, at least one ferroelectric load capacitor, at least one ferroelectric storage capacitor, and an output coupled to the Q output.

2. The D-type flip-flop of claim 1 in which the slave stage comprises:
   a first clocked transmission gate having an input forming the input of the slave stage and an output;
   a first controlled inverter having an input coupled to the output of the first clocked transmission gate, and an output;
   a first non-clocked transmission gate having an input coupled to the output of the first controlled inverter and an output coupled to the output of the slave stage;
   a second clocked transmission gate having an input, and an output coupled to the output of the first clock transmission gate;
   a second controlled inverter having an input coupled to the output of the slave stage, and an output coupled to the input of the second clocked transmission gate;
   a second non-clocked transmission gate having an input coupled to the output of the slave stage and an output coupled to ground; and
   a ferroelectic capacitor circuit; including the at least one ferroelectic capacitor, coupled between the output on the first clocked transmission gate and the output of the slave stage.

3. The D-type flip-flop of claim 2 in which the ferroelectric capacitor circuit comprises first, second, and third ferroelectric capacitors.

4. The D-type flip-flop of claim 3 in which one of the ferroelectric capacitors comprises two serially-coupled matched ferroelectric capacitors.

5. The D-type flip-flop of claim 2 further comprising means for selectively coupling the ferroelectric capacitor circuit.

6. The D-type flip-flop of claim 1 further comprising a precharge circuit coupled to the slave stage.

7. The D-type flip-flop of claim 1 further comprising an equalization circuit coupled to the slave stage.

8. The D-type flip-flop of claim 1 further comprising asychronous set and clear inputs respectively coupled to the master and slave stages.

9. A ferroelectric, non-volatile, D-type flip-flop comprising:
   a D input;
   a Q output;
   a ferroelectric, non-volatile, transmission-gate based master stage having an input coupled to the D input, at least one ferroelectric load capacitor, at least one ferroelectric storage capacitor, and an output; and
   a clocked transmission-gate based slave stage having an input coupled to the output of the master stage, and an output coupled to the Q output.

10. The D-type flip-flop of claim 9 in which the master stage comprises:

a first clocked transmission gate having an input forming the input of the master stage and an output;

a first controlled inverter having an input coupled to the output of the first clocked transmission gate, and an output;

a first non-clocked transmission gate having an input coupled to the output of the first controlled inverter and an output coupled to the output of the master stage;

a second clocked transmission gate having an input, and an output coupled to the output of the first clocked transmission gate;

a second controlled inverter having an input coupled to the output of the master stage, and an output coupled to the input of the second clocked transmission gate; and a ferroelectric capacitor circuit; including the at least one ferroelectric capacitor, coupled between the output of the first clocked transmission gate and the output of the master stage.

11. The D-type flip-flop of claim 10 in which the ferroelectric capacitor circuit comprises first, second, and third ferroelectric capacitors.

12. The D-type flip-flop of claim 11 in which one of the ferroelectric capacitors comprises two serially-coupled matched ferroelectric capacitors.

13. The D-type flip-flop of claim 11 further comprising means coupling the ferroelectric capacitor circuit.

14. The D-type flip-flop of claim 9 further comprising a precharge circuit coupled to the master stage.

15. The flip-flop of claim 9 further comprising an equalization circuit coupled to the master stage.

16. The D-type flip-flop of claim 9 further comprising asynchronous set and clear inputs respectively coupled to the master and slave stages.

* * * * *